US009990002B2

(12) United States Patent
Kim

(10) Patent No.: US 9,990,002 B2
(45) Date of Patent: *Jun. 5, 2018

(54) SOUND OUTPUT APPARATUS AND HUB FOR COMMUNICATION NETWORK

(71) Applicant: LG ELECTRONICS INC., Seoul (KR)

(72) Inventor: Sangin Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/605,265

(22) Filed: May 25, 2017

(65) Prior Publication Data

US 2017/0344064 A1 Nov. 30, 2017

Related U.S. Application Data

(60) Provisional application No. 62/341,566, filed on May 25, 2016.

(30) Foreign Application Priority Data

Aug. 22, 2016 (KR) .......................... 10-2016-0106337

(51) Int. Cl.
*G06F 1/16* (2006.01)
*H04L 12/28* (2006.01)
(Continued)

(52) U.S. Cl.
CPC .......... *G06F 1/1637* (2013.01); *G06F 1/1656* (2013.01); *G06F 1/1688* (2013.01);
(Continued)

(58) Field of Classification Search
CPC .. H05K 5/0017; H05K 5/0004; H05K 5/0217; H05K 5/0239; H05K 5/03;
(Continued)

(56) References Cited

U.S. PATENT DOCUMENTS 4,974,698 A 12/1990 Smith
5,504,502 A 4/1996 Arita et al.
(Continued)

OTHER PUBLICATIONS

U.S. Office Action dated Dec. 29, 2017 issued in co-pending U.S. Appl. No. 15/604,902.
(Continued)

*Primary Examiner* — Nidhi Thaker
(74) *Attorney, Agent, or Firm* — KED & Associates, LLP

(57) ABSTRACT

A hub has a display Printed Circuit Board (PCB) having a contact switch; a display panel positioned above the display PCB and controlled by the display PSB to output content. A window support is positioned over the display panel and has an opening exposing at least a section of display panel. A window formed of a transparent material is positioned over the window support. The window support includes a window support plate defining the opening, the window being positioned on an upper surface of the window support plate; at least one manipulation protrusion extending downward from the window support plate at a position corresponding to the contact switch, the manipulation protrusion operating the contact switch in response to pressure applied to the support plate through the window; and support bosses extending downward from the window support plate and coupled to the partition.

20 Claims, 41 Drawing Sheets

(51) Int. Cl.
- *G06F 1/18* (2006.01)
- *H05K 5/00* (2006.01)
- *H05K 5/02* (2006.01)
- *G07F 17/32* (2006.01)
- *H04R 5/02* (2006.01)
- *H04R 1/02* (2006.01)
- *G06F 3/16* (2006.01)

(52) U.S. Cl.
CPC .............. *G06F 1/181* (2013.01); *G07F 17/32* (2013.01); *G07F 17/3202* (2013.01); *G07F 17/3223* (2013.01); *H04L 12/282* (2013.01); *H04R 5/02* (2013.01); *H05K 5/0004* (2013.01); *H05K 5/0017* (2013.01); *H05K 5/0217* (2013.01); *G06F 1/1632* (2013.01); *G06F 3/165* (2013.01); *H04L 2012/2841* (2013.01); *H04R 1/025* (2013.01); *H04R 2420/07* (2013.01)

(58) Field of Classification Search
CPC .... H04R 5/02; H04R 2205/021; H04R 1/025; H04R 2201/02; G07F 17/32; G07F 17/3202; G07F 17/3223; G07F 17/3225; A63F 11/00; G06F 1/163; G06F 1/1637; G06F 1/1688; G06F 1/181; H04L 12/282
See application file for complete search history.

(56) References Cited

U.S. PATENT DOCUMENTS

| | | |
|---|---|---|
| 6,790,400 B1 | 9/2004 | Muller et al. |
| 7,429,707 B2 | 9/2008 | Yanai et al. |
| D632,265 S | 2/2011 | Choi et al. |
| 8,003,886 B1 | 8/2011 | Rintz |
| D687,009 S | 7/2013 | Song et al. |
| D700,904 S | 3/2014 | Miller et al. |
| 9,036,858 B1* | 5/2015 | Reeves ............... H04R 1/023 381/386 |
| 9,131,301 B2 | 9/2015 | Tsai et al. |
| D743,819 S | 11/2015 | Golnik et al. |
| D746,166 S | 12/2015 | Li |
| D747,984 S | 1/2016 | Zhao et al. |
| 9,304,736 B1* | 4/2016 | Whiteley ......... G06Q 20/40145 |
| 9,453,655 B2 | 9/2016 | Bruck et al. |
| D784,963 S | 4/2017 | Saule et al. |
| 9,633,197 B2 | 4/2017 | Lakshmanan et al. |
| 9,641,919 B1 | 5/2017 | Poole et al. |
| 9,659,577 B1 | 5/2017 | Langhammer |
| 9,791,839 B2 | 10/2017 | Matsuoka et al. |
| 9,820,024 B1* | 11/2017 | Rolf ....................... H04R 1/028 |
| 9,830,005 B2 | 11/2017 | Sakaguchi et al. |
| 9,843,851 B2 | 12/2017 | Chamberlin et al. |
| 9,851,728 B2 | 12/2017 | Matsuoka et al. |
| 9,857,961 B2 | 1/2018 | Fadell et al. |
| 2006/0250762 A1 | 11/2006 | Yang et al. |
| 2011/0148812 A1 | 6/2011 | Hente |
| 2011/0303520 A1 | 12/2011 | Burnel et al. |
| 2012/0035020 A1 | 2/2012 | Kamm |
| 2012/0051015 A1 | 3/2012 | Dabov et al. |
| 2013/0001971 A1 | 1/2013 | Stein |
| 2013/0338839 A1 | 12/2013 | Rogers et al. |
| 2014/0049886 A1 | 2/2014 | Lee et al. |
| 2014/0086431 A1* | 3/2014 | Martin .................... H04R 5/02 381/80 |
| 2014/0110237 A1 | 4/2014 | Enomoto et al. |
| 2014/0139047 A1 | 5/2014 | Haines et al. |
| 2014/0219491 A1 | 8/2014 | Ludlum et al. |
| 2014/0315620 A1* | 10/2014 | Wells .................... G07F 9/026 463/20 |
| 2015/0010194 A1 | 1/2015 | Rodgers |
| 2015/0104042 A1 | 4/2015 | Ito |
| 2015/0136572 A1 | 5/2015 | Liu et al. |
| 2015/0201255 A1 | 7/2015 | Porter |
| 2015/0264461 A1 | 9/2015 | Hovanky et al. |
| 2015/0334480 A1 | 11/2015 | Yang et al. |
| 2015/0334859 A1 | 11/2015 | Lee et al. |
| 2016/0071440 A1 | 3/2016 | Hibbert |
| 2016/0173977 A1 | 6/2016 | Lim et al. |
| 2016/0259376 A1 | 9/2016 | Christfort |
| 2016/0345086 A1 | 11/2016 | Chamberlin et al. |
| 2017/0006374 A1* | 1/2017 | Song .................... H04R 1/323 |
| 2017/0180850 A1 | 6/2017 | Hsu et al. |
| 2017/0242412 A1 | 8/2017 | Kim |
| 2017/0259983 A1 | 9/2017 | Tolman et al. |
| 2017/0288447 A1 | 10/2017 | Guibene et al. |
| 2017/0330429 A1* | 11/2017 | Tak ....................... G08B 5/36 |
| 2017/0345420 A1 | 11/2017 | Barnett, Jr. |
| 2018/0052218 A1 | 2/2018 | Meadow |

OTHER PUBLICATIONS

U.S. Office Action dated Jan. 29, 2018 issued in co-pending U.S. Appl. No. 15/604,836.
U.S. Office Action dated Jan. 30, 2018 issued in co-pending U.S. Appl. No. 15/604,975.
U.S. Notice of Allowance dated Feb. 2, 2018 issued in co-pending U.S. Appl. No. 15/605,136.
U.S. Office Action dated Feb. 23, 2018 issued in co-pending U.S. Appl. No. 15/605,041.
U.S. Office Action dated Mar. 8, 2018 issued in co-pending U.S. Appl. No. 15/605,019.
U.S. Office Action dated Mar. 12, 2018 issued in co-pending U.S. Appl. No. 15/605,075.
U.S. Office Action dated Mar. 12, 2018 issued in co-pending U.S. Appl. No. 15/605,519.

* cited by examiner

FIG. 8
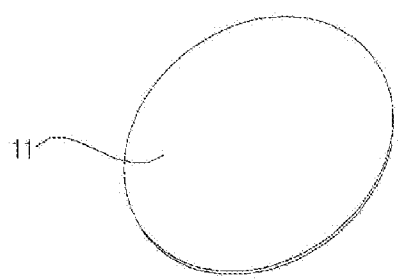
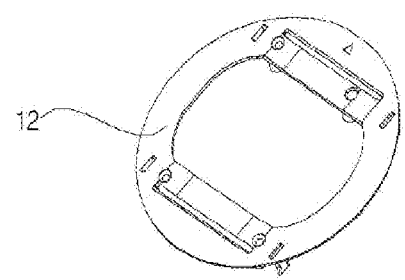
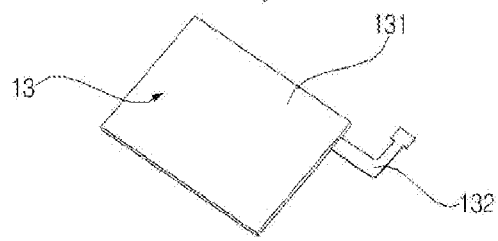
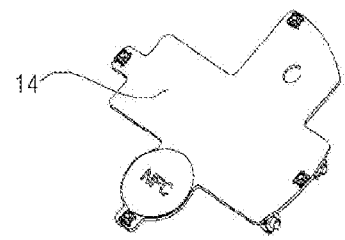
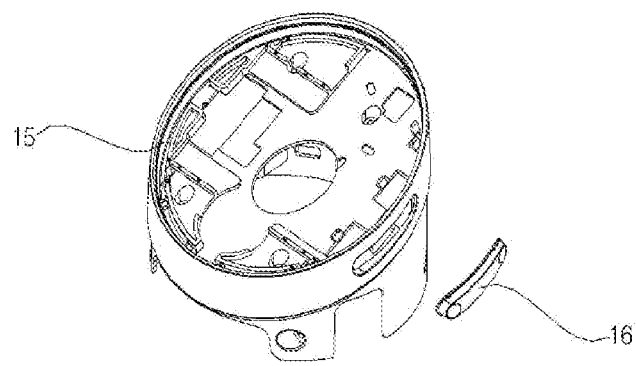

B3

A3

(a)

(b)

SOUND OUTPUT APPARATUS AND HUB FOR COMMUNICATION NETWORK

CROSS-REFERENCE TO RELATED APPLICATIONS

This application claims the priority benefit of U.S. Provisional Application No. 62/341,566, filed on May 25, 2016, PCT/KR2016/007335, filed on Jul. 6, 2016, and Korean Application No. 10-2016-0106337, filed on Aug. 22, 2016, the disclosures of which are incorporated herein by reference.

BACKGROUND

1. Field

The present disclosure relates to a sound output apparatus and a hub for a communication network.

2. Background

Various wired/wireless communications technologies may be used to form a connection or a network to exchange data within a given space, such as an office or a home. Devices having a communication function may be connected via the resulting data connection or network. For example, electronic appliances, such as a washing machine, a refrigerator, or an air conditioner, may be connected via wired/wireless connections to an access point (AP) coupled to Internet, and the appliances may access the Internet through the AP to exchange data with remote devices. Also, a terminal device, such as a smart phone, tablet computer, or personal computer, may share information with the appliances through the AP or via the data connections.

Coupling an appliance to a terminal may provide limited functionality because only certain types of information may be available from the appliances. For example, when connected to a refrigerator, the terminal can typically only access limited information collected by sensors installed in or coupled to the refrigerator (i.e., an internal temperature sensor). Consequently, the terminal may have limited ability to collect information regarding external conditions (e.g., ambient external temperature and humidity levels, a status of nearby devices, usage of other devices by a user, the location of the user, etc.) and optimize the control of the appliance in view of these eternal conditions. Technology related to the Internet of Things (IoT) may be used to interconnect various devices and sensors (i.e., "things") via wired/wireless connections to allow the things to share information. The IoT technology adds, for example, communication and sensor functionality to various devices so that the devices may exchange information and/or be controlled based on the shared information.

An apparatus (i.e., a hub) may integrate and manage appliances or other device within the diversified network environments and to communicate with users based on the information from the appliances. The hub may perform functions related to outputting sound. In these functions, the hub may store various types of sound data, such as music, recordings, notifications, and sound effects, in a digitalized form and play back and output the stored date according to appointed programs. In one example, a hub may include manipulation (i.e., control) buttons or other input mechanisms, and the hub may output an audio response when a user input is received through the manipulation buttons.

This type of hub may typically output limited types of information. For example, in context of constructing a network through IoT or other networking technologies, the hub can output only limited audio data or other data related to the network, such as to output a beep when a device attaches to the hub. In one example, a smart phone or other terminal may be linked to and control the hub to improve mobility, expandability, and versatility of the hub. However, control of the hub through the terminal may be more cumbersome for a user in comparison to directly contacting the manipulation buttons.

BRIEF DESCRIPTION OF THE DRAWINGS

The embodiments will be described in detail with reference to the following drawings in which like reference numerals refer to like elements wherein:

FIG. 8 is an exploded perspective view of a cover;

DETAILED DESCRIPTION

Figure 1:
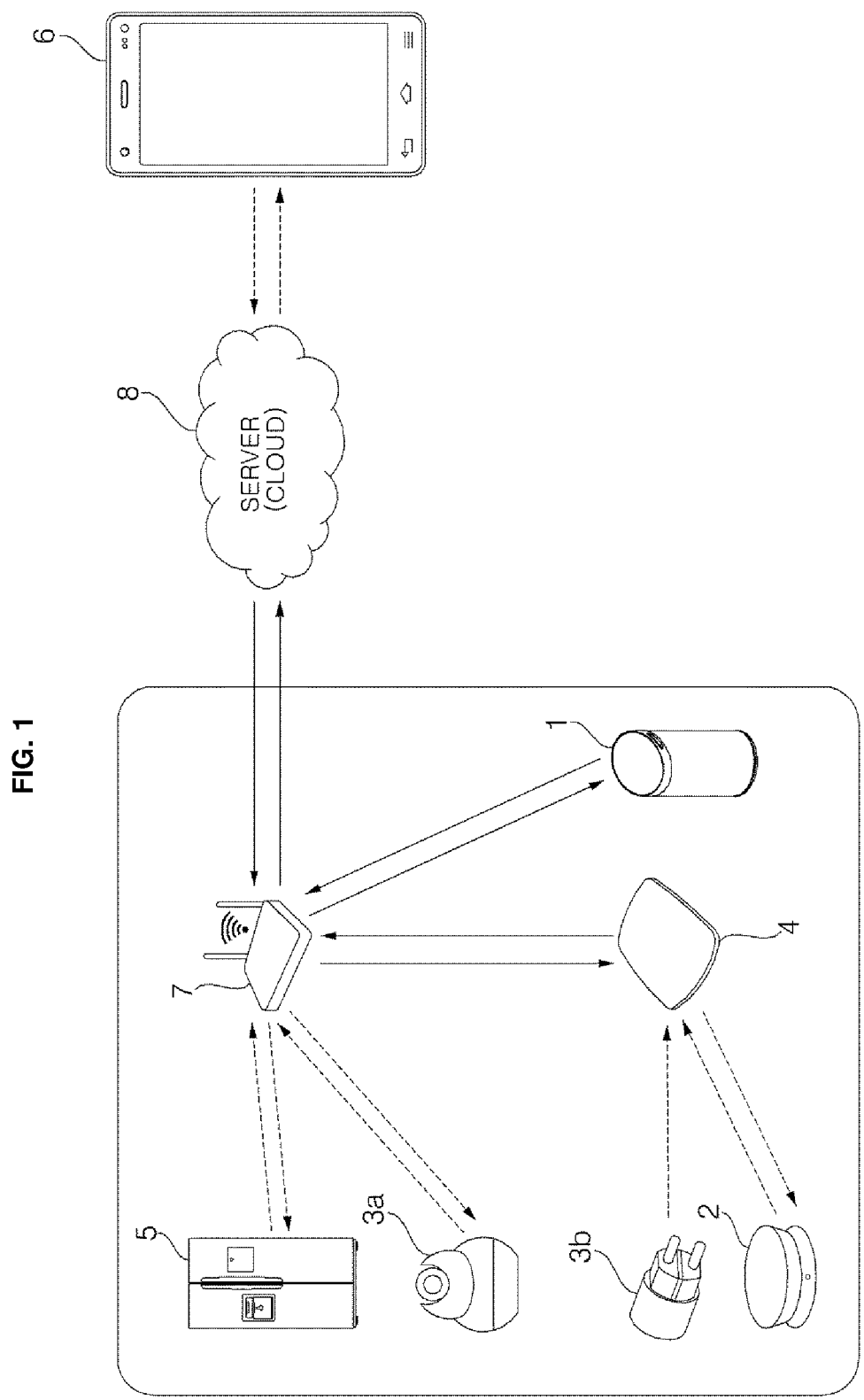
FIG. 1 illustrates a home network system according to one exemplary embodiment of the present disclosure.

FIG. 1 illustrates a network system according to one exemplary embodiment of the present disclosure. The network system may be a collection of devices used to construct a network via exchanged communications within a given space, such as a home, an office, or the like. As one exemplary embodiment of such a network system, FIG. 1 illustrates a home network system constructed in a home.

Referring to FIG. 1, the network system according to one exemplary embodiment of the present disclosure may include a hub 1, accessories 2, 3a and 3b, a gateway 4, an appliance 5, and an access point (AP) 7. Hereinafter, an example of a hub 1 having a sound output function is described, but in other example, hub 1 may have additional, fewer, or different functions. The hub 1 may also be referred to, herein, as a sound output apparatus or a sound output device. The hub 1 may also include a microphone (not illustrated) to detect sound conditions, such as voice input from a user. The hub 1 may include a voice recognition program and may use the voice recognition program to extract a command from the detected voice input. The hub 1, accessories 2, 3a and 3b, the gateway 4, the appliance 5, and/or the AP 7 may communicate to exchange messages and data based on wired networking technologies, such as Ethernet, or based on wireless networking technologies, such as Wi-Fi®, Bluetooth®, ZigBee®, or Z-wave®. It should be appreciated, however, that various other different networking and communication technologies are known and may be incorporated within the present disclosure.

Ethernet is a networking technology based on the 802.3 standards of the Institute of Electrical and Electronics Engineers (IEEE). Ethernet is commonly used in wired connections for local area network (LAN) within a space, such as a home, and is also used for wired connections on a larger scale for metropolitan area networks (MAN) and wide area networks (WAN). Ethernet commonly uses carrier sense multiple access with collision detection (CSMA/CD) for data transmission. Hereinafter, an "Ethernet module" or "Ethernet circuitry" is defined as a component that performs communications based on Ethernet technology.

Wi-Fi® is wireless communication technology based on the IEEE 802.11 standards. Wi-Fi® may be used to establish and configure wireless networks, such as a personal area network (PAN), a wireless LAN (WLAN), or a wireless WAN (WWAN). Wi-Fi® may be used to for wireless peer-to-peer (P2P) connections between devices. Hereinafter, a "Wi-Fi module" or "Wi-Fi circuitry" is defined as a component that performs wireless communication based on Wi-Fi technology.

Bluetooth® is a wireless connection technology for establishing wireless PANs and for wirelessly exchanging data over short distances (e.g., within a range of 10-15 meters) using ultra high frequency (UHF) radio waves, typically in a band from 2.4 to 2.485 GHz. Hereinafter, a "Bluetooth® module" or "Bluetooth® circuitry" is defined as a component that performs wireless communications based on Bluetooth® technology.

ZigBee® is a wireless network technology for forming PANs and for wirelessly exchanging data over short distances based on IEEE 802.15. ZigBee® uses relatively low-powered digital radio transmissions. In one example, a type of ZigBee® known as Radio Frequency for Consumer Electronics (RF4CE) may be used for the remote control of electronic devices. Hereinafter, a "ZigBee® module" or "ZigBee® circuitry" may be defined as a component that performs wireless communications based on a ZigBee technology.

Z-wave® is a wireless transmission protocol that uses source-routed mesh networks, and is commonly used for home automation and sensor networks. Z-wave® uses a physical layer, a MAC layer, a transmission layer, a routing layer, and an application layer defined in the International Telecommunication Union Telecommunication Standardization Sector (ITU-T) G.9959 standard. Z-wave® uses a frequency band around 900 MHz (e.g., 869 MHz in Europe and 908 MHz in the United States) and/or frequency band around 2.4 GHz, and provides speeds of approximately 9.6 kbps, 40 kbps and 200 kbps. Hereinafter, a "Z-wave module" or "Z-wave circuitry" is defined as a component that performs wireless communications based on a Z-wave technology.

Referring back to FIG. 1, accessories 2, 3A, and 3B may include various different sensors, such as a temperature sensor, a humidity sensor, a vibration sensor, a proximity sensor, and/or an infrared (IR) sensor, to collect data regarding the network location. In other examples, the accessories 2, 3a and 3b may include other types of sensors, such as an air quality sensor for detecting the composition of air within the network environment, a smart plug (e.g., a sensor for detecting whether electrical power is being provided to appliance 5 or other device within the network environment), a current transformers (CT) sensor (e.g., a sensor for detecting a current drawn by appliance 5 or other device within the network environment), a smart temperature regulator (i.e., a sensor for detecting ambient temperature conditions and identifying whether a climate control system is active within the network environment), and a water surface sensor to detect whether moisture is present.

The accessories 2, 3A, and 3B may be positioned at various locations within the network environment. In one example, some of the accessories 2, 3A, and 3B may be attached to the electronic appliance 5. For example, one of the accessories 2, 3A, and 3B may include a vibration sensor and may be attached to the appliance 5. For example, the appliance 5 is a clothes washing machine, the vibration sensor may sense vibrations generated during the operation of the washing machine, and the vibration sensor may generate and output a signal identifying a status of the washing machine (e.g., the signal may indicate whether the washing machine is active, and if so, may further indicate whether the washing machine is agitating laundry or spinning the laundry).

In another example, some of the accessories 2, 3A, and 3B may be separated from the electronic appliance 5 and may be positioned at other location within the network environment. For example, an accessory 2, 3A, or 3B including a motion detector (e.g. an IR motion sensor) may be attached to a wall and may be positioned to sense the opening or closing of a home door or a door on the appliance 5.

In certain examples, the accessories 2, 3A, and 3B may transmit information acquired by these sensors to the hub 1 via the network. Furthermore, signals for control of the sensors in the accessories 2, 3A, and 3B may be transmitted from the hub 1. For example, when an accessory 2, 3A, or 3B includes a sensor to detect a presence of a user (e.g., the above-described motion detector to sense when a house door or a door of an appliance 5 is opened), and when the user's presence is not detected during a threshold time period, hub 1 may generate and forward a notification to a preset terminal 6. In another example, the accessories 2, 3A, and 3B may forward the collected sensor data directly to the terminal 6.

In one example, some of the accessories (e.g., accessory 2) may further enable the remote control of the electronic appliance 5. For example, the accessory 2 may include an emitter that outputs an infrared (IR) control signal toward the electronic appliance 5, and the accessory 2 may be positioned so that the electronic appliance 5 is within a transmission range of emitter. The accessory 2 may generate and output the control signal (i.e., the IR control signal) based on an input control signal received via a network (e.g., from hub 1 or from terminal 6 through AP 7). In one example, the accessory 2 (or another of accessories 2, 3A, or 3B) may also include an IR sensor or receiver to detect when the IR control signal collides with and is reflected by an intervening object, such that the electronic appliance 5 does not receive the IR control signal.

The AP 7 may be a relay device for enabling wireless equipment to be connected to a network, and connects a home network to the Internet. The hub 1, the accessory 3b, gateway 4, and the electronic appliance 5 may be connected to the AP 7 using a wired connection (e.g., Ethernet) or a wireless method (e.g., Wi-Fi®, ZigBee®, or Z-wave®).

The gateway 4 may be function to connect devices using having different protocols and to enable communications therebetween, such as to connect devices that are not compatible with Wi-Fi® to the AP 7. Messages (or information) from the accessories 2 and 3b may be transmitted to the gateway 4, and the gateway 4 may then forward the message to the hub 1 via the AP 7. For example, the gateway 4 may convert a ZigBee (or Z-wave) signal, received from the accessories 2 and 3b, into a Wi-Fi signal and forward the resulting Wi-Fi signal to the AP 7 to be forwarded to the terminal 6 or the server 8. Similarly, messages carrying data or instructions from the hub 1 may be forwarded to the gateway 4 via the AP 7, and the accessories 2 and 3b may receive these hub messages from the gateway 4. In certain exemplary embodiments, the accessories 2, 3a and 3b and the hub 1 may communicate with the network (e.g., via AP 7) even when the network is disconnected from the Internet (e.g., when AP 7 is disconnected from server 8 and/or terminal 6).

The devices in the network may connect to the Internet via the AP 7, such as to connect to a remote computing device or server 8. Although a single server 8 is described herein, server 8 may include a group of computing device or a cloud. The server 8 may be associated, for example, with manufacturers, vendors, and/or service provides associated with the hub 1, the accessories 2, 3a and 3b, gateway 4, and/or the home appliance 5. The server 8 may store software and data and may, in response to receiving a request one of the devices in the network (e.g., from the hub 1), forward the software and/or data to the requesting device via the Internet. In one example, the server 8 may collect data from one or more devices in the network (e.g., accessories 2, 3a, and 3b) and may forward the collected data to another device in the network (e.g., to hub 1).

As shown in FIG. 1, the server 8 may also exchange data with a terminal 6, such as a smart phone, a tablet device, a personal computer (PC) or other device that may be coupled to the server. In one example, the server 8 and the terminal 6 may be connected through the Internet. For example, information transmitted from the hub 1 or the accessories 2, 3a and 3b may be stored in the server 8, and may be transmitted from the server 8 to the terminal 6. In addition, the server 8 may receive data from the terminal 6 or acquire data associated with the terminal 6 (e.g., from another server), and the server 8 may then transmit the information to one or more devices in the network (e.g., to the hub 1 or the accessories 2, 3a and 3b). In one example, the server 8 may forward control data from the terminal 6 such that the hub 1 or the accessories 2, 3a and 3b may be controlled via the mobile terminal 6.

Although terminal 6 is shown in FIG. 1 as being remote from the geographic location associated with hub 1, accessories 2, 3a and 3b, gateway 4, appliance 5, and AP 7, it should be appreciated that terminal 6 may be located proximate to one or more of these devices. For example, terminal 6 may be coupled to the AP 7 via a wired or wireless connection.

In one example, the terminal 6 may execute an application to provide a graphical user interface (GUI) to control or to access information from the hub 1 or the accessories 2, 3a and 3b. For example, the GUI in terminal 6 may present data collected by sensors in accessories 2, 3a and 3b. In another example, functions performed by the accessories 2, 3a and 3b may be expanded or changed by using an application installed on the terminal 6. In another example described below, the accessories 2, 3a and 3b may be controlled by the hub 1, or information collected by the accessories 2, 3a and 3b may be collected, processed, and used by the hub 1 alone, without involvement of the terminal 6.

In certain exemplary embodiments described above, messages forwarding data collected by sensors in the accessory 2, 3a and 3b may be forwarded via the network to the mobile terminal 6. An application installed in the mobile terminal 6 may analyze the received messages. For example, the application on the mobile terminal 6 may process sensor information regarding the opening or closing of the door or an operating state of the electronic appliance 5 (e.g. occurrence of the unbalance of the washing machine). In another example, the sensor data may be processed by another device (e.g., server 8), and results from processing the sensor data may be forwarded to terminal 6 to determine an appropriate action. For example, the terminal 6 may output a visual notification via a display or may output an audio notification via a speaker when a certain sensor conditions are detected (e.g., to prompt a user to check on the appliance 5 when an abnormal operation is detected, or to check a resident condition when the opening or closing of the door is not sensed for a long time).

Figure 2:
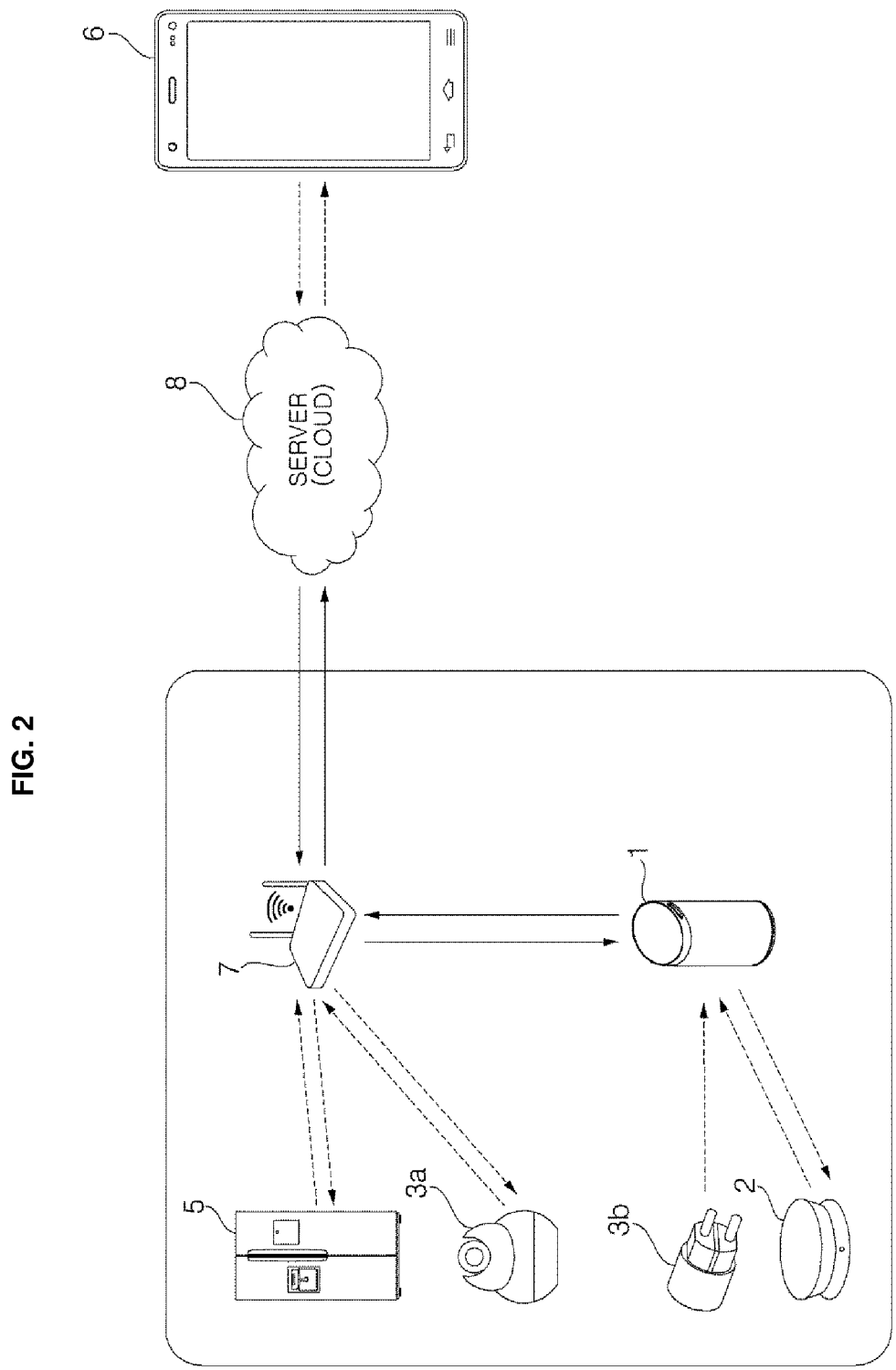
FIG. 2 illustrates a home network system according to another exemplary embodiment of the present disclosure.

FIG. 2 illustrates the home network system according to another exemplary embodiment of the present disclosure. In this embodiment, the home network system excludes the gateway 4, and instead, the hub 1 performs the above-described functions of the gateway 4 (i.e., to connect devices that use different communication technologies). The accessories 2 and 3*b* may directly communicate with the hub 1. For example, the accessories 2 and 3*b* and the hub 1 may include ZigBee modules and may communicate with each other using ZigBee. The hub 1 may then generate Wi-Fi signals based on the received ZigBee signals from the accessories 2 and 3*b* forward the generated Wi-Fi signals to AP 7 or another device. Similarly, the hub 1 may receive Wi-Fi signals forwarding data and/or instructions for the accessories 2 and 3*b* and may generate ZigBee signals forwarding the received data and/or instructions to the accessories 2 and 3*b*.

Referring to FIGS. 3 to 9, the hub 1 according to one exemplary embodiment of the present disclosure may include a cover (or upper portion) 10, a main body (or interior body) 40, a grille 20, and a base (or bottom portion) 30. A bottom surface of the main body 40 may be supported by the base 30, and the cover 10 may be coupled to a top portion of the main body 40. The grille 20 may have a vertically-elongated cylindrical shape, and portions of the main body 40 are positioned within the cylindrical shape such that lateral side portions of the main body 40 (i.e., portions of the main body 40 that extend between the cover 10 and the bade 30) are covered by the grille 20. In one exemplary embodiment, a portion of the main body 40 may extend above the upper end of the grille 20 such that that this portion is of the main body 40 is externally exposed. The grille 20 may include through-holes 20*h* that provide air passages to enable sound generated at the main body 40 to pass through grille 20 with minimal interference or distortion.

A porous filter (not illustrated) may be attached to the inner surface of the grille 20 or otherwise be positioned between the grille 20 and the main body 40 prevent dust or other contaminants from entering the grille 20 through the through-holes 20*h*. The filter may be formed of a material having fine holes, such as a piece of mesh or a nonwoven fabric. The filter may be attached to the inner surface of the grille 20 using an adhesive or a piece of double-sided tape. The filter also functions to block light such that speakers 43 and 44 (see FIG. 4) or other elements of the main body 40 are not externally visible through the through-holes 20*h*.

Figure 3:
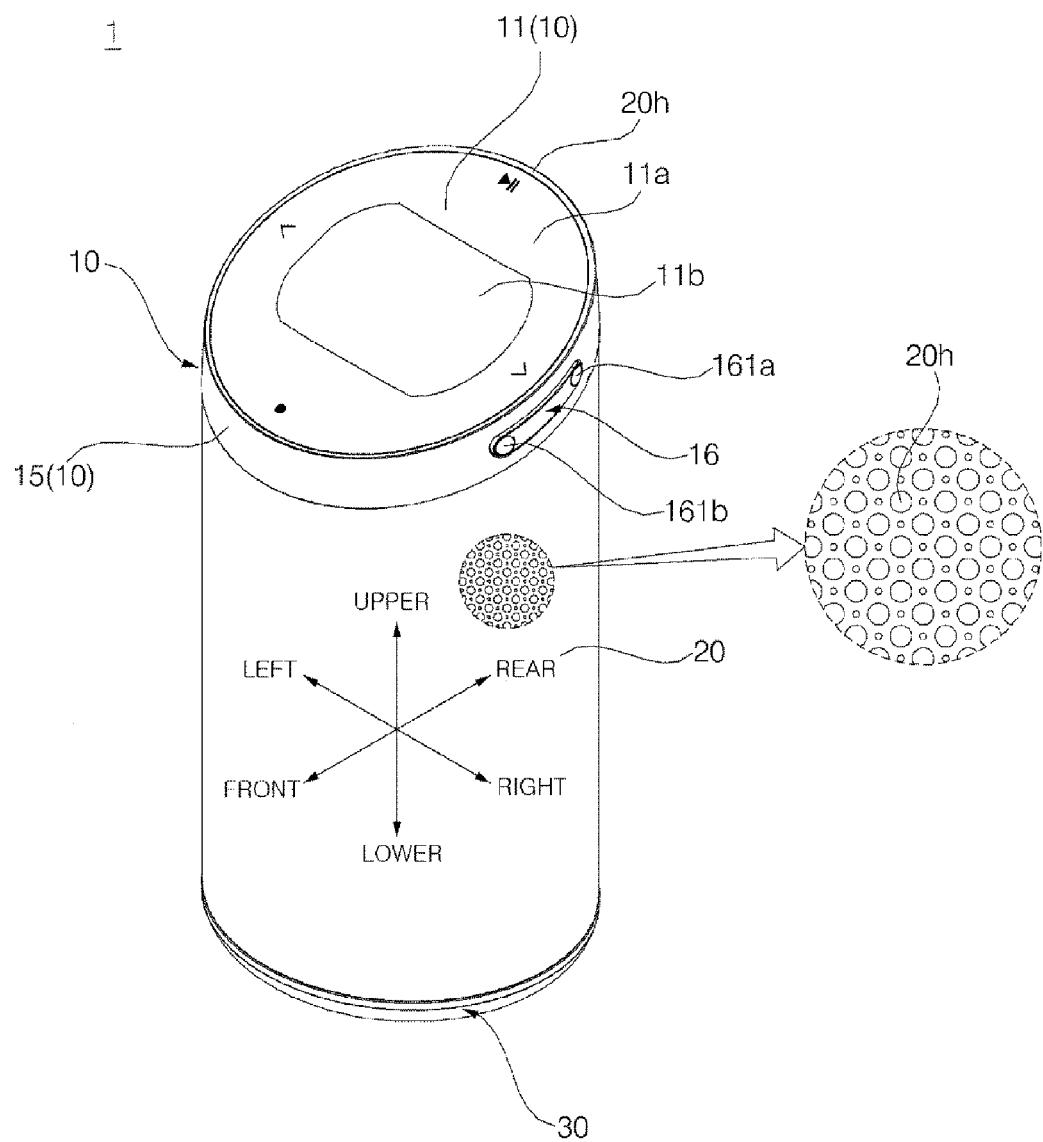
FIG. 3 is a perspective view illustrating a hub according to one exemplary embodiment of the present disclosure.

Although the through-holes 20*h* are shown in only a portion of the grille 20 in FIG. 3, it should be appreciated that the through-holes 20*h* may be formed substantially throughout the grille 20 (see, for example, FIG. 38), such that sound output from the speakers 43 and 44 may uniformly spread in all directions from the hub 1 through the through-holes 20*h*.

As shown in FIG. 8, the cover 10 may include a window 11, a window support 12, a display 13, a display printed circuit board (PCB) 14, and a cover housing 15. The window 11, the window support 12, the display 13, and the display PCB 14 may be positioned within an upper opening of the cover housing 15.

Figure 4:
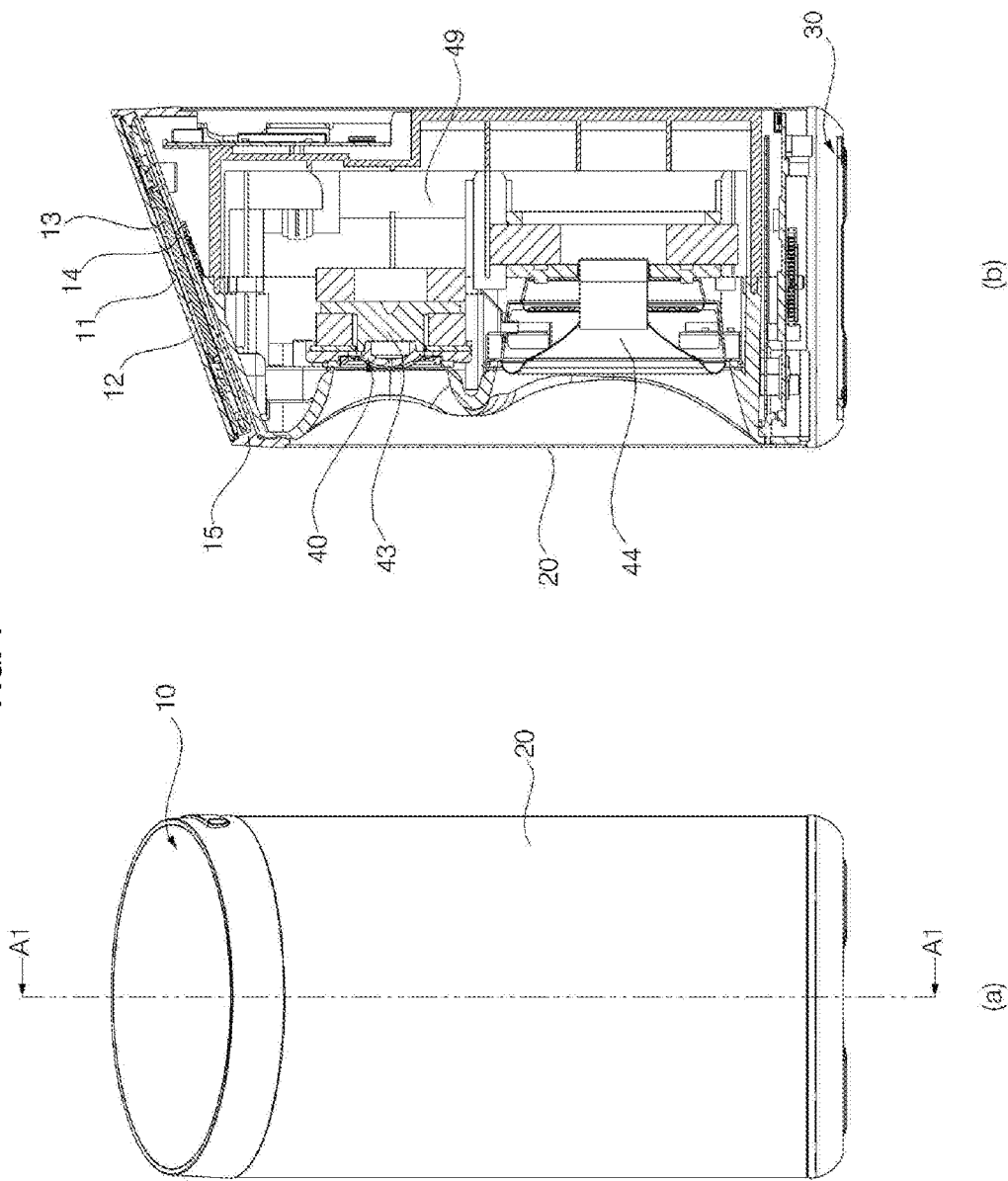
FIG. 4 is a front view and a sectional view of the hub taken along line A1-A1.
Figure 5:
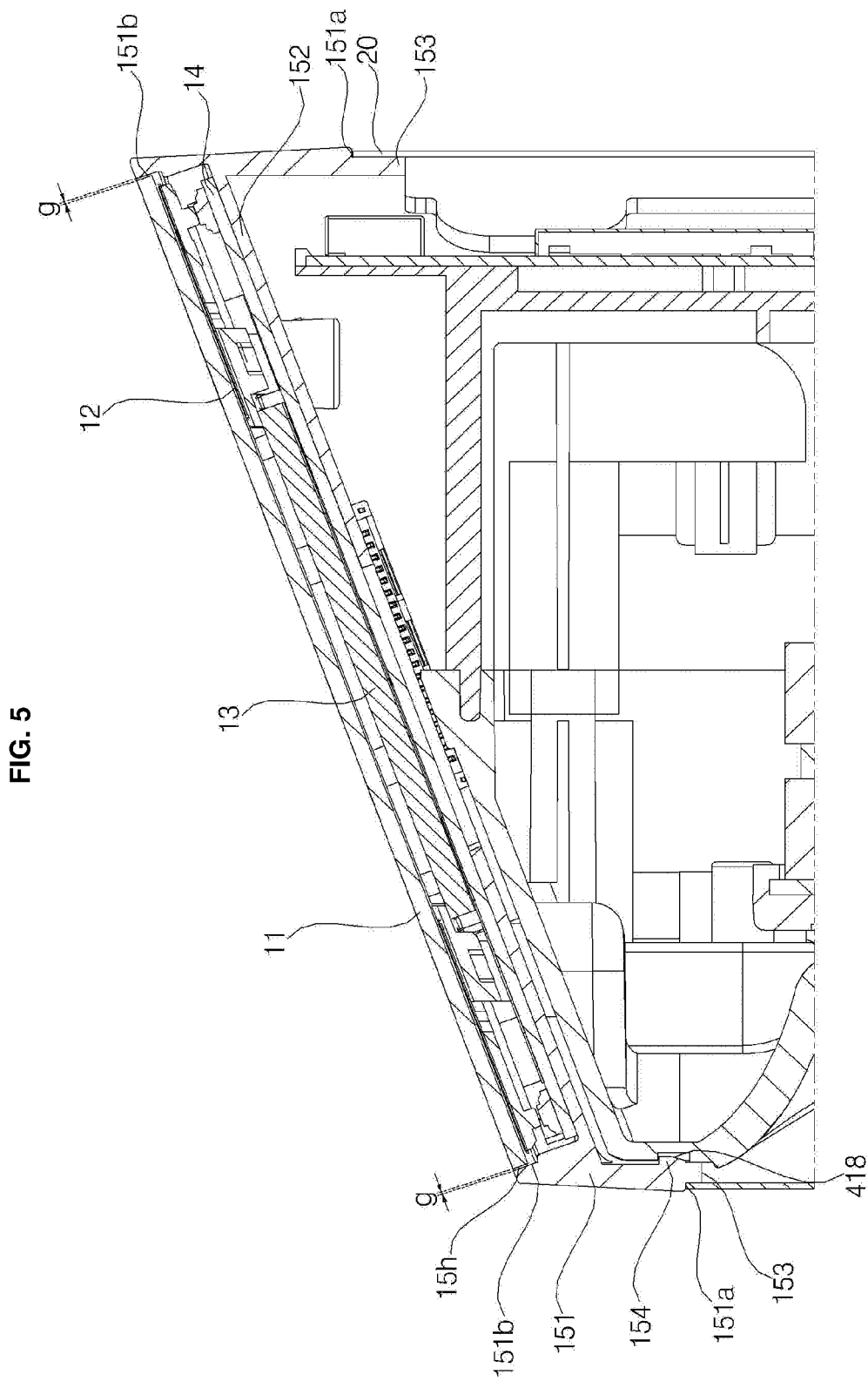
FIG. 5 is an enlarged view of a portion of FIG. 4.

Referring to FIGS. 4 and 5, the cover housing 15 may be coupled to the top of the main body 40. The cover housing 15 may be formed of a synthetic resin, plastic, metal, ceramic, or other material. The cover housing 15 may have a cylindrical shape and may include a sidewall 151 and a partition 152 that extends from the inner surface of the sidewall 151 to divide the inside of the sidewall 151 into upper and lower regions. An upper end of the sidewall 151 defines an opening 15*h* formed in the upper surface of the cover housing 15. The display PCB 14, the display 13, the window support 12, and the window 11 may be disposed on the partition 152 (see FIGS. 19 and 20 with regard to a detailed configuration of the cover housing 15).

A lower end 151*a* of the sidewall 151 may abut an upper end of the grille 20, and a fine gap may be present between the sidewall 151 and the grille 20 to provide manufacturing tolerance. Despite the gap, the outer surface of the sidewall 151 and the outer surface of the grille 20 may combine to define a substantially continuous outer contour in the upper portion of hub 1.

An upper-end holding portion 153 may extends downward from the lower end 151*a* of the sidewall 151 and may contact a rear surface of an upper portion of the grille 20. The upper-end holding portion 153 and the grille 20 may be coupled without using separate fastening members, such as bolts. Instead, the upper-end holding portion 153 is inserted (or fitted) into an interior space of an opening in the upper end of the grille 20. This coupling may be realized via interference-fit using the elasticity and the restoring force of the grille 20 or the upper-end holding portion 153. For example, a circumference of an interior surface of the grille 20 may be slightly smaller than a circumference an external portion of the upper-end holding portion 153 such that the grille 20, when positioned over the upper-end holding portion 153, applies a compression force against the upper-end holding portion 153.

The upper-end holding portion 153 may be located inside the lower end of the sidewall 151 (e.g, the outer surface of the cover housing 15 may be indented from the lower end 151*a* of the sidewall 151 to thereby form the outer surface of the upper-end holding portion 153). As such, the lower end of the sidewall 151 may be provided with a surface 157 that extends from the outer surface of the sidewall 151 to the upper-end holding portion 153 so as to be positioned opposite the upper end of the grille 20.

The cover housing 15 may include a protrusion 154, which protrudes from the inner surface of the sidewall 151, and the main body 40 may include a protrusion insertion groove 418. The protrusion 154 may be inserted into the protrusion insertion groove 418 to couple the cover housing 15 and the main body 40. The protrusion 154 may be prevented from being removed from the protrusion insertion groove 418 by the elasticity of the cover housing 15.

The upper end of the grille 20 may maintains its cylinder shape because the outer surface of the upper-end holding portion 153 may contact the inner surface of the grille 20 to prevent the upper end of the grille 20 from being unintentionally deformed. For example, the grille 20 may be formed of a thin sheet of a deformable material, such as a metal, but the upper end of the grille 20 is internally supported by the upper-end holding portion 153 and may hold a shape of exterior surface of the upper-end holding portion 153.

The cylindrical grille 20 is initially manufactured (i.e., before insertion onto the upper-end holding portion 153) by rolling a metal panel so as to form a substantially circular cross-sectional shape. When the upper-end holding portion 153 has an elliptical or other non-circular form along the lower end 151*a* of the sidewall 151, insertion of the upper end of the grille 20 into the upper-end holding portion 153 may cause the grille 20 to be deformed into a shape corresponding to the shape of the upper-end holding portion 153 (e.g., into an elliptical shape when the holding portion 153 has the elliptical shape) and may remain in the deformed state. Thus, if the shape of the upper-end holding portion 153 slightly varies during manufacturing, the upper end of the grille 20 may be deform to accommodate these variances while providing a reliable coupling between the upper-end holding portion 153 and the upper end of the grille 20.

Figure 6A:
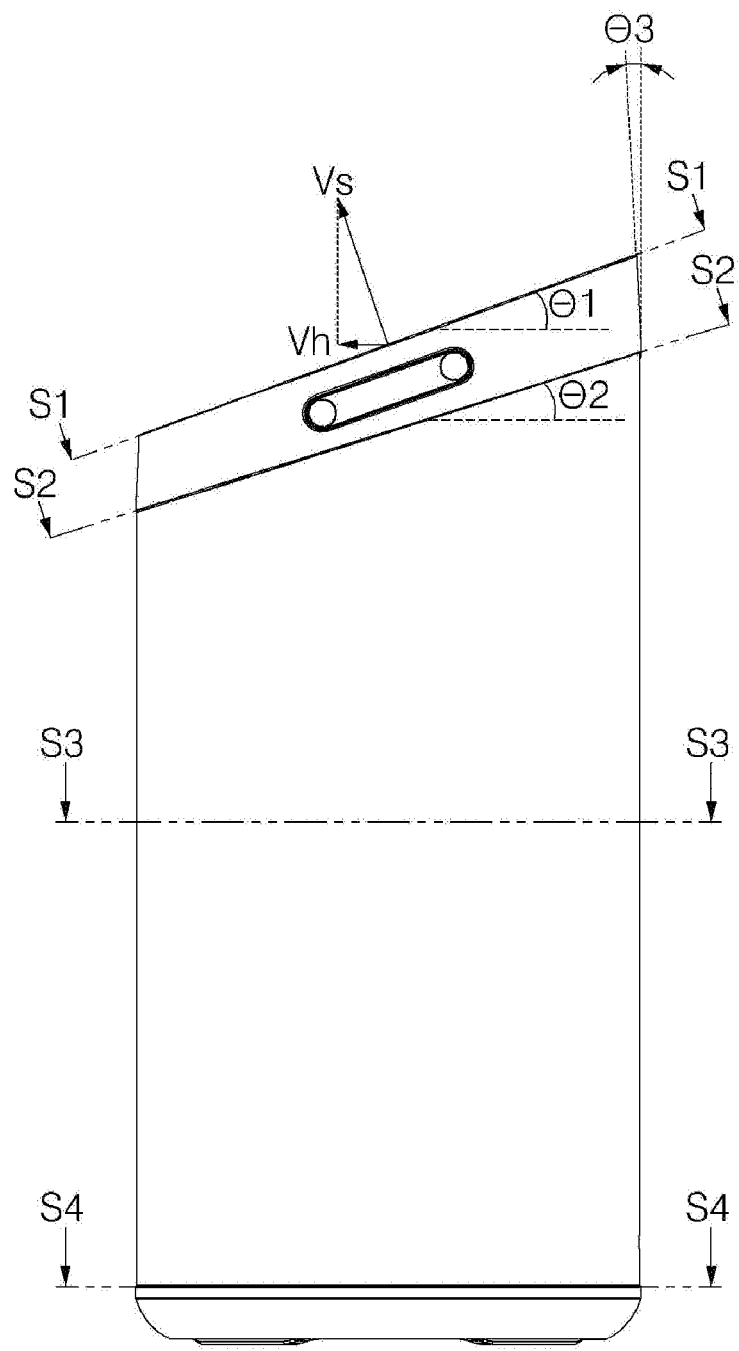
FIG. 6A is a right side view of the hub.
Figure 6B:
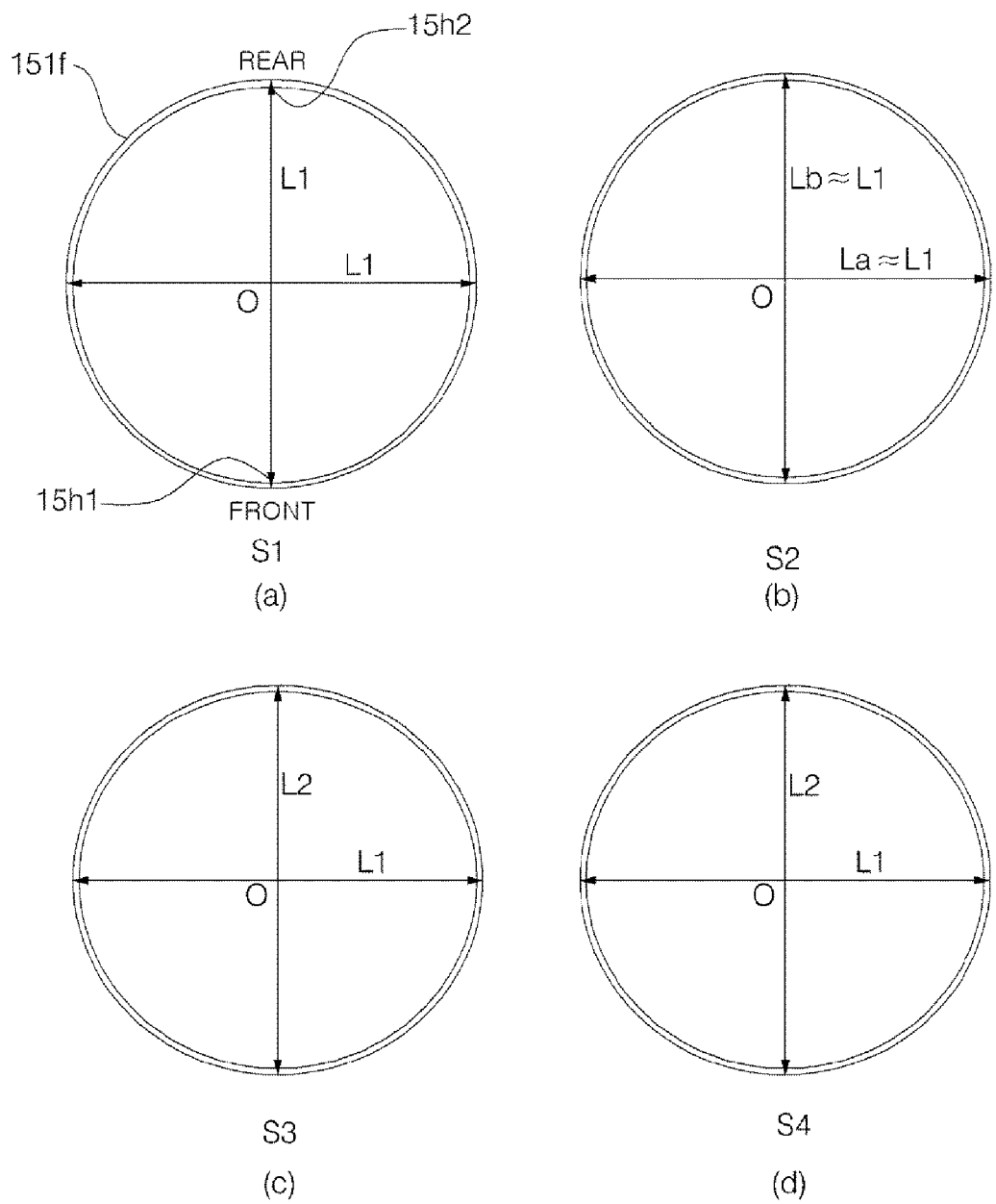
FIG. 6B illustrates cross-sections of a grille taken from respective portions illustrated in FIG. 6A.

Referring now to FIGS. 6A and 6B, the window 11 may be formed in a circular shape with a radius r. The window 11 may be inclined in cover housing 15 at a predetermined angle (which is designated by $\theta_1$ in FIG. 6A and is hereinafter referred to as a "first angle") relative to the horizontal plane. In the following discussion, a vector Vh may correspond to a horizontal plane extending from a top surface of window 11, and a normal vector Vs may project orthogonally with respect to the inclined upper surface of the window 11 (i.e., the normal Vs differs from vertical by the first angle $\theta_1$). The perceived shape of the window 11 when viewed from above (i.e., when orthogonally projected on the horizontal plane) is an ellipse having a short radius $r\cos\theta_1$ in the front-to-rear direction (i.e., between the highest and lowest portions of the window 11 when positioned on in the cover housing 15) and a long radius r in the left-to-right direction (orthogonal to the front-to-rear direction along the top surface of window 11). Thus, for a unified external appearance of the hub 1, the grille 20 may have a cross-sectional shape corresponding to an ellipse in which the ratio of the short radius to the long radius is $\cos\theta_1$:1). To achieve this cross sectional shape for the upper portion of grille 20, the upper-end holding portion 153 may also have a shape corresponding to the ellipse, such that the grille 20 is deformed into the shape corresponding to the ellipse of the upper-end holding portion 153 when positioned on the upper-end holding portion 153.

The inclination angle $\theta_1$ of the window 11 relative to the horizontal plane may be determined relative an expected position of user's eyes during a typical use of the hub 1. For example, the hub 1 may be expected to be positioned at a height of approximately 1 m during typical use, such as being positioned on a kitchen countertop or a dining table. Based on the expected height position of the hub 1, the inclination angle (or top slope of the hub 1) may be selected so that the eyes of a user of typical height in front of the hub 1 are positioned at an angle close to 90 degrees with respect to the upper surface of the window 11. In this example, the inclination angle may be approximately 20 degrees, without being limited thereto.

A display panel 131 may be inclined at a predetermined angle relative to the horizontal plane so that a resulting displayed screen faces forward and upward. The display panel 131 may be inclined similar to angle $\theta_1$ of the window 11. A window support plate 121, which will be described later, may also be inclined at a substantially same angle as the display panel 131 (or the window 11).

More specifically, referring to FIGS. 6A and 6B, the upper end of the sidewall 151 of the cover housing 15 may have a circular shape with an outer diameter L1, and the lower end 151a of the sidewall 151 may be inclined at an angle $\theta_2$ relative to the horizontal plane ($\theta_2$ being less than first angle $\theta_1$, and referred to hereinafter as a "second angle") to form a shape having a diameter La in the left-to-right direction and a diameter Lb in the front-to-rear direction. The outer surface of the sidewall 151 may be inclined at a predetermined third angle $\theta_3$ relative to the vertical axis such that a first shape acquired by orthogonally projecting the cross section 51 (i.e., a top surface of glass 11) on the horizontal plane and a second shape acquired by orthogonally projecting the cross section S2 (i.e., at the joint between the cover housing 15 and the grille 20) on the horizontal plane may not accurately coincide with each other. However, La may be substantially close to L1 when $\theta_3$ is a relatively small angle (preferably, 5 degrees or less). It may be assumed hereinafter that La=L1. In addition, when the difference between $\theta_1$ and $\theta_2$ is sufficiently small (preferably, 5 degrees or less), Lb may also be close to L1, and thus it may also assumed hereinafter that Lb=L1.

Here, third angle $\theta_3$ is the angle between the outer surface of the sidewall 151 and the vertical axis and may vary along the periphery of the sidewall 151. In another example, third angle $\theta_3$ may have a substantially constant value (i.e., remain with 10% of a particular angle) over the outer surface of the sidewall 151.

Referring to the cross sections S3 and S4 in FIG. 6B, the grille 20 may have an elliptical shape having a long outer diameter L1 in the left-to-right direction and a short outer diameter L2 in the front-to-rear direction, such that L1>L2. If it is assumed that La=L1 and Lb=L1, as mentioned above, L2 may equal L1 $\cos\theta_1$. Thus, the outer shape of the grille 20 orthogonally when projected on the horizontal plane may be an ellipse, with a diameter L2 in the front-to-rear direction and a longer diameter L1 in the left-to-right direction. As a result, even when the window 11 is inclined, hub 1 may have a unified elliptical or circular outer shape when viewed from above.

The sidewall 151 may be located above the grille 20 and may define an external appearance of the cover 10. The upper-end holding portion 153 may be inserted into and substantially hidden by the grille 20. Thus, upper-end holding portion 153 may not influence the external appearance of the hub 1.

Figure 21:
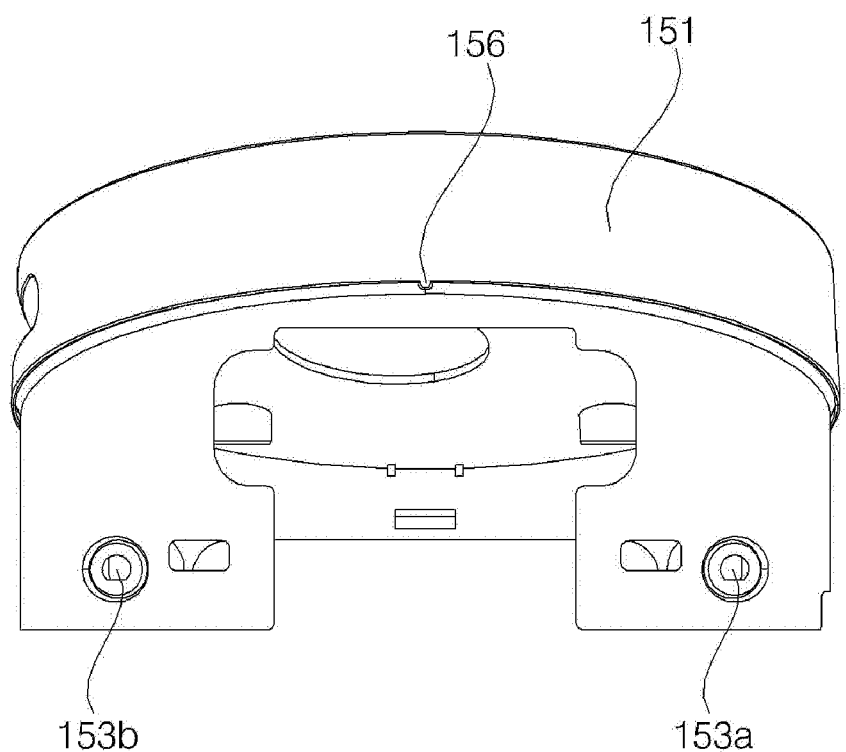
FIG. 21 is a rear view of the cover housing.

A positioning protrusion 156 may protrude from the lower end of the sidewall 151, and the grille 20 may have a positioning recess 26 (see FIG. 38) formed in the upper end thereof. The positioning protrusion 156 may be inserted into positioning recess 26 (see FIG. 21) when the grille 20 is install onto the upper-end holding portion 153 to correctly orient the grille 20 relative to the cover 10.

The window 11 may be located in the opening 15h of the cover housing 15. The window 11 may be a transparent plate having a constant thickness, and the side surface (or the outer circumferential surface) of the window 11 may be orthogonal to the upper and lower surfaces of the window 11.

The cover housing 15 may include an inner opening-defining surface 151b, which extends downward from the upper end of the cover housing 15 and parallel to the direction that the upper surface of the window 11 faces (i.e. the direction in which the normal vector Vs extends in FIG. 6A). The inner surface portion 151b at the upper end of the sidewall 151 may define the opening 15h. The opening-defining surface 151b may have a cylindrical shape that extends along the periphery of the opening 15h, and the window 11 may be located within the opening 15h so as to be surrounded by the opening-defining surface 151b. The upper end of the cover housing 15 may extend substantially to match a plane defining the upper surface of the window 11, such that the upper surface of the hub 1 is a substantially smooth plane.

Furthermore, the opening-defining surface 151b may be parallel to the vector Vs at any position. That is, even if the cover housing 15 is cut along an arbitrary plane parallel to the vector Vs, the opening-defining surface 151b may remain parallel to the vector Vs in the cut cross section. Because the opening-defining surface 151b and the side surface of the window 11 remain parallel to each other, a substantially constant gap g may be maintained between the window 11 and opening-defining surface 151b when the center of the window 11 and the center of the opening-defining surface 151b are aligned with each other along the vector Vs. As such, when viewing the hub 1 from above, the constant gap g may be maintained between the window 11 and the upper end of the cover housing 15. The gap g may be set to a minimum width that allows a side surface of the window 11 to avoid contacting the opening-defining surface 151*b* when the window 11 is pressed, (e.g., to operate contact switches 181*a*, 181*b*, 181*c* and 181*d* positioned under the window 11).

When the cover housing 15 is cut along an arbitrary vertical plane, the outer surface of the sidewall 151 may be parallel to the normal vector Vs, or may be gradually farther downward from the normal vector Vs. When the cover housing 15 is injection-molded, the cover housing 15 is discharged vertically downward from a first mold, which forms the sidewall 151. Thus, in order to allow the cover housing 15 to be easily separated from the first mold, the outer surface of the sidewall 151 needs to have the shape described above.

When the cover housing 15 is extends in an arbitrary vertical plane, the outer surface of the sidewall 151 may be parallel to the normal vector Vs, or may taper to extend gradually out farther downward from the window 11. When the cover housing 15 is injection-molded, the cover housing 15 may be discharged vertically downward from a first mold to form the sidewall 151. To easily separate the cover housing 15 from the first mold, the outer surface of the sidewall 151 may taper inward, as described above. To form the opening 15*h* in the upper surface of the cover housing 15, a second mold configured to be inserted into the opening 15*h* may be used. When the second mold is moved after the first mold is removed, the cover housing 15 may be separated from the second mold. In one example, a movement of the second mold may be in the same direction as the normal vector Vs.

Referring to FIGS. 8 and 15 to 18, the display PCB 14 may be disposed on the upper surface of the partition 152 and under a lower side of the display 13 to provide support to the display 13. The display PCB 14 includes a circuit that is electrically connected to the display 13, and the display 13 is connected to the circuit via a connector 132. Four contact switches 181*a*, 181*b*, 181*c* and 181*d* may be included on the upper surface of the PCB 14 at front and rear positions and left and right positions about the display 13.

The display PCB 14 may have a cross shape that extends forward and rearward and leftward and rightward from the center thereof when viewed from above. More specifically, the display PCB 14 may include a board 140 provided with a circuit, and a first board arm 145, a second board arm 146, a third board arm 147, and a fourth board arm 148, which extend, respectively, forward, rearward, leftward, and rightward from the approximately center of the board 140. The board 140 has an approximate cross shape, but the shape of the board 140 may not be symmetrical.

The board 140 of the display PCB 14 may be provided with a through-hole 140*h* for the passage of a support boss 122*b* formed on the window support 12, which will be described in other sections of the disclosure. The through-hole 140*h* may be formed for example, in the first board arm 145.

Figure 15:
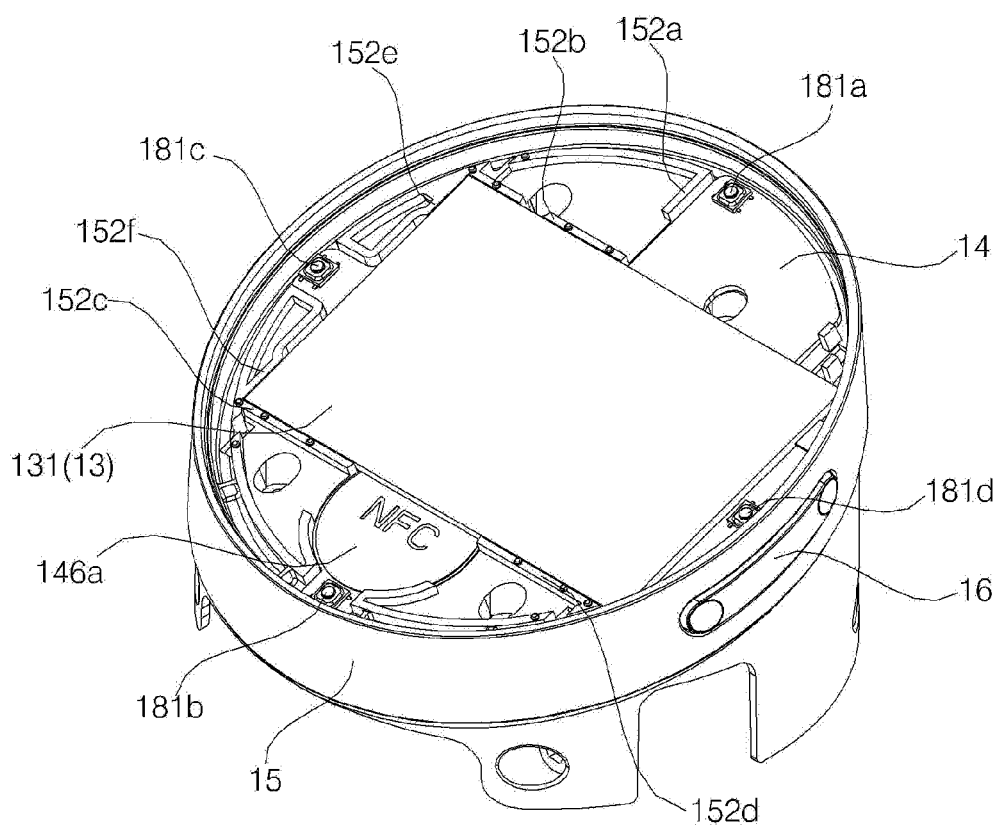
FIG. 15 illustrates an assembly of FIG. 9 after the removal of the window support.
Figure 16:
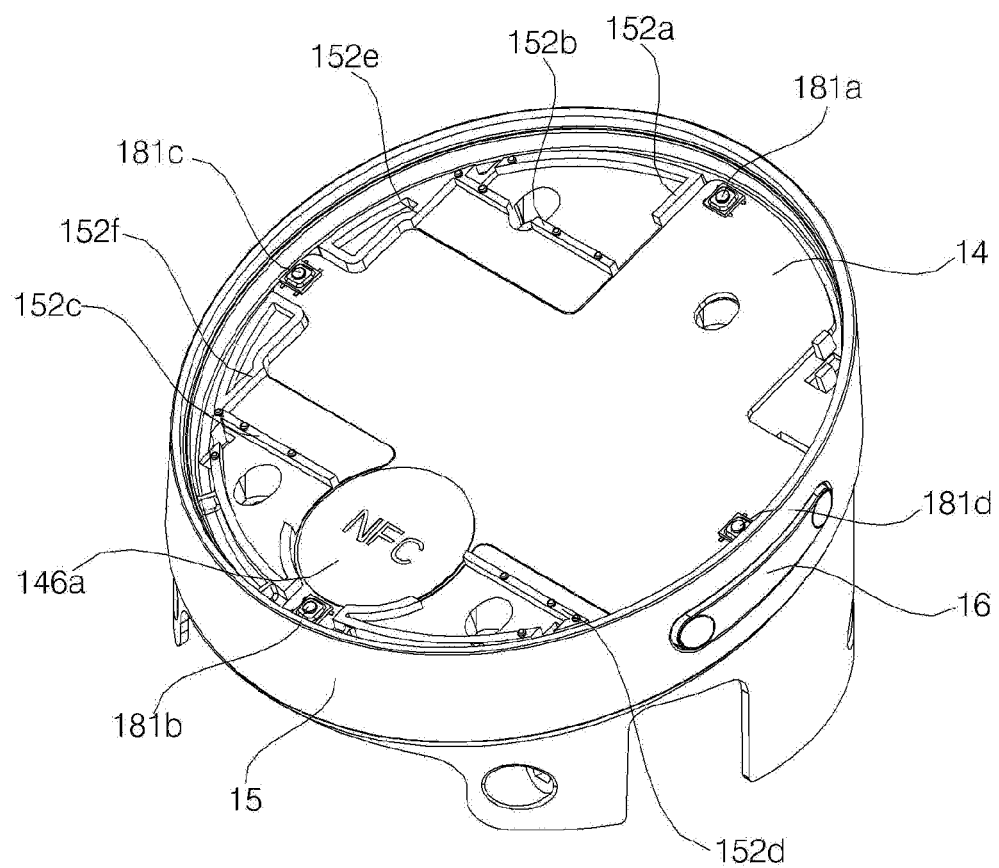
FIG. 16 illustrates the assembly of FIG. 15 after the removal of the window support.

Referring to FIGS. 15 and 16, a rib 152*a* may be formed on the upper surface of the partition 152 of the cover housing 15 so as to protrude from a portion that comes into contact with the periphery of the display PCB 14. The rib 152*a* may not have a shape corresponding to the entire periphery of the display PCB 14, and instead, the rib 152*a* may come into contact with a portion of the periphery of the display PCB 14. In another embodiment, a plurality of ribs 152*a* may be formed along the periphery of the display PCB 14. For example, the ribs 152*a* may be formed on with portions that come into contact with sides of the board arms 145, 146, 147 and 148 (i.e. sides extending outward from the center of the board 140).

A first contact switch 181*a*, a second contact switch 181*b*, a third contact switch 181*c* and a fourth contact switch 181*d* may be included in the respective board arms 145, 146, 147 and 148. The contact switches 181*a*, 181*b*, 181*c* and 181*d* may be electrically connected to the circuit formed on the board 140.

Figure 7:
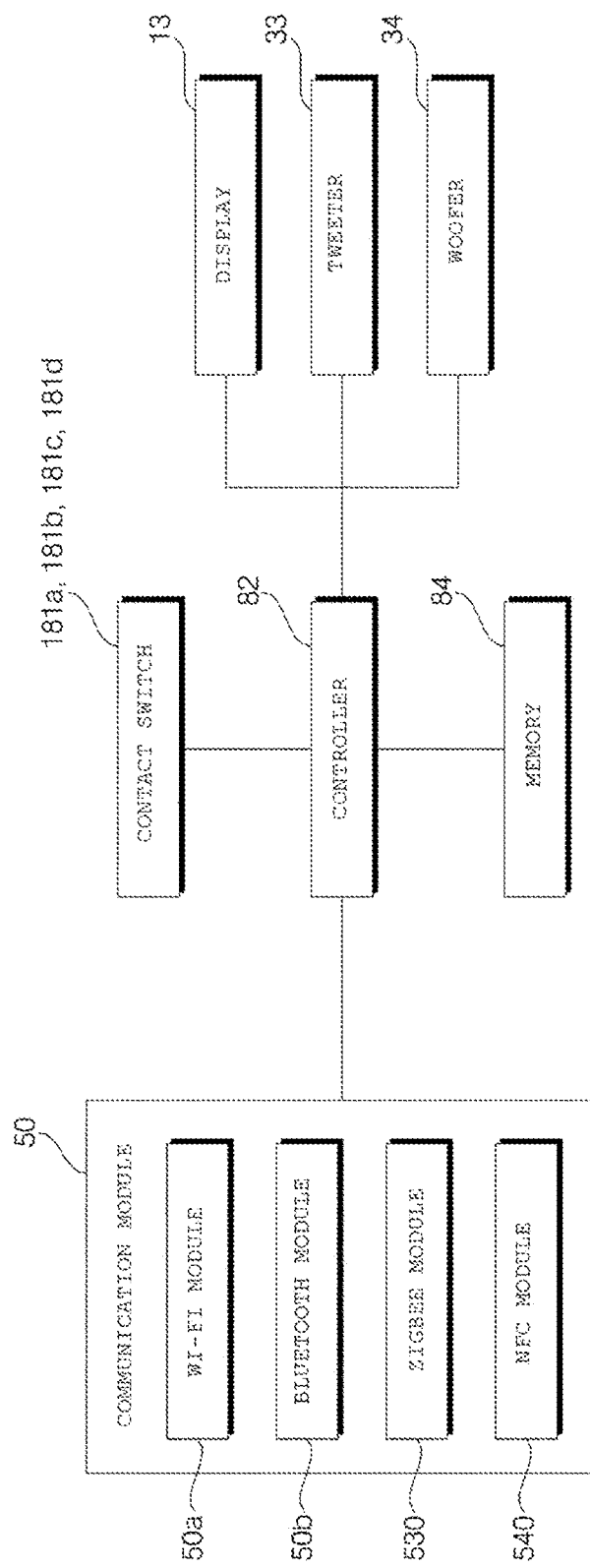
FIG. 7 is a block diagram illustrating the control relationship between major elements constituting the hub.

In one example, a near field communication (NFC) module 540 or other radio frequency identification (RFID) circuitry may be positioned on the display PCB 14 (see FIG. 7). The NFC module 540 may enable NFC communication, and may be positioned on an NFC mounting portion 146*a* formed on the second board arm 146. NFC is a type of radio frequency identification (RFID) technology and is a non-contact-type communication technology that uses the frequency band of 13.56 MHz. NFC provides relatively good security and is relatively inexpensive due to the short communication distance. NFC may not require a dongle (reader) used for other types of RFID because the NFC can perform both data reading and writing functions. NFC also does not require pairing between appliances.

The display 13 is a device for presenting an image upon receiving electrical signals, and may be connected to the circuit of the display PCB 14 so as to present the image in response to a control signal input through the circuit. The display 13 may include a display panel 131 for generating the image and a connector 132 for connecting the display panel 131 and the circuit of the display PCB 14 (see FIG. 8). The display panel 131 may be attached to the upper surface of the display PCB 14 using an adhesive member (e.g. a piece of double-sided tape 171 (see FIG. 17)).

The display PCB 14 may be connected to a main PCB 48, which will be described later, through a cable, wire, circuit line, or other connection (not illustrated). As such, a controller for the display 13 may be mounted on any one of the display PCB 14 or the main PCB 48. Hereinafter, the display 13 will be described as being controlled by a controller 82 (see FIG. 7) mounted on the main PCB 48, by way of example. A side surface of the main body 40 may include a vertically elongated groove 429 for receiving the cable.

A variety of pieces of information may be displayed on the screen of the display panel 131. The controller 82 may control the driving of the display panel 131 and the general operations of electric elements in the hub 1, based on programs stored in a memory 84. A user interface (UI) may be displayed via the display panel 131. This interface is realized via the execution of a program.

The interface may display playback information related to content being output by the speakers 43 and 44. For example, various information, such as playback/stop/selection menus of music, playback states, the title of a song, singer/record information, lyrics, and output volume, may be displayed.

When the hub 1 includes a communication module 50, the UI may display information exchanged through the communication module 50. For example, the interface may display a menu for controlling the accessories 2, 3*a* and 3*b*, which communicate with the communication module 50, or may display information processed based on the information transmitted from the accessories 2, 3*a* and 3*b*. For instance, the interface may display the network connection state of the communication module 50 or other information, such as, for example, the temperature, humidity, and brightness sensed by sensors provided in the accessory 2. In addition, the interface may display a menu for controlling the output of the speakers 43 and 44. For example, the interface may display a menu for selecting a song or recording album to be output via the speakers 43 and 44, information related to the recording album or song (e.g. the title of the song, the recording album name, or the singer), or the volume of audio output.

The menus displayed on the interface may be manipulated via the contact switches 181a, 181b, 181c and 181d. The processing the output signals of the respective contact switches 181a, 181b, 181c and 181d may be determined by a program stored in the memory 84. For example, menus options displayed on the interface at left and right positions may be selected in response to operating signals of the first and second contact switches 181a and 181b, and the menus displayed on the interface at upper and lower positions may be selected in response to operating signals of the third and fourth contact switches 181c and 181d.

The user may use a Bluetooth module 50b to communicate with an external device, such as a smart phone, a tablet computer, or a laptop computer. As such, various kinds of data, such as music and images, may be acquired from the external device and stored in the memory 84. In particular, the controller 82 may control the speakers 43 and 44 so that music stored in the memory 84 is output, and various functions, such as the selection, playback, and stoppage of music, may be realized via the contact switches 181a, 181b, 181c and 181d.

Figure 18:
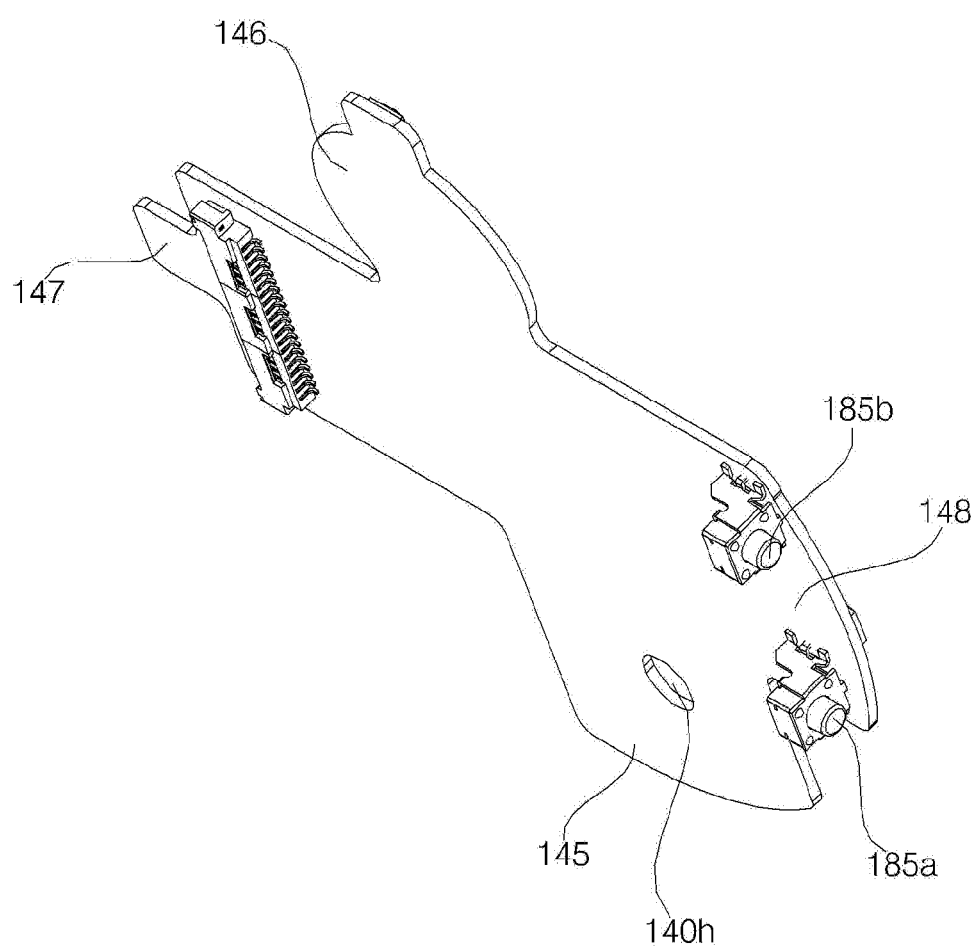
FIG. 18 is a perspective view illustrating the lower surface of the display PCB.

Referring to FIG. 18, a pair of volume adjustment switches 185a and 185b may be provided on the lower surface of the board 140. The volume adjustment switches 185a and 185b function to enable a user to adjust the volume of the speakers 43 and 44 provided in the main body 40. The volume adjustment switches 185a and 185b may be configured as respective contact switches, and may be connected to the circuit of the display PCB 14. The volume adjustment switches 185a and 185b may include a first volume adjustment switch (or a volume-increasing switch) 185a for increasing the volume of the speakers 43 and 44 whenever it is pushed or otherwise selected by the user, and a second volume adjustment switch (or a volume-decreasing switch) 185b for decreasing the volume of the speakers 43 and 44 whenever it is pushed or otherwise selected by the user. The volume adjustment switches 185a and 185b may be disposed, for example, on the fourth board arm 148 of the display PCB 14. Operable terminals (i.e., parts to be pushed for switching) of the volume adjustment switches 185a and 185b may protrude toward the sidewall 151 of the cover housing 15 to be contacted by a user.

Figure 19:
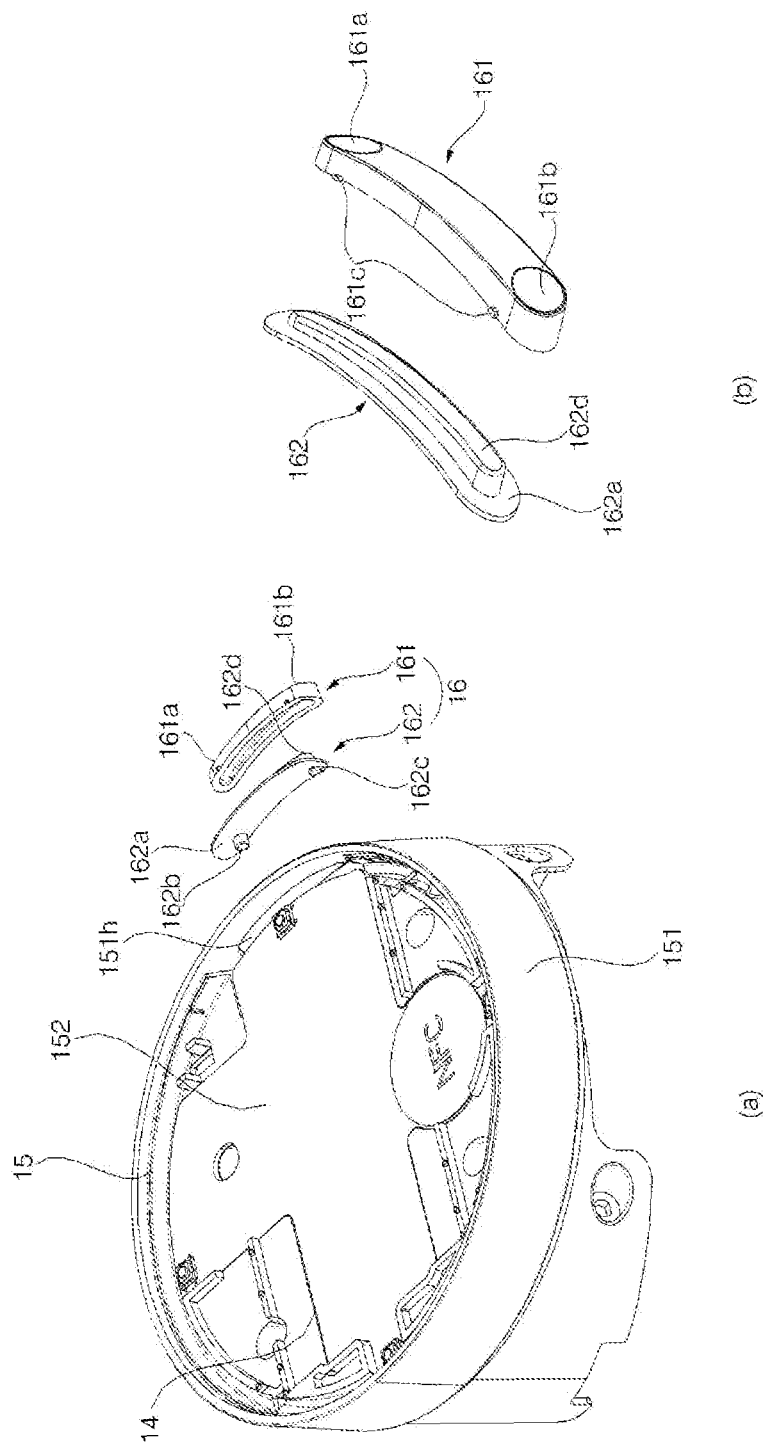
FIG. 19 is an exploded perspective view of the cover and a volume button.
Figure 20:
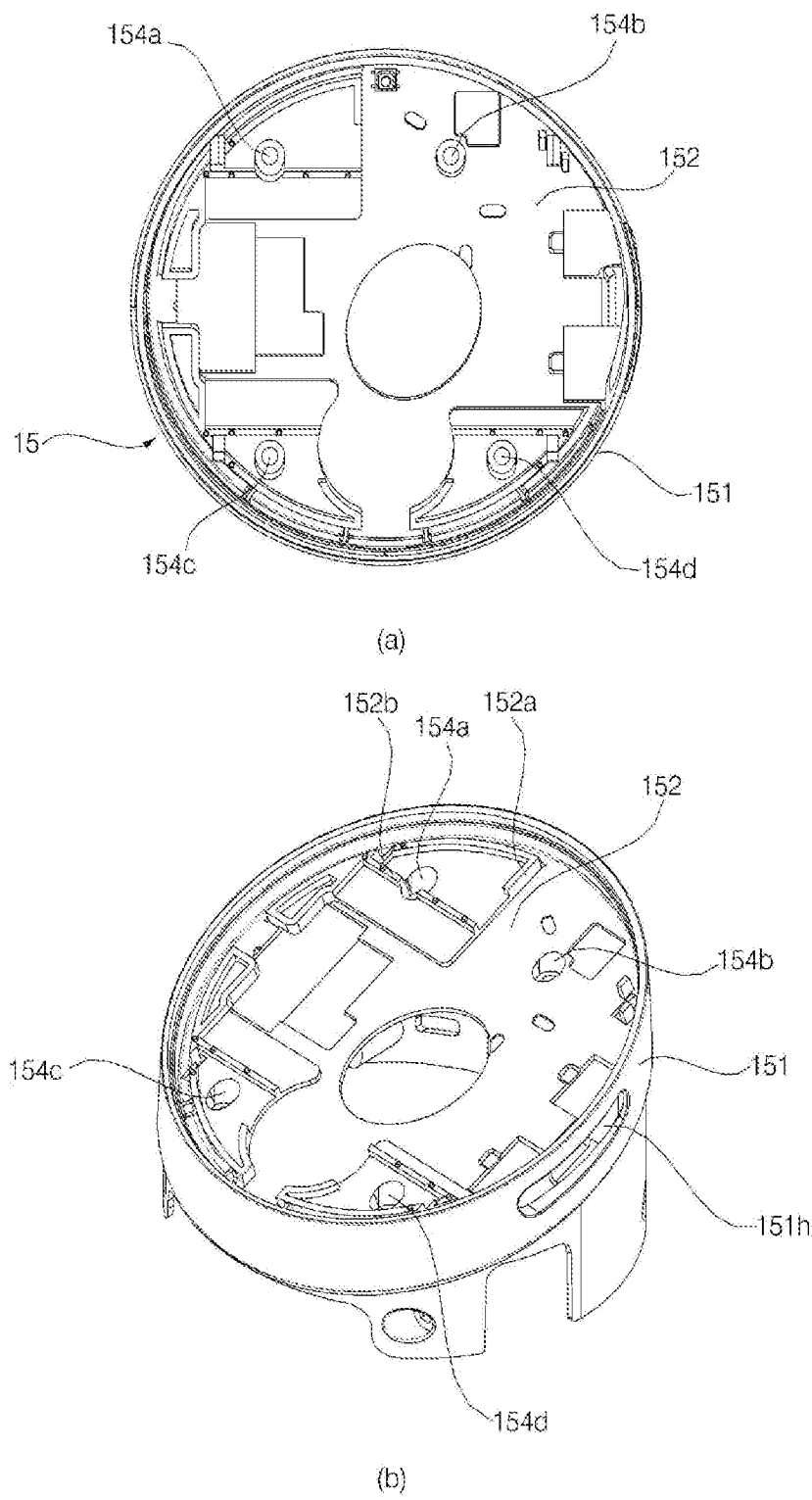
FIG. 20 is a plan view and a perspective view of a cover housing.

Referring to FIGS. 19 and 20, the sidewall 151 of the cover housing 15 may be provided with an opening 151h for the installation of a volume button 16. The volume button 16 may include a dome 161 and an elastic pad 162. The elastic pad 162 may be formed as a single element of an elastic material, such as rubber or plastic. The elastic pad 162 may a plate form that extends a long length in the circumferential direction of the sidewall 151. The elastic pad 162 may include a support portion 162a located inside the cover housing 15, a pair of switch-operable protrusions 162b and 162c protruding from the inner surface of the support portion 162a, and a dome fixing protrusion 162d protruding from the outer surface of the support portion 162a so as to be exposed outward through the opening 151h. The support portion 162a may be larger than the opening 151h and is generally not removed outward from the cover housing 15 through the opening 151h.

The dome 161 may be formed of a synthetic resin, plastic, ceramic, or other material and may have has a groove formed in one surface thereof to receive the dome fixing protrusion 162d. The dome fixing protrusion 162d may be interference-fitted into the groove to be coupled to the dome 161 by the elasticity or the restoring force of the constituent material of the dome fixing protrusion 162d. In another example, the dome 161 and the dome fixing protrusion 162d may be coupled to each other using an adhesive member, such as a piece of double-sided tape.

The dome 161 may include an anti-separation protrusion 161c protruding from the upper surface and/or the lower surface thereof. The anti-separation protrusion 161c may be located inside the cover housing 15 and may contact the periphery of the opening 151h to prevent the dome 161 from being separated from the cover housing 15 through the opening 151h. Although FIG. 19 depicts a pair of anti-separation protrusions 161c formed on each of the upper surface and the lower surface of the dome 161 in one exemplary embodiment, the present disclosure is not limited thereto.

When the elastic pad 162 is positioned in the opening 151h, the switch-operable protrusions 162b and 162c may be located at respective positions corresponding to the first volume adjustment switch 185a and the second volume adjustment switch 185b. When a volume-increasing manipulation portion 161b or a volume-decreasing manipulation portion 161b of the dome 161 is pressed, the switch-operable protrusions 162b and 162c of the elastic pad 162 operate the volume-increasing switch 185a or the volume-decreasing switch 185b, thereby enabling the volume of the speakers 43 and 44 to be adjusted.

Referring to FIGS. 8 to 14, the window support 12 may have an approximately circular shape and may be disposed above the display 13. The window support 12 may be an injection-molded component formed of a synthetic resin, plastic, or other material and, thus, formed as a single element. The window support 12 may have an opening 12h, such that the screen 131 of the display 13 is exposed through the opening 12h to present a generated image when the display 13 is positioned under the window support 12.

The opening 12h may be formed at a position corresponding to the display panel 131, which is located below the window support 12. The opening 12h may be slightly smaller than the display panel 131 so that window support 12 convers wires and/or circuitry located at a periphery of the display panel 131. The screen generated on the display panel 131 may be substantially visible through the opening 12h.

The display panel 131 may have a rectangular shape in which a left-to-right length is longer than a front-to-rear length when viewed by a user. As such, the opening 12h may also have a corresponding shape in which the left-to-right length of the opening 12h is longer than its front-to-rear length, so as to correspond to the shape of the display panel 131.

The window support 12 may include the window support plate 121, which defines the opening 12h and supports the window 11 disposed on the upper surface thereof. The window support 12 may include manipulation protrusions 126a, 126b, 126c and 126d and a plurality of support bosses 122a, 122b, 122c and 122d, which protrude downward from the lower surface of the window support plate 121 (i.e., away from glass 11).

The support bosses 122a, 122b, 122c and 122d may vertically extend downward from the window support 12. When the window 11 in inclined, the window support plate 121 may also be inclined substantially at the first angle θ1 relative to a horizontal plane to support the inclined window 11. In this situation, the support bosses 122a, 122b, 122c and 122d may not extend perpendicular to the window support plate 121 and, instead, may extend at a complementary angle 90-θ1 from the window support plate 121. In other words, the support bosses 122a, 122b, 122c and 122d may extend in a substantially vertical direction from the inclined window support plate 121.

Figure 9:
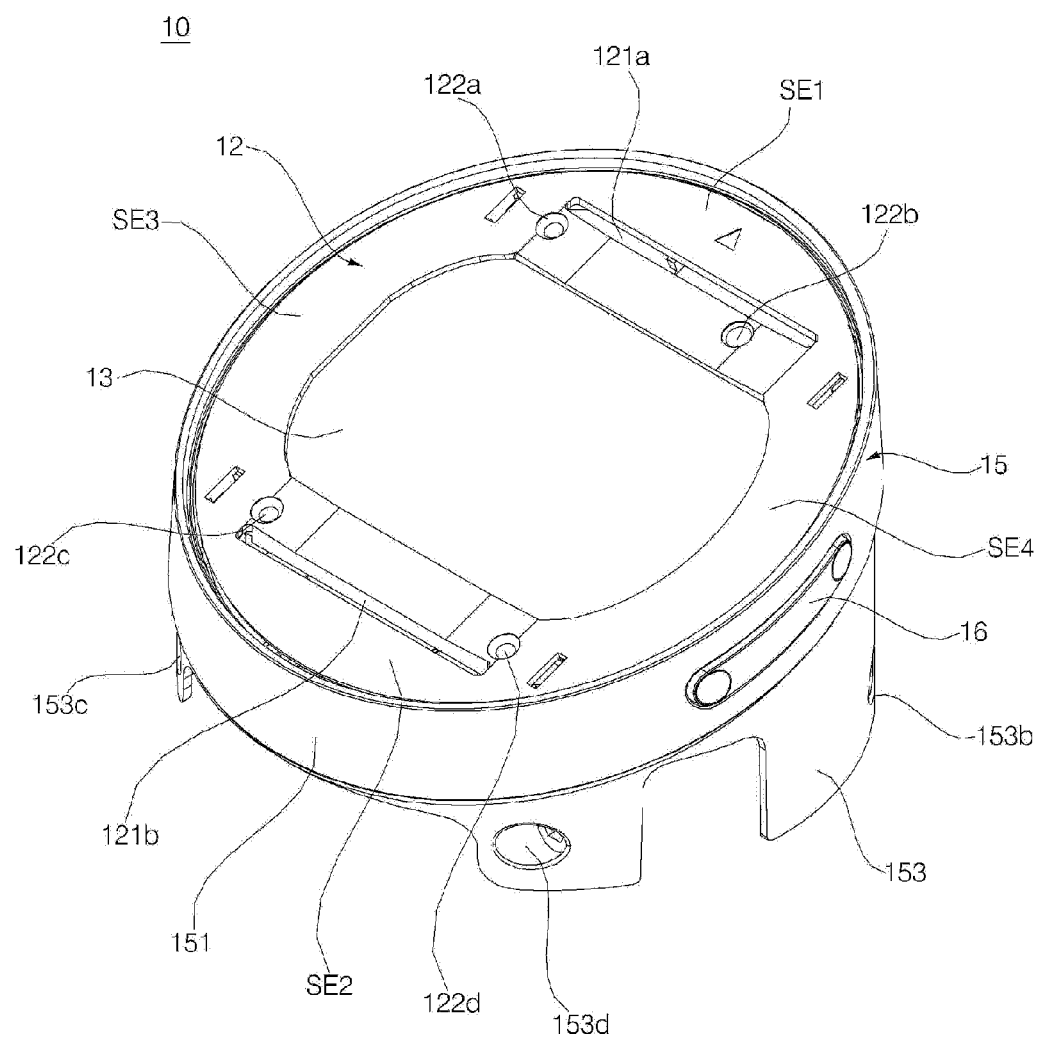
FIG. 9 illustrates the cover after the removal of a window.

Hereinafter, the window support plate 121, as illustrated in FIG. 9, may be divided into a first area SE1 located at the rear side of the opening 12h, a second area SE2 located at the front side of the opening 12h, a third area SE3 located at the left side of the opening 12h, and a fourth area SE4 located at the right side of the opening 12h. At least one of the support bosses 122a, 122b, 122c and 122d may be provided in each of the first area SE1 and the second area SE2. To enable the window support plate 121 to be stably supported without shaking, the four support bosses 122a, 122b, 122c and 122d may be formed, and among these, the first support boss 122a and the second support boss 122b may be located in the first area SE1, and the third support boss 122c and the fourth support boss 122d may be located in the second area SE2.

The support bosses 122a, 122b, 122c and 122d may be coupled to the cover housing 15 so as to support the window support plate 121. Additionally, the window support plate 121 may be spaced apart from the display PCB 14. At least one of the support bosses 122a, 122b, 122c and 122d may pass through one of four regions, which are divided by the board arms 145, 146, 147 and 148, to thereby be coupled to the partition 152, and at least one of the other support bosses 122a, 122b, 122c and 122d may pass through the through-hole 140h formed in the board arm 145 to thereby be coupled to the partition 152.

Figure 17:
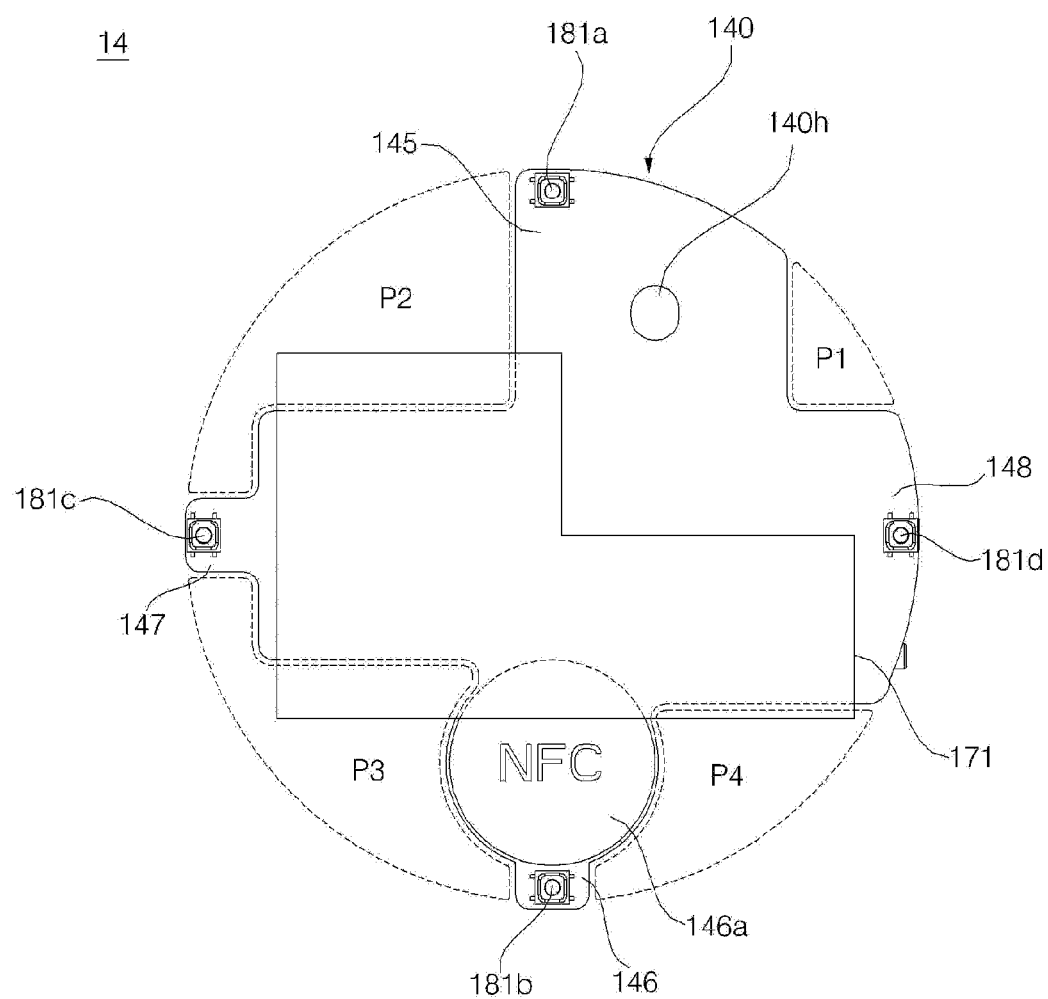
FIG. 17 is a plan view of a display PCB.

Referring to FIG. 17, the inside of the cover housing 15 may be divided into four regions P1, P2, P3 and P4 by the four board arms 145, 146, 147 and 148 having the cross shape. Hereinafter, the four divided regions P1-P4 may be are ordered so that P1 is defined as a first quadrant region, P2 is defined as a second quadrant region, P3 is defined as a third quadrant region, and P4 is defined as a fourth quadrant region.

The first support boss 122a, the third support boss 122c, and the fourth support boss 122d may respectively pass through the second quadrant region P2, the third quadrant region P3, and the fourth quadrant region P4 to thereby be coupled to the partition 152, and the second support boss 122b may pass through the through-hole 140h formed in the first board arm 145 to thereby be coupled to the partition 152.

The support bosses 122a, 122b, 122c and 122d and the partition 152 of the cover housing 15 may be directly coupled such that the support bosses 122a, 122b, 122c and 122d contact and are affixed are to the partition 152. For example, the support bosses 122a, 122b, 122c and 122d may be coupled to insertion bosses 154a, 154b, 154c and 154d formed on the partition 152. The partition 152 of the cover housing 15 may have the first insertion boss 154a, the second insertion boss 154b, the third insertion boss 154c, and the fourth insertion boss 154d, which are located at positions respectively corresponding to the first support boss 122a, the second support boss 122b, the third support boss 122c and the fourth support boss 122d. The insertion bosses 154a, 154b, 154c and 154d may protrude downward from the partition 152, and may extend parallel to the respective corresponding support bosses 122a, 122b, 122c and 122d.

The first support boss 122a, the second support boss 122b, the third support boss 122c and the fourth support boss 122d may be respectively inserted into the first insertion boss 154a, the second insertion boss 154b, the third insertion boss 154c and the fourth insertion boss 154d. The lower ends of the insertion bosses 154a, 154b, 154c and 154d may include fastening holes to receive fastening bolts 19 or other connector. The bolts 19 may pass upward through the respective fastening holes of the insertion bosses 154a, 154b, 154c and 154d and fastened to the support bosses 122a, 122b, 122c and 122d.

Referring to FIGS. 15 to 17, the cover housing 15 may include one or more ribs 152a, 152b, 152c, 152d, 152e and 152f, which protrude upward from the partition 152. At least one of the ribs 152a, 152b, 152c, 152d, 152e and 152f may contact the periphery of the display panel 131. The display PCB 14 is positioned on the upper surface of the partition 152 (i.e., between the partition 152 and the display panel 131), the ribs 152b, 152c, 152d, 152e or 152f may be positioned to avoid contact with the display PCB 14 and extend to support the periphery of the display panel 131. Accordingly, the regions P1, P2, P3 and P4, divided by the display PCB 14, may function as paths that pass the ribs 152b, 152c, 152d, 152e and 152f around the display PCB 14. Thus, the ribs 152b, 152c, 152d, 152e and 152f may pass through the regions P1, P2, P3 and P4 (divided by the board arms 145, 146, 147 and 148 of the display PCB 14) to contact with the edge of the display panel 131. The ribs 152b, 152c, 152d, 152e and 152f may function to position and secure the display panel 131.

The display panel 131 may have a rectangular shape, and at least one of four sides of the display panel 131 may come into contact with the ribs 152b, 152c, 152d, 152e and 152f. Each of a pair of parallel sides of the display panel 131 may come into contact with a rib. In an exemplary embodiment, the horizontal sides (or the sides extending in the left-to-right directions) of the display panel 131 come into contact with the ribs 152b, 152c and 152d. The ribs 152b, 152c and 152d may extend a long length along the horizontal sides of the display panel 131.

The ribs 152b, 152c and 152d may respectively pass through different regions among the four regions P1, P2, P3 and P4, which are divided by the board arms 145, 146, 147 and 148. In the exemplary embodiment, the rib 152b passes through the second quadrant region P2, the rib 152c passes through the third quadrant region P3, and the rib 152d passes through the fourth quadrant region P4, whereby the ribs 152b, 152c and 152d come into contact with the rear side (the upper horizontal side in the drawing), the left side, and the front side (the lower horizontal side in the drawing) of the display panel 131.

In some exemplary embodiments, a rib may be additionally formed to pass through the first quadrant region P1 and/or the fourth quadrant region P4 and contact with the right side of the display panel 131. One rib (e.g. the rib 152b), which comes into contact with any one side of the display panel 131, and another rib (e.g. the rib 152c), which comes into contact with another side of the display panel 131 may respectively pass through different regions (e.g. the regions P2 and P3) among the regions P1, P2, P3 and P4, which are divided by the board arms 145, 146, 147 and 148.

The window support plate 121 may be bent about the respective support bosses 122a, 122b, 122c and 122d when pressure is applied by a user (i.e., the user presses portions of the window 11 to input commands to the hub 1). The window support plate 121 may be elastically restored to an original shape when the applied pressure is removed.

The first manipulation protrusion 126a, the second manipulation protrusion 126b, the third manipulation protrusion 126c, and the fourth manipulation protrusion 126d of the window support 12 may be positioned at positions respectively corresponding to the first contact switch 181a, the second contact switch 181b, the third contact switch 181c, and the fourth contact switch 181d, which are included in the display PCB 14. As such, when pressure is applied to any one of the first area SE1, the second area SE2, the third area SE3 and the fourth area SE4 of the window support 2 through the window 11, the manipulation protrusion (e.g. the first manipulation protrusion 126a), which falls in the area to which the pressure is applied (e.g. the first area SE1), operates the contact switch located therebelow (e.g. the first contact switch 181a).

The window support 12 may further include a first tab 125a, a second tab 125b, a third tab 125c and a fourth tab 125d, which extend downward from the window support plate 121. The tabs 125a, 125b, 125c and 125d may protrude in the direction perpendicular to the bottom surface of the window support plate 121. Tab insertion recesses may be formed in the upper surface of the partition 152 of the cover housing 15 at positions corresponding to the tabs 125a, 125b, 125c and 125d.

The window 11 may be a circular plate. The window 11 may be attached to the upper surface of the window support plate 121 of the window support 12 using, for example, a piece of double-sided tape or an adhesive. To allow a user to view the screen displayed on the display 13 through the window 11, at least a portion of the window 11 over the display 13 may be formed of transparent material, such as acrylic, plastic, or glass. The entire window 11 may not be transparent. For example, a peripheral surface area of the window 11 may be opaque so that a user sees only the screen of the display panel 131 exposed through the opening 12h of the window support 12 but does not see the window support 12. In this example, only a predetermined area 11b of the window 11, which approximately corresponds to the opening 12h, may be transparent. The remaining area 11a of the window may be colored opaque or translucent, or a non-transparent film or other material (e.g., the double-sided tape used to couple the window 11 to the upper surface of the window support plate 121) may be attached to a surface of the remaining area 11a of window 11 (see FIG. 3).

As previously described, the window 11 may be formed of a clear elastic material such as acrylic or plastic. The window 11 may be bent or otherwise be deformed when a user applies pressure within a given range to a top surface of the window (e.g., the user touches the window 11 to input commands to the hub 1). The bending of window 11 may enable a smoother operation of the contact switches 181a, 181b, 181c and 181d. The window 11 may return to the original shape when the applied pressure is removed. In another example, the window support plate 121 and not window 11 bends in response to the user pressure, such that the window 11 moves in response to pressure based on the bending of the window support plate 121.

The opening 12h on the window support plate 121 has a longer horizontal length (or left-to-right length) than the vertical length (or front-to-rear length). Consequently, the third area SE3 and the fourth area SE4, which correspond to the left and right sides of the opening 12h, may not be suitable positions for the support bosses 122a, 122b, 122c and 122d. Due to the circular shape of the window 11, the distance from the periphery of the opening 12h to the third manipulation protrusion 126c or the fourth manipulation protrusion 126d in the third area SE3 and the fourth area SE4 may be shorter than the distance from the periphery of the opening 12h to the first manipulation protrusion 126a in the first area SE1 or the second manipulation protrusion 126b in the second area SE2. Since the third manipulation protrusion 126c and the fourth manipulation protrusion 126d may be relatively closer to the support boss when the support boss is formed in the third area SE3 or the fourth area SE4, a user may need to apply relatively larger pressure to the window support plate 121 in order to operate the third manipulation protrusion 126c and the fourth manipulation protrusion 126d. To enable more uniform contact pressures, the first support boss 122a and the second support boss 122b may be formed in the first area SE1, and the third support boss 122c and the fourth support boss 122d may be formed in the second area SE2.

When viewed from the top side, the first manipulation protrusion 126a may be located outside (i.e., radially further from a center of window support plate 121) the first support boss 122a and the second support boss 122b within the cover housing 15. Similarly, the second manipulation protrusion 126b may be located outside the third support boss 122c and the fourth support boss 122d within the cover housing 15.

Figure 10A:
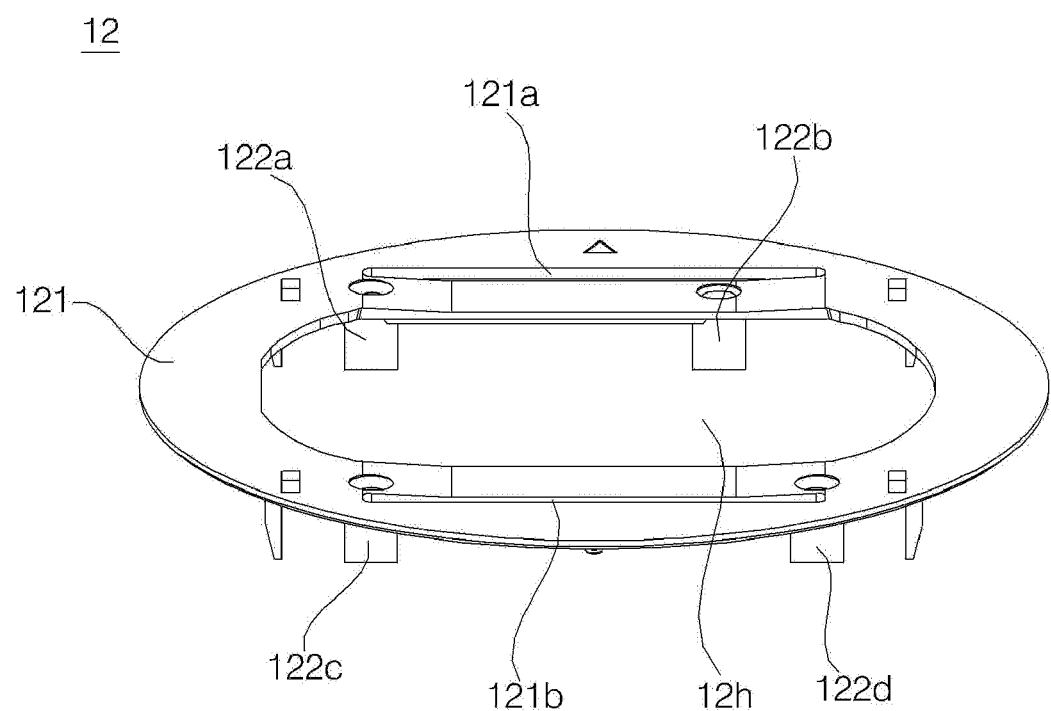
FIG. 10A is a perspective view illustrating the upper surface of a window support.
Figure 10B:
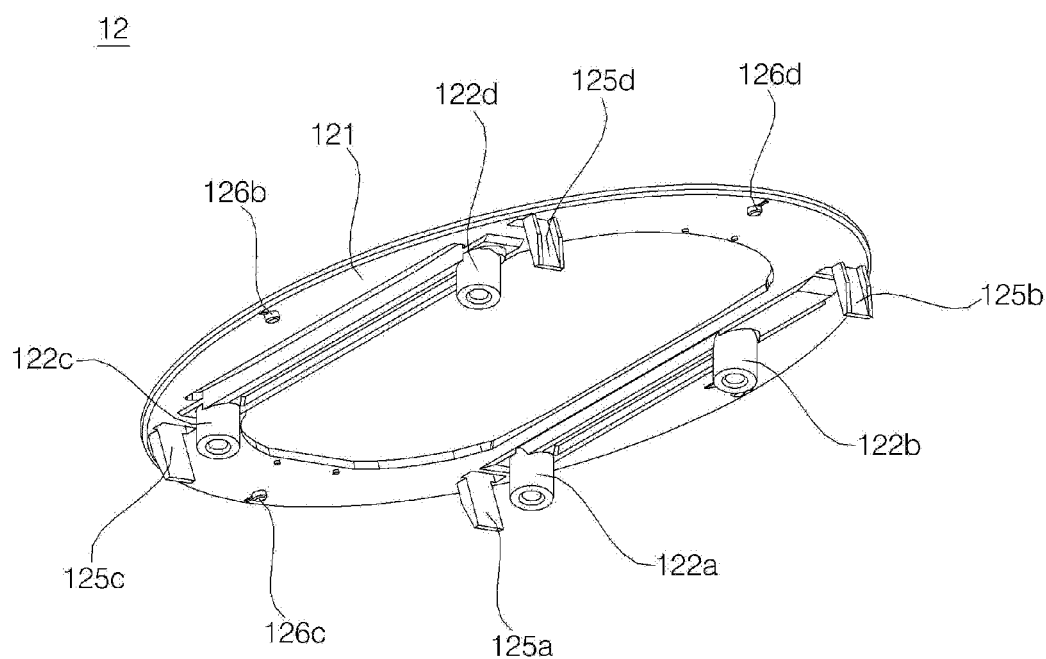
FIG. 10B is a perspective view illustrating the lower surface of the window support.
Figure 10C:
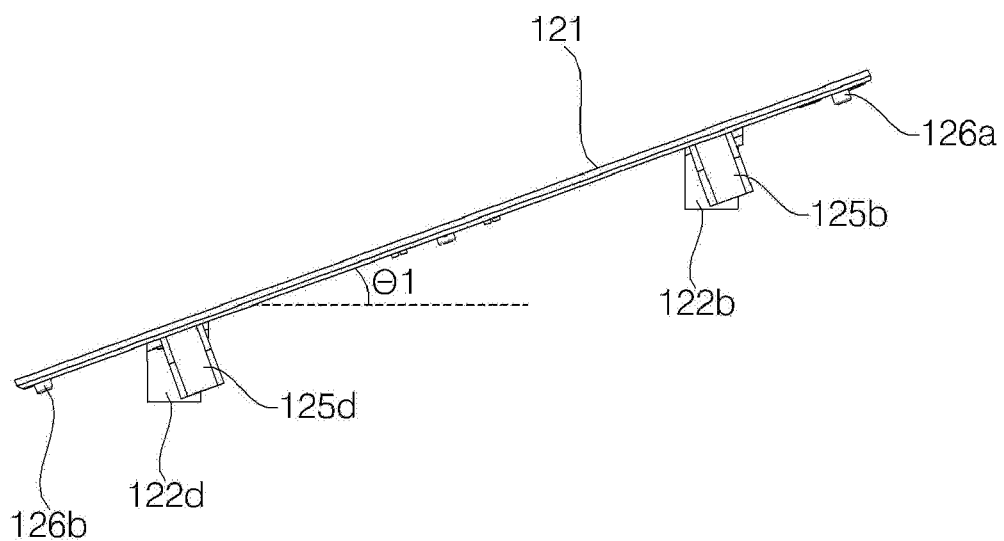
FIG. 10C is a right side view of the window support.
Figure 10D:
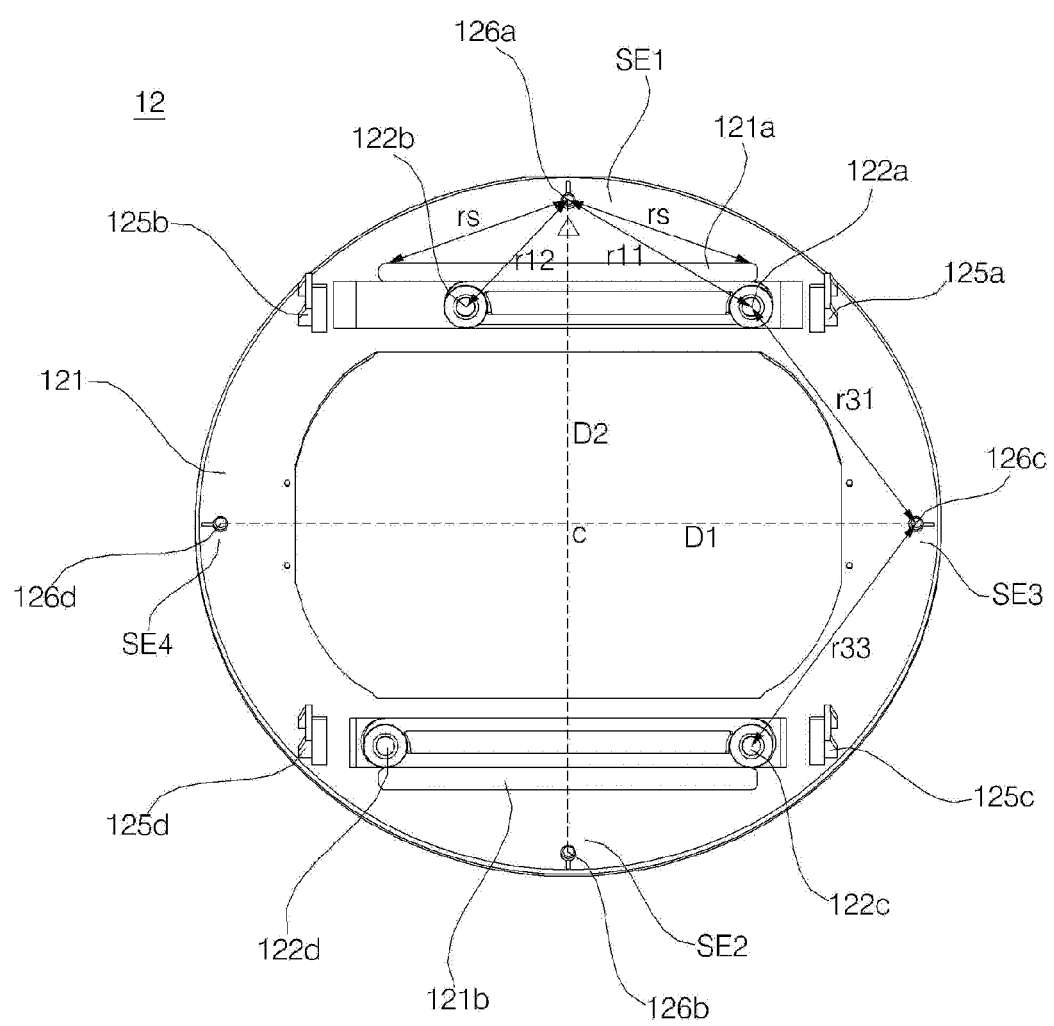
FIG. 10D is a bottom view of the window support.
Figure 11:
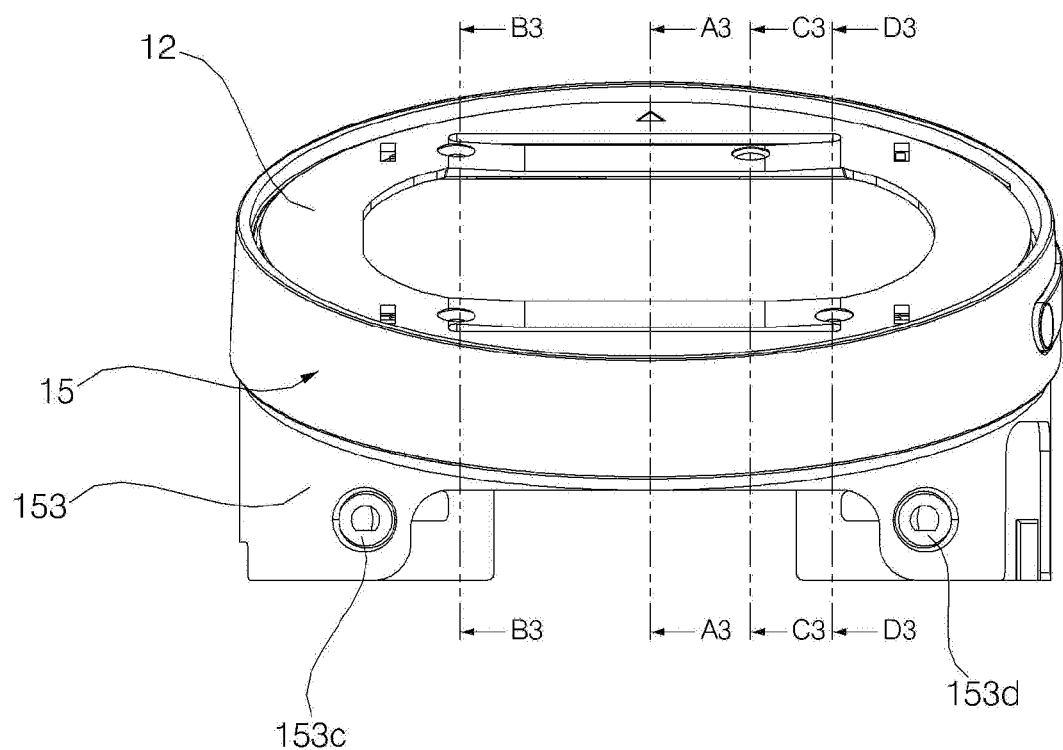
FIG. 11 is a front view of the cover illustrated in FIG. 9.
Figure 12A:
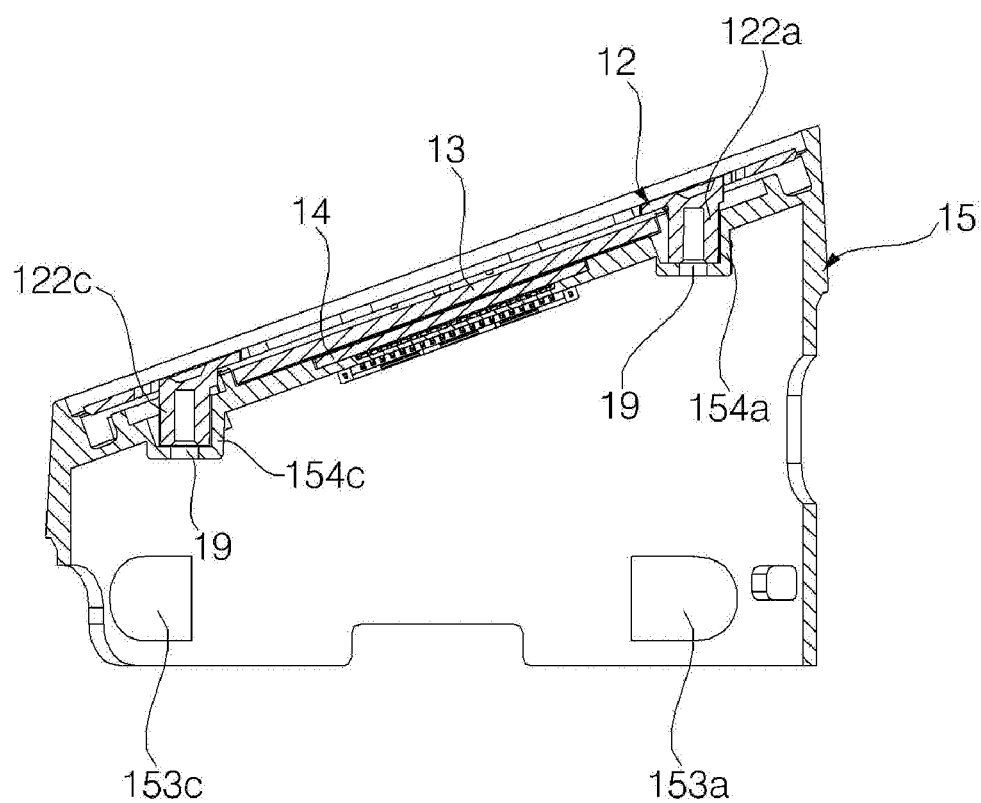
FIG. 12A is a sectional view taken along line B3-B3 of FIG. 11.
Figure 12B:
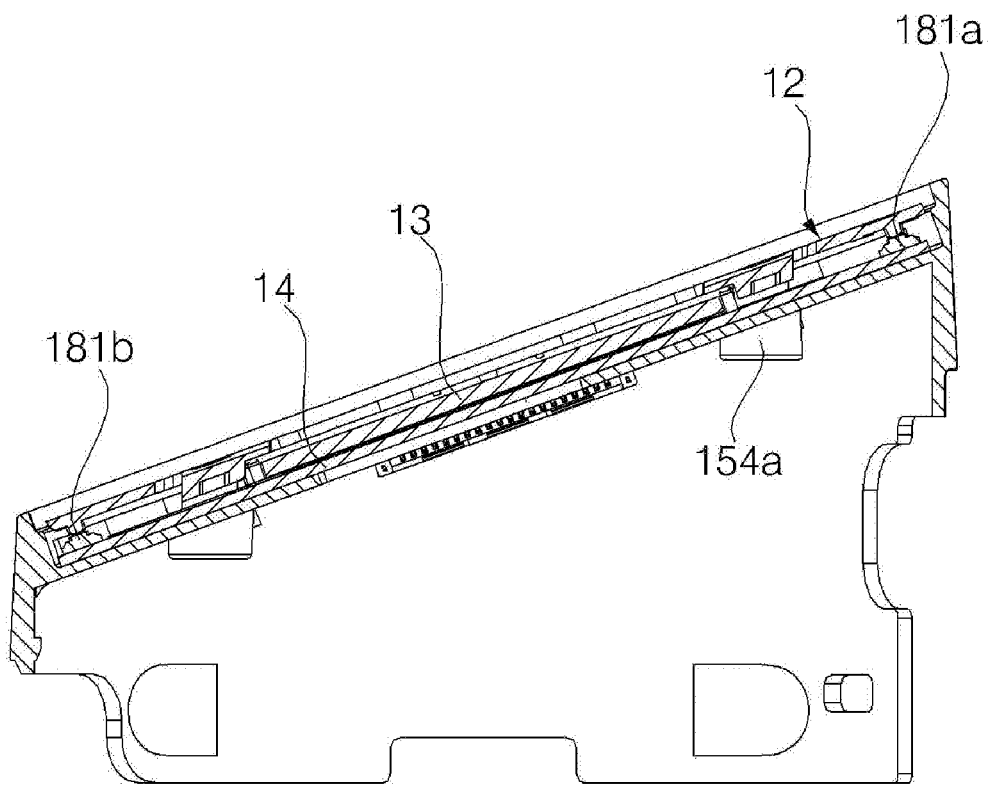
FIG. 12B is a sectional view taken along line A3-A3 of FIG. 11.
Figure 12C:
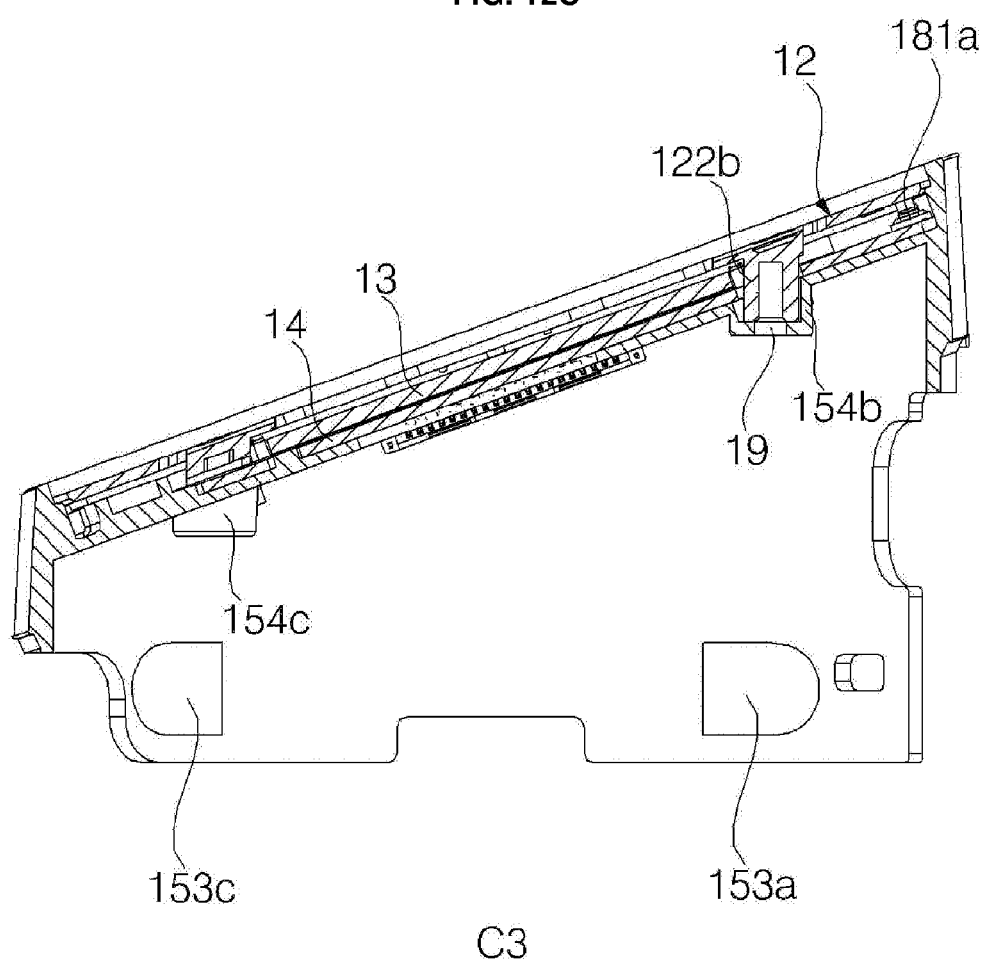
FIG. 12C is a sectional view taken along line C3-C3 of FIG. 11.
Figure 12D:
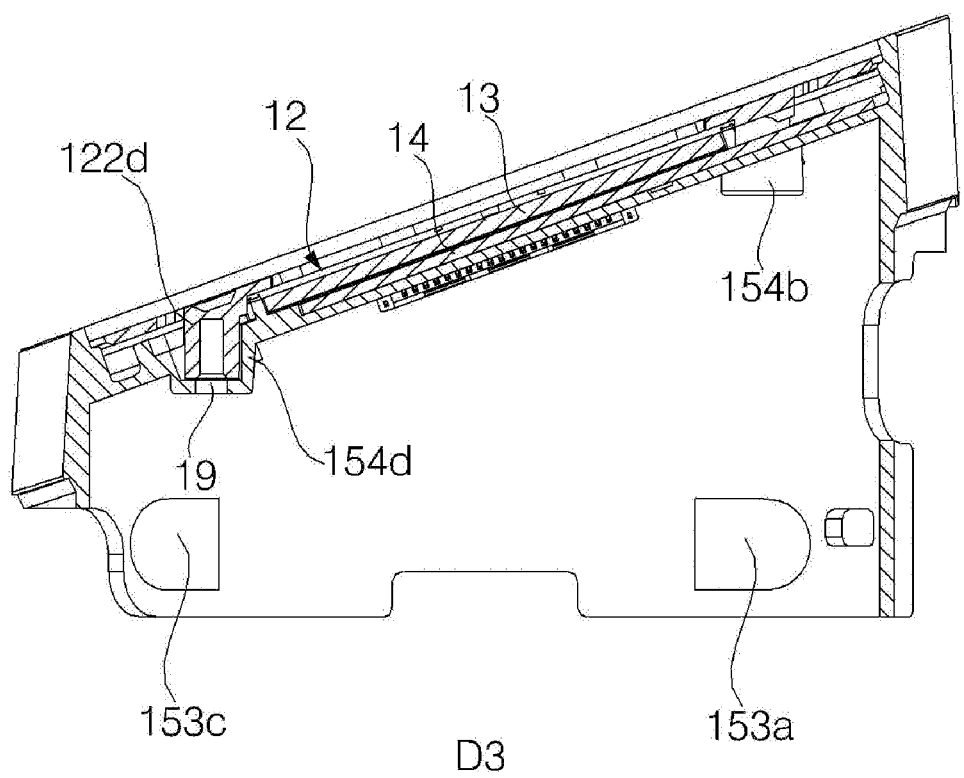
FIG. 12D is a sectional view taken along line D3-D3 of FIG. 11.
Figure 13:
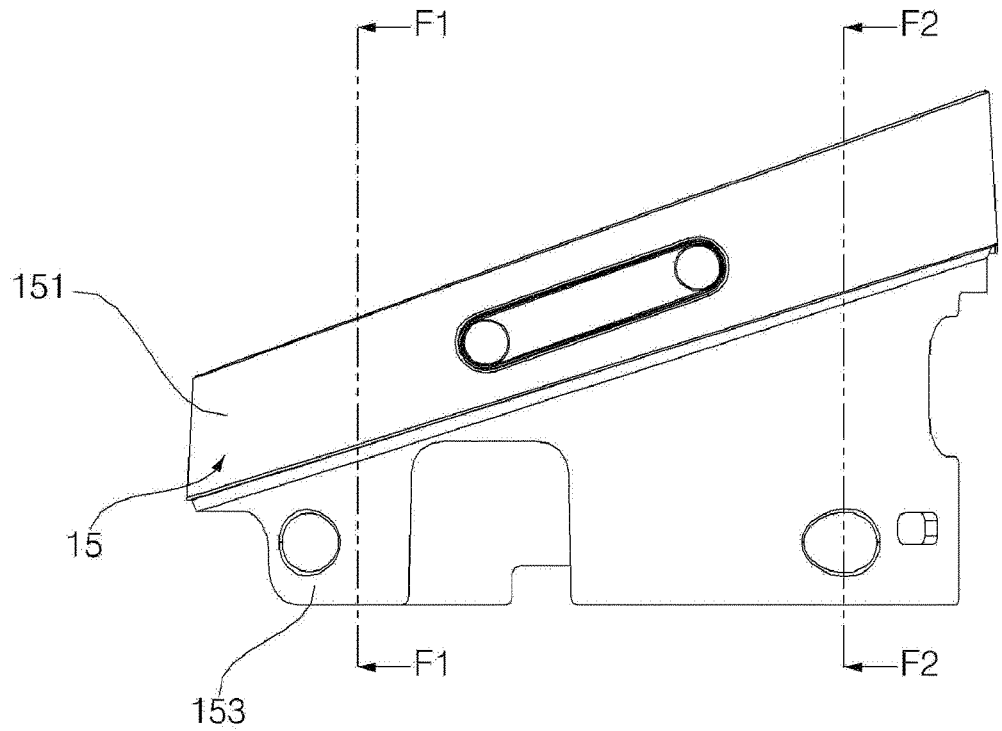
FIG. 13 is a right side view of the cover.
Figure 14A:
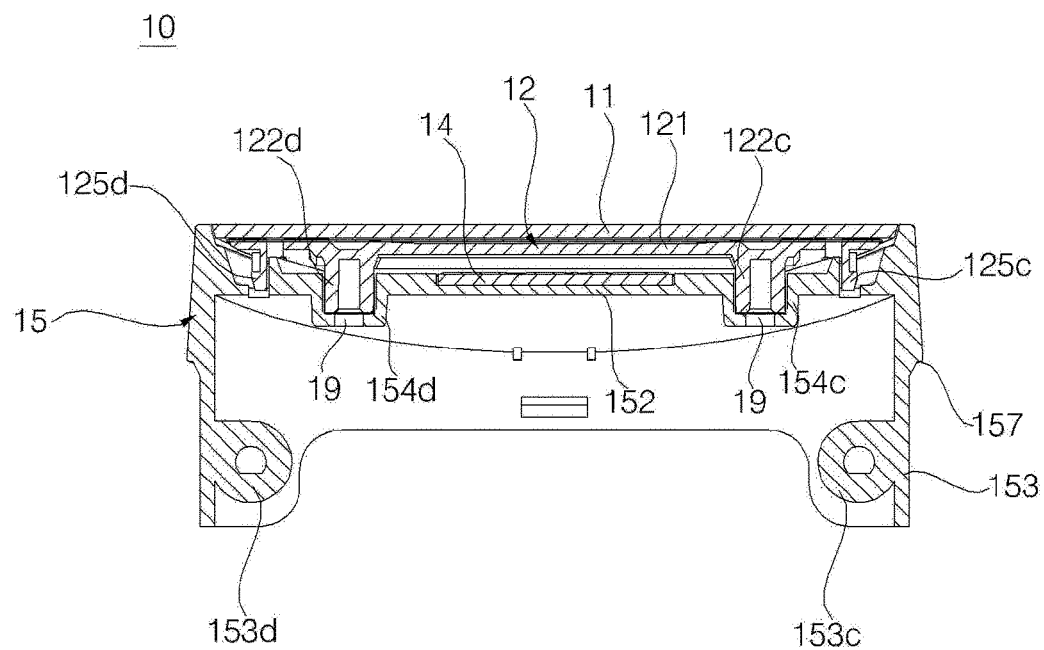
FIG. 14A is a sectional view taken along line F1-F1 of FIG. 13.
Figure 14B:
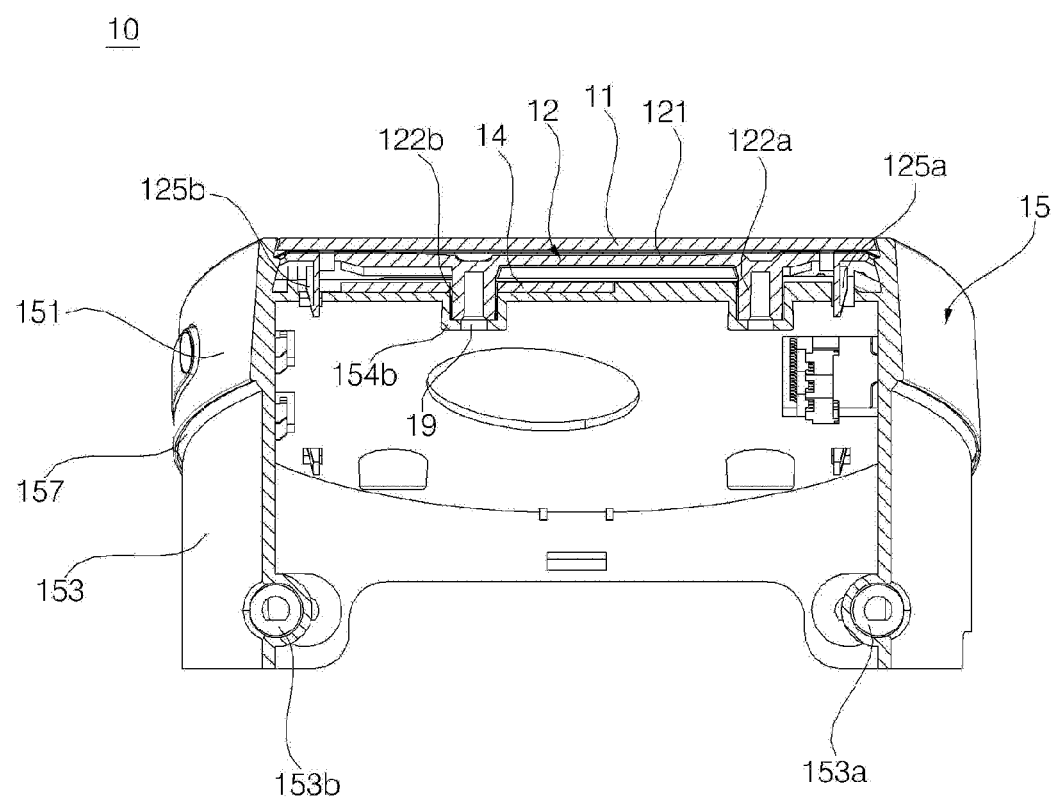
FIG. 14B is a sectional view taken along line F2-F2 of FIG. 13.

In another example, the first area SE1 and the second area SE2 may have slits 121a and 121b positioned between the manipulation protrusions 126a and 126b and the support bosses 122a, 122b, 122c and 122d. Referring to FIG. 10D, when the support bosses 122a, 122b, 122c and 122d are located in the first area SE1 or the second area SE2, the support bosses 122a, 122b, 122c and 122d may be closer to the first manipulation protrusion 126a or the second manipulation protrusion 126b than the third manipulation protrusion 126c or the fourth manipulation protrusion 126d. For example, when pressure is applied to the first area SE1 of the window support plate 121, the window support plate 121 may be bent about the first support boss 122a and the second support boss 122b. When the pressure is applied by the user, the first manipulation protrusion 126a may have a pivoting radius (or moment arm) r11 with respect to the first support boss 122a and a pivoting radius r12 with respect to the second support boss 122b. In an exemplary embodiment, r12 may be shorter than r11 because the first manipulation protrusion 126a is closer to the second support boss 122b than the first support boss 122a. In addition, when the distance from the third manipulation protrusion 126c to the first support boss 122a is r31 (r31>r11>r12), and the distance from the third manipulation protrusion 126c to the third support boss 122c may be r33 that substantially corresponds to r31.

The manipulation performance of each manipulation protrusion 126a, 126b, 126c or 126d may be affected by the distance to the closest support boss. Without slit 121a or 121b, when r31 is greater than r12 as in the above example, the third area SE3 is bent more easily than the first area SE1 even if similar pressures are applied to the first area SE1 and the third area SE3. This would cause the third manipulation protrusion 126c to be moved downward more easily than the first manipulation protrusion 126a such that the third contact switch 181c is activated with less user pressure than the first contact switch 181a. Similarly, the operation of the second contact switch 181b may require more activation pressure from a user than the third contact switch 181c or the fourth contact switch 181d. The differences in the activation pressures for the different contact switches 181a-d are generally undesirable and may lead to errors when receiving user inputs.

To provide more uniform activation pressures, the first slit 121a and the second slit 121b may be formed respectively in the first area SE1 and the second area SE2 of the window support plate 121. In the respective areas SE1 and SE2, the slits 121a and 121b may be located between the support bosses 122a, 122b, 122c and 122d and the manipulation protrusions 126a, 126b, 126c and 126d.

As illustrated in FIG. 10D, a diameter that passes the center c of the window support plate 121 and extends in the left-to-right direction may be referred to as a horizontal diameter D1, and the diameter that passes the center c of the window support plate 121 and extends in the front-to-rear direction may be referred to as a vertical diameter D2. In this context, the first support boss 122a and the second support boss 122b may be positioned in the first area SE1 in the direction substantially parallel to the horizontal diameter D1, and the third support boss 122c and the fourth support boss 122d may be positioned in the second area SE2 in the direction substantially parallel to the horizontal diameter D1. In addition, the first slit 121a and the second slit 121b may respectively extend in the direction substantially parallel to the horizontal diameter D1.

When the slits 121a and 121b are included in window support plate 121, the window support plate 121 may be bent at positions close to opposite ends of the slits 121a and 121b when the first area SE1 or the second area SE2 is pressed. In particular, because the window support plate 121 bends mainly in a narrow area between the ends of the slits 121a and 121b and the outer circumference of the window support plate 121, the window support plate 121 may be bent more with less user force than when the slits 121a and 121b are not included in the window support plate 121.

In addition, the distance between the manipulation protrusions 126a and 126b and the portions of the window support plate 121 in which the bending occurs may be increased when the slits 121a and 121b are present. For example, with respect to the first manipulation protrusion 126a, the distance rs to one end of the first slit 121a becomes longer than the distance r2 to the second support boss 122b because the pivoting radius of the force applied to a bending portion of the first area SE1 increases. This increased length contributes to more efficient downward movement of the first manipulation protrusion 126a.

Because the slits 121a and 121b are formed between the support bosses 122a, 122b, 122c and 122d and the manipulation protrusions 126a and 126b, the bending of the window support plate 121 in the first area SE1 and the second area SE2 is substantially more greatly affected by the position and shape of the slits 121a and 121b than the position of the support bosses 122a, 122b, 122c and 122d. Accordingly, when the first slit 121a and the second slit 121b are substantially symmetrically arranged, the manipulation performance of the first contact switch 181a and the second contact switch 181b may be equalized, even when the support bosses 122a, 122b, 122c and 122d of the first area SE1 and the second area SE2 are asymmetrically arranged.

Referring to FIGS. 3 to 5, the main body 40 may be supported by the base 30 located therebelow, and may be coupled at the upper end thereof to the cover housing 15. The main body 40 may include speaker cases 41 and 42 for forming a cavity 49 therein, and one or more speakers 43 and 44 may be placed in the cavity 49. In an exemplary embodiment, two speakers 43 and 44 may be included in upper and lower positions in the speaker cases 41 and 42. The speaker 43 located at the upper position may be a tweeter for outputting high-pitched sound, and the speaker 44 located at the lower position may be a woofer for outputting low-pitched sound.

Referring to FIGS. 22 to 25, the speaker cases 41 and 42 may include a front case 41 and a rear case 42, which define the cavity 49 therebetween. The front case 41 may be provided with a pair of upper and lower sound output ports, which are open forward in order to expose vibrating plates (e.g. membranes) of the tweeter 43 and the woofer 44 respectively.

A plurality of case-coupling bosses 411 may be formed on the inner surface of the front case 41 so as to protrude rearward. In the exemplary embodiment, two case-coupling bosses 411 may be formed on left and right sides at the same constant height to form a pair, and a pair of such case-coupling bosses 411 is formed at three different heights, so that the case-coupling bosses 411 may be formed at six places in total, without being limited thereto.

The rear case 42 may include insertion bosses 421 at positions corresponding to the case-coupling bosses 411 of the front case 41. Bolts or other connecters may be inserted from the rear side of the rear case 42 to pass through the respective insertion bosses 421 to thereby be fastened to the case-coupling bosses 411.

A pair of fastening bosses 153c and 153d may be indented rearward at left and right positions in the front surface of the upper-end holding portion 153 of the cover housing 15 (see FIGS. 11 to 14), and a pair of fastening bosses 153a and 153b in the rear surface of the upper-end holding portion 153 may be indented forward at left and right positions. Corresponding to the fastening bosses 153a, 153b, 153c and 153d formed in the cover housing 15, a first boss-insertion recess 415 and a second boss-insertion recess 416 may be formed in the front case 41 of the main body 40, and a third boss-insertion recess 425 and a fourth boss-insertion recess 426 may be formed in the rear case 42.

Figure 22:
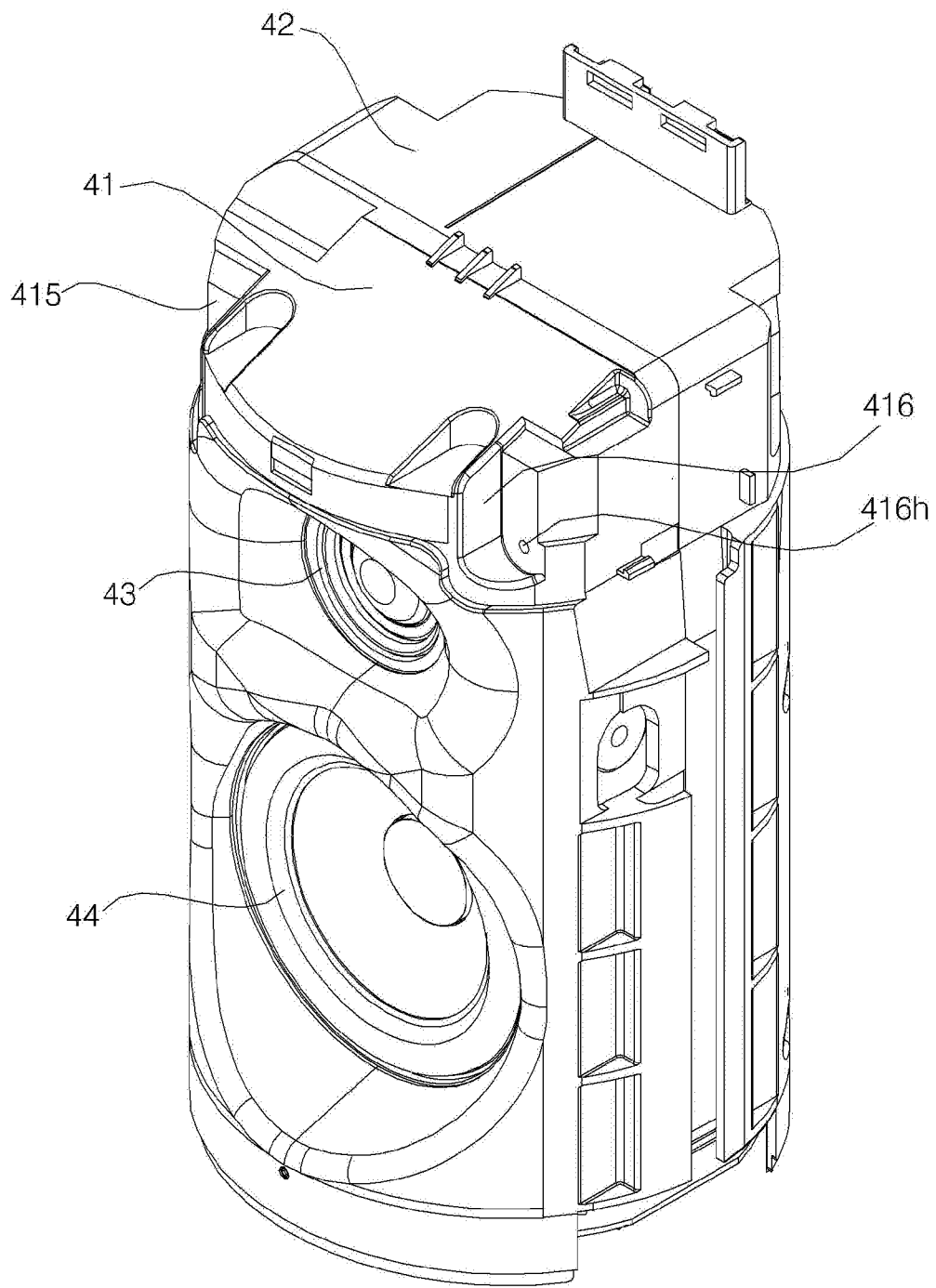
FIG. 22 is a perspective view illustrating the upper surface of a main body.
Figure 23:
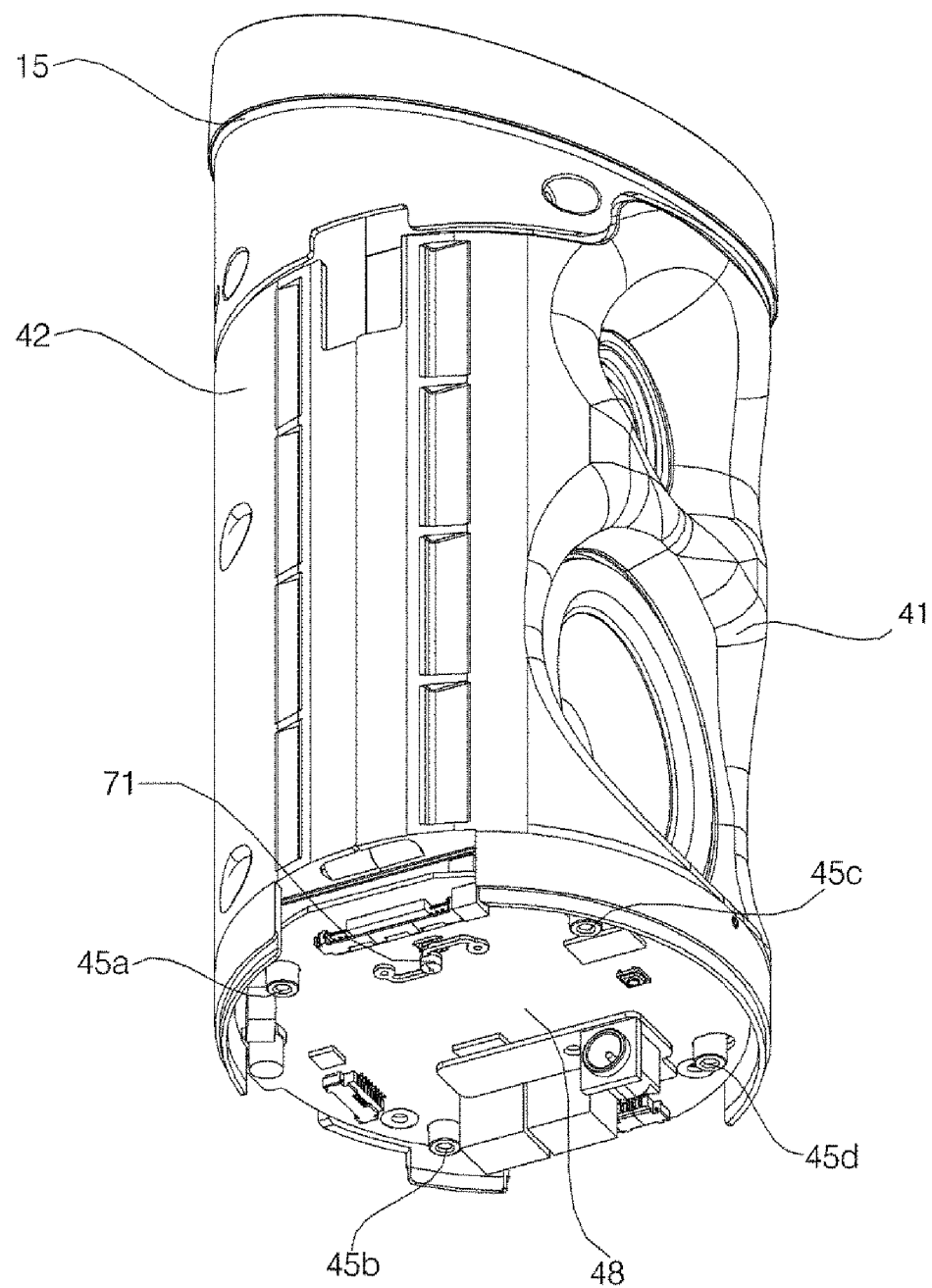
FIG. 23 is a perspective view illustrating the lower surface of the main body.
Figure 24:
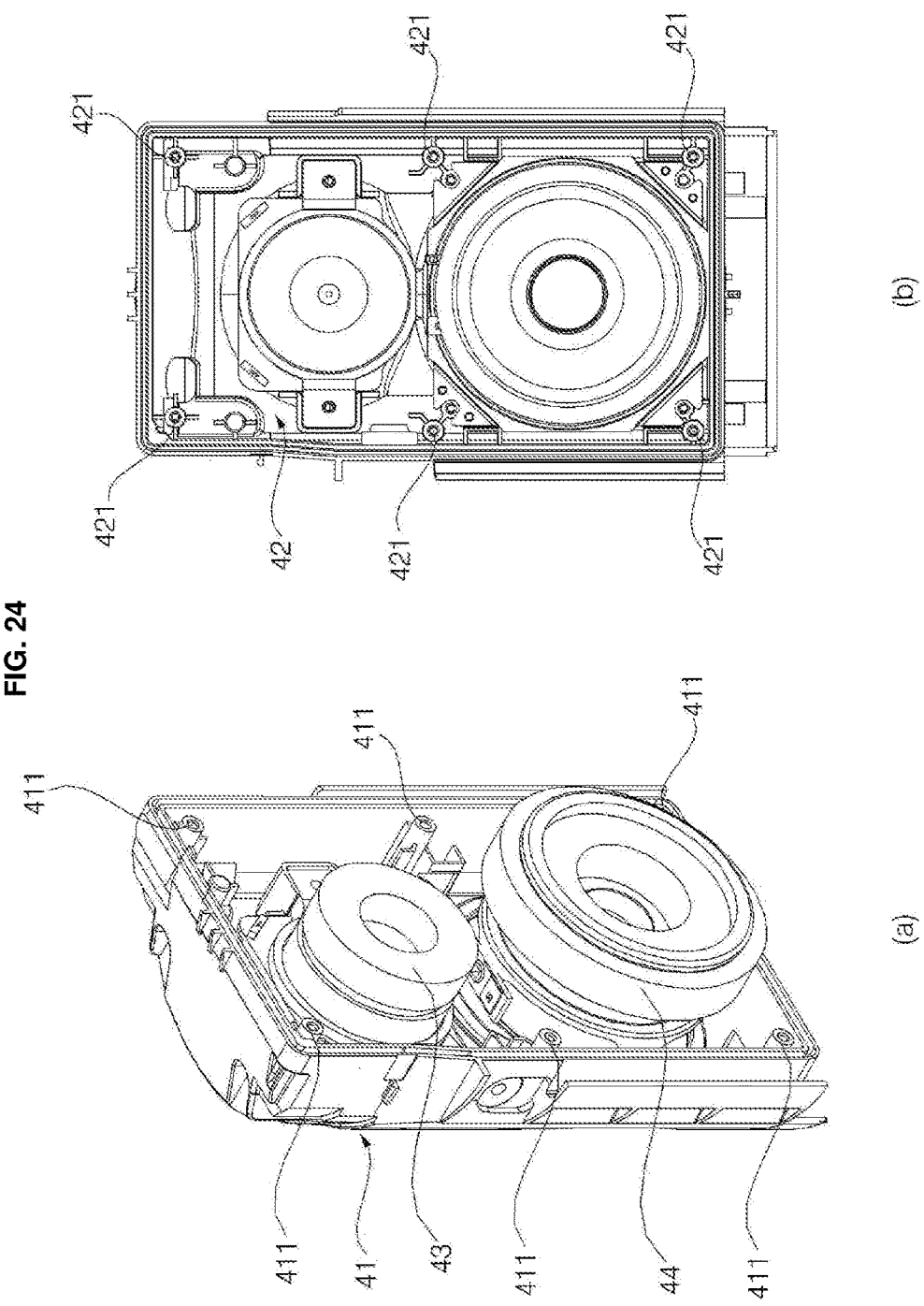
FIG. 24 illustrates a front case and a rear case.
Figure 25:
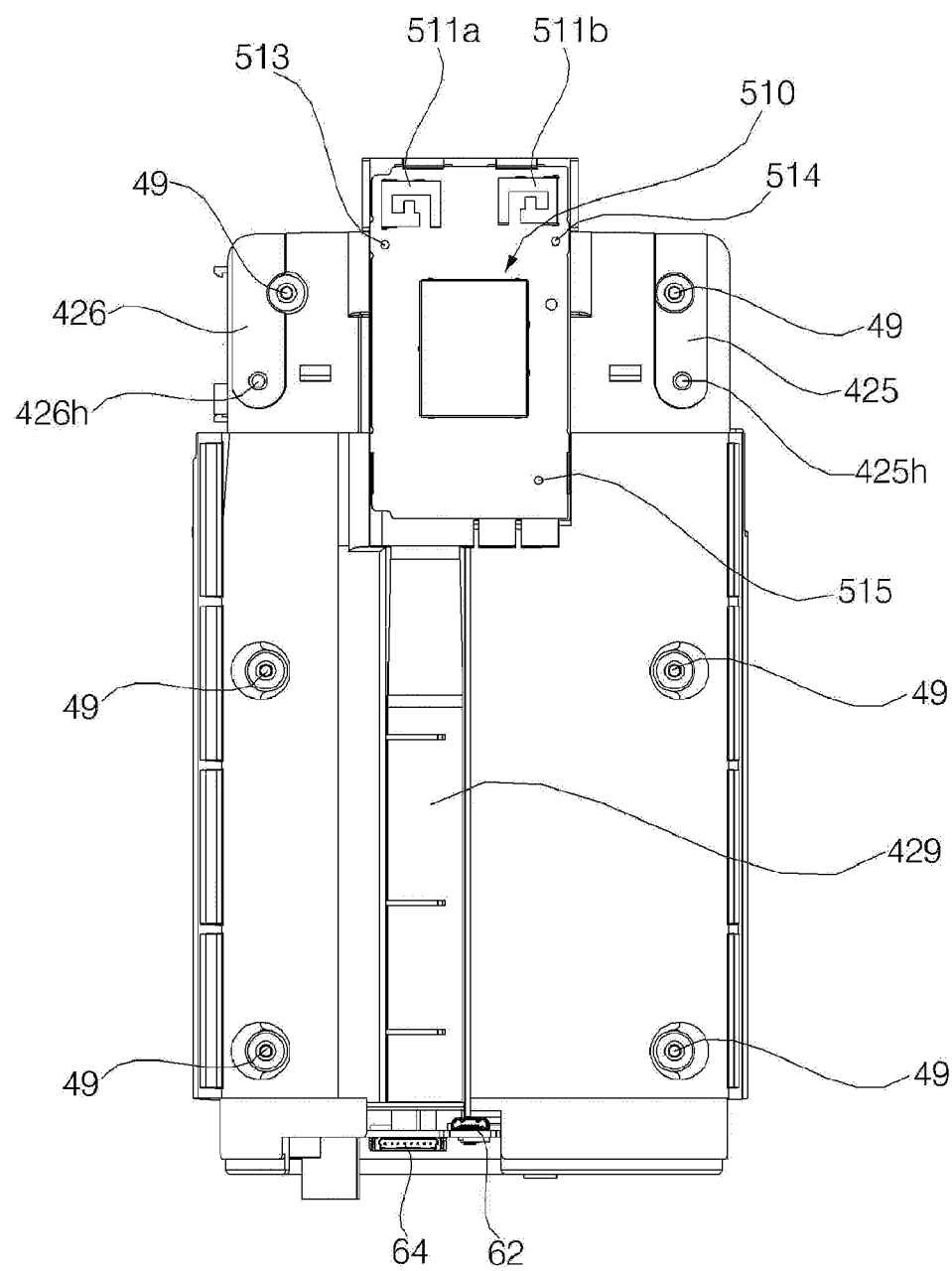
FIG. 25 illustrates the rear surface of the main body.

Referring to FIG. 22, each of the first boss-insertion recess 415 and the second boss-insertion recess 416 may be indented rearward from the front surface of the front case 41 (i.e. the surface facing the front side of the hub 1). The upper end of each recess 415 and 416 may be open to allow the fastening boss 153c or 153d to be inserted thereinto from the top side. Referring to FIG. 25, each of the third boss-insertion recess 425 and the fourth boss-insertion recess 426 may be indented forward from the rear surface of the rear case 42 (i.e. the surface facing the rear side of the hub 1). The upper end of each recess may be open to allow the fastening boss 153a or 153b to be inserted thereinto from the top side.

Each of the boss-insertion recesses 415, 416, 425 and 426 may have a fastening hole for the passage of a bolt or other connecter. For example, a fastening hole 416h may be formed in the second boss-insertion recess 416 and a fastening hole 415h may also be formed in the first boss-insertion recess 415. Similarly, fastening holes 425h and 426h (see FIG. 25) may also be formed in the other boss-insertion recesses 425 and 426.

Corresponding to the fastening bosses 153a, 153b, 153c and 153d formed in the cover housing 15, a first boss-insertion recess 415 and a second boss-insertion recess 416 may be formed in the front case 41 of the main body 40, and a third boss-insertion recess 425 and a fourth boss-insertion recess 426 may be formed in the rear case 42.

Referring to FIG. 22, each of the first boss-insertion recess 415 and the second boss-insertion recess 416 may be indented rearward from the front surface of the front case 41 (i.e. the surface facing the front side of the hub 1). The upper end of each recess 415 and 416 may be open to allow the fastening boss 153c or 153d to be inserted thereinto from the top side. Referring to FIG. 25, each of the third boss-insertion recess 425 and the fourth boss-insertion recess 426 may be indented forward from the rear surface of the rear case 42 (i.e. the surface facing the rear side of the hub 1). The upper end of each recess may be open to allow the fastening boss 153a or 153b to be inserted thereinto from the top side.

Each of the boss-insertion recesses 415, 416, 425 and 426 may have a fastening hole for the passage of a bolt or other connecter. For example, a fastening hole 416h may be formed in the second boss-insertion recess 416 and a fastening hole 415h may also be formed in the first boss-insertion recess 415. Similarly, fastening holes 425h and 426h (see FIG. 25) may also be formed in the other boss-insertion recesses 425 and 426.

A module assembly 510 including the Wi-FI module 50a and the Bluetooth module 50b may be placed on the rear portion of the main body 40. For example, the module assembly 510 may be positioned on or coupled to the rear case 42. The module assembly 510 may be coupled to or separated from the rear case 42. In other example, the Wi-FI module 50a and the Bluetooth module 50b may be separately provided so as to be independently coupled to or separated from the main body 40.

Figure 26:
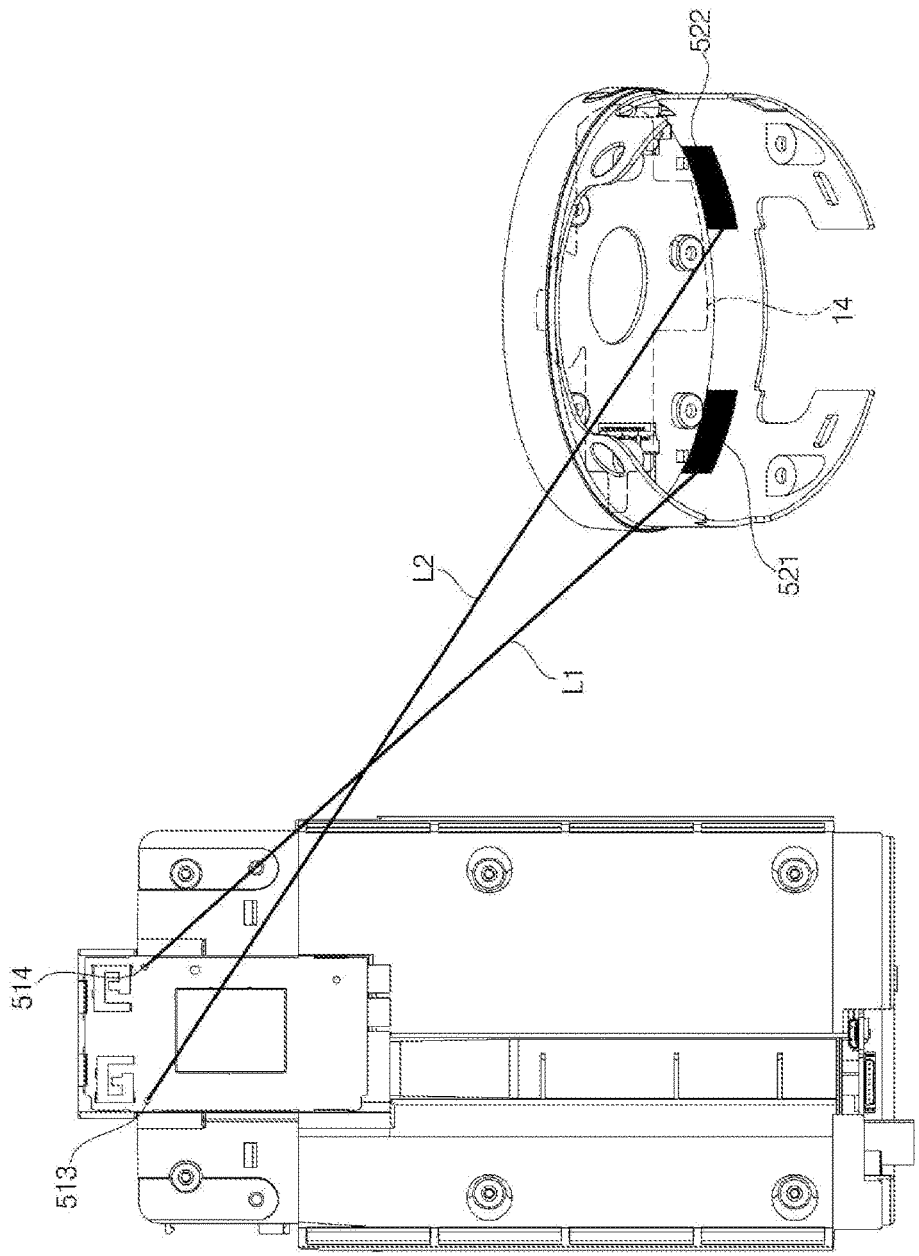
FIG. 26 is a view illustrating the positions of antennas connected to a Wi-Fi module.
Figure 27:
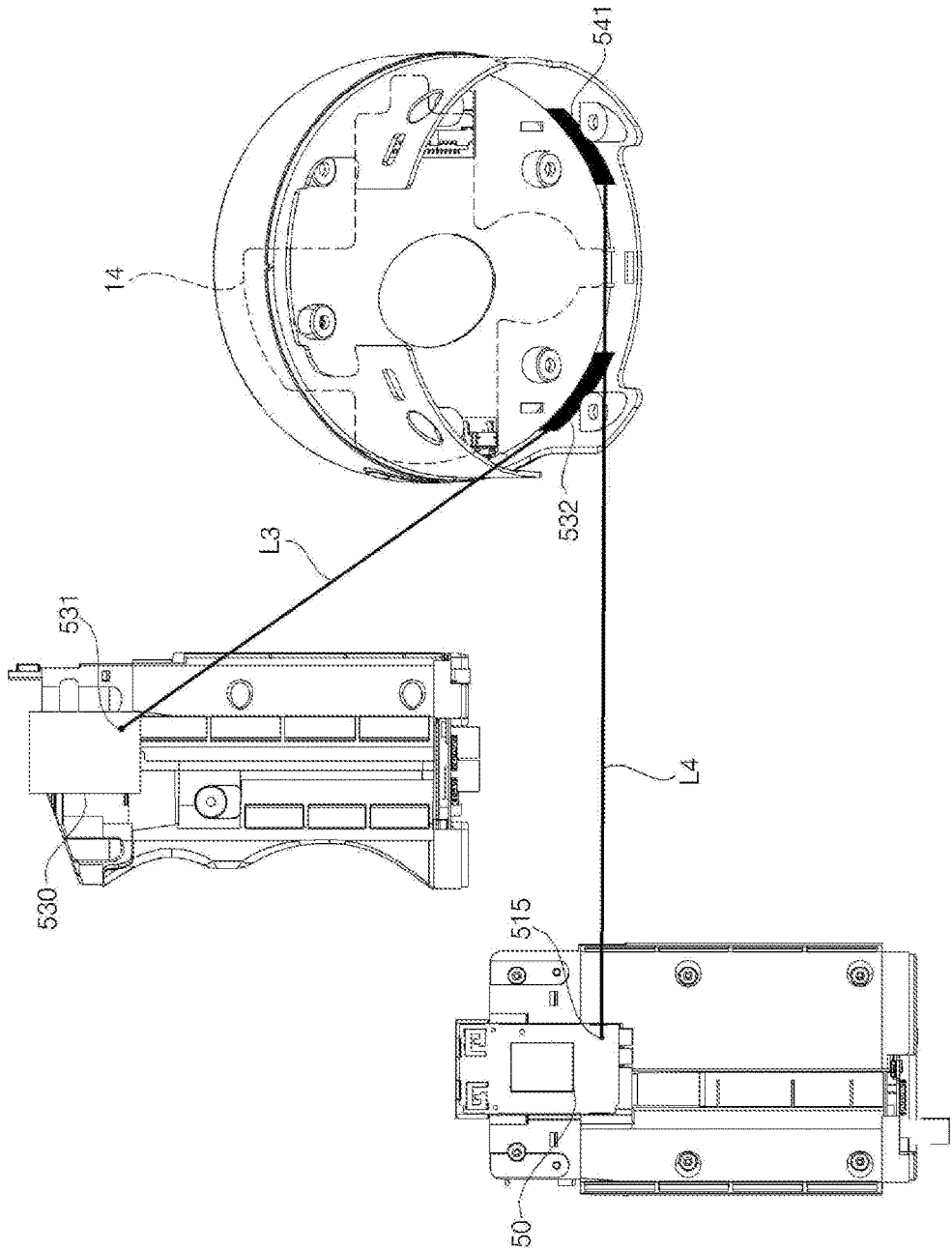
FIG. 27 is a view illustrating the position an antenna connected to a Bluetooth module and the position of an antenna connected to a ZigBee module.

The module assembly 510 may include a pair of antennas 511a and 511b for transmitting and receiving signals. In other example, the module assembly 510 may be coupled by a wire or cable to one or more of the antennas 521 or 522 (see FIGS. 25 to 27) positioned apart from the module assembly 510.

The module assembly 510 may include a first antenna-connection terminal 513 and a second antenna-connection terminal 514 of the Wi-Fi module 50a, and an antenna-connection terminal 515 of the Bluetooth module 50b. In addition, a first antenna 521 and a second antenna 522 may be located at the rear left and right positions on the inner surface of the sidewall 151 of the cover housing 15. The first antenna 521 may be connected to the first antenna-connection terminal 513 via a conductive line L1, and the second antenna 522 may be connected to the second antenna-connection terminal 514 via a conductive line L2.

Each of the first antenna 521 and the second antenna 522 may be formed by coupling a conductor having a predetermined pattern to a thin film, and a conductive line L1 or L2 may be connected to the conductor. Each of the first antenna 521 and the second antenna 522 may be attached to the sidewall 151 of the cover housing 15 by a piece of double-sided tape or other connecting method.

As previously described, at least a portion of the sidewall 151 of the cover housing 15 may be externally exposed and located above the grille 20 and, thus, is not surrounded by the grille 20. Therefore, the first antenna 521 and the second antenna 522 may be attached to a portion of the sidewall 151 extending above the grille 20. Signal interference caused by the metal grille 20 may be reduced through this positioning to enable more accurate transmission and reception of signals.

In addition, the sidewall 151 may be shaped so that a distance between the upper end thereof and the partition 152 gradually increases away from the front end of the hub 1. In this configuration, the rear portion of the sidewall 151 may be positioned further from the display PCB 14 (which is mounted on the partition 152) than the front portion of the sidewall 151. Accordingly, the first antenna 521 and the second antenna 522 may be spaced farther away from the display PCB 14 when positioned on the rear portion of the sidewall 151 to reduce signal interference caused by a magnetic field generated by current flowing in the circuit of the display PCB 14.

The ZigBee module 530 may be provided on one of the left and right sides of the main body 40, and a third antenna 532 may be connected to the antenna connection terminal 531 of the ZigBee module 530 via a conductive line L3. A fourth antenna 541 may be connected to the antenna connection terminal 515 of the Bluetooth module 50b via a conductive line L4 and may be positioned on the inner surface of the front portion of the sidewall 151 of the cover housing 15. Each of the third antenna 532 and the fourth antenna 541 is formed by coupling a conductor having a predetermined pattern to a thin film, and the conductive line L3 or L4 may be connected to the conductor. Each of the third antenna 532 and the fourth antenna 541 may be attached to the sidewall 151 of the cover housing 15 by a piece of double-sided tape or other connection method.

Figure 28:
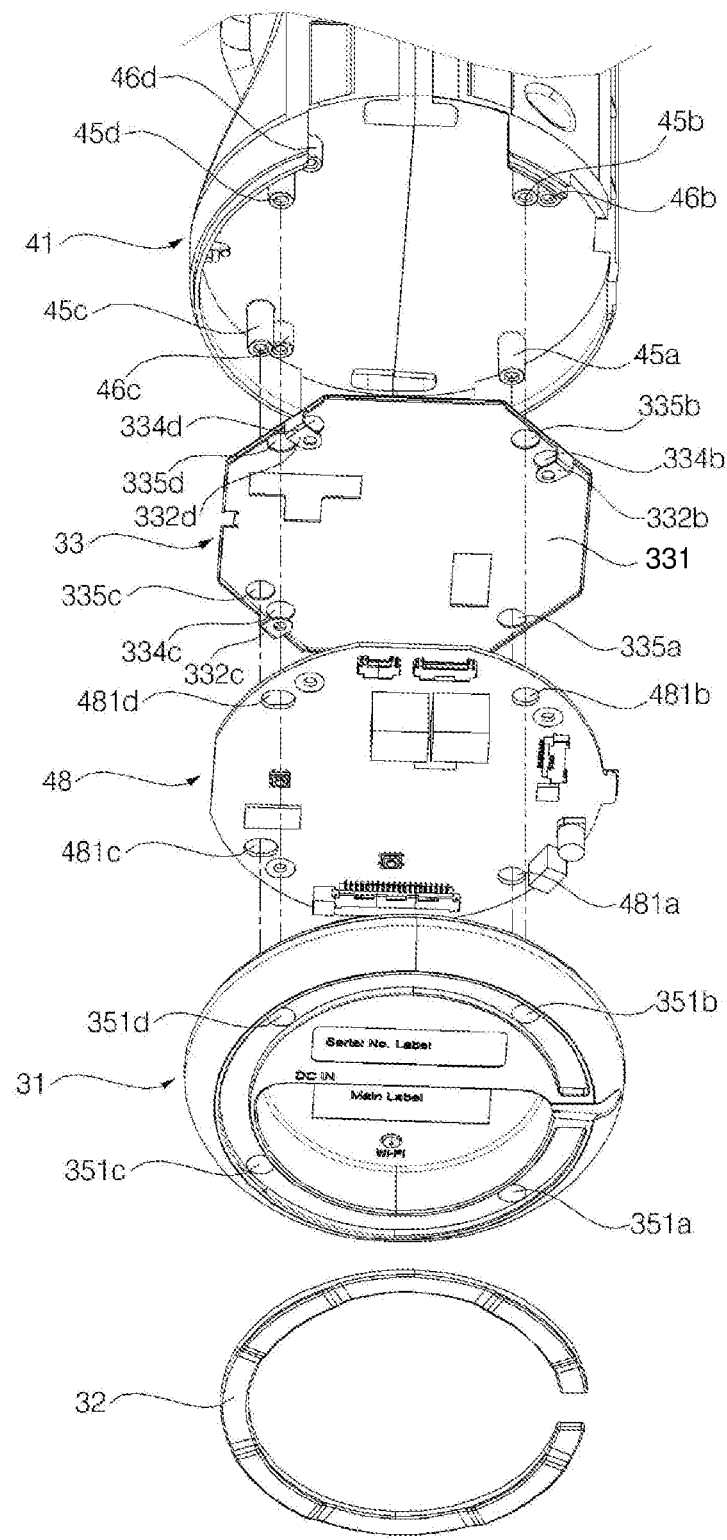
FIG. 28 is an exploded perspective view of the main body, a radiator, a main PCB, a base body, and a support rubber.
Figure 29:
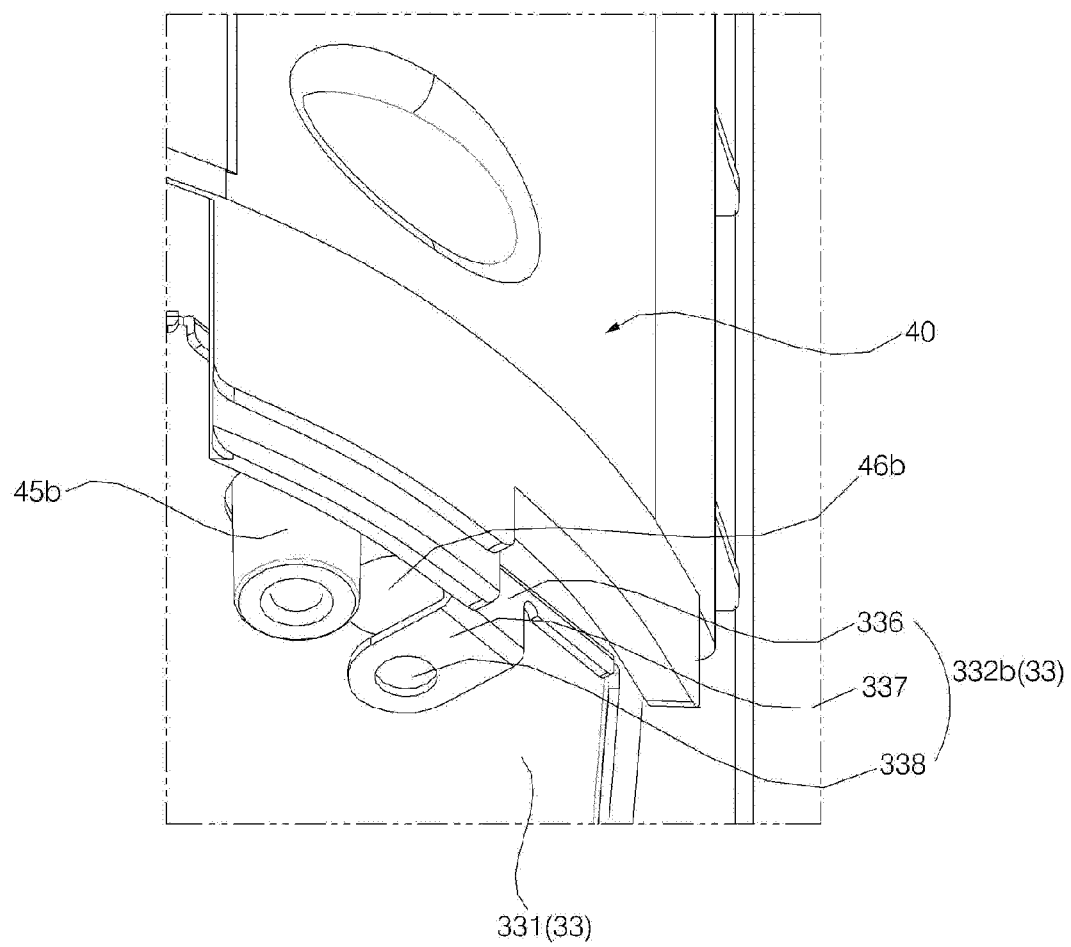
FIG. 29 is an enlarged perspective view illustrating a support tap of the radiator.
Figure 30:
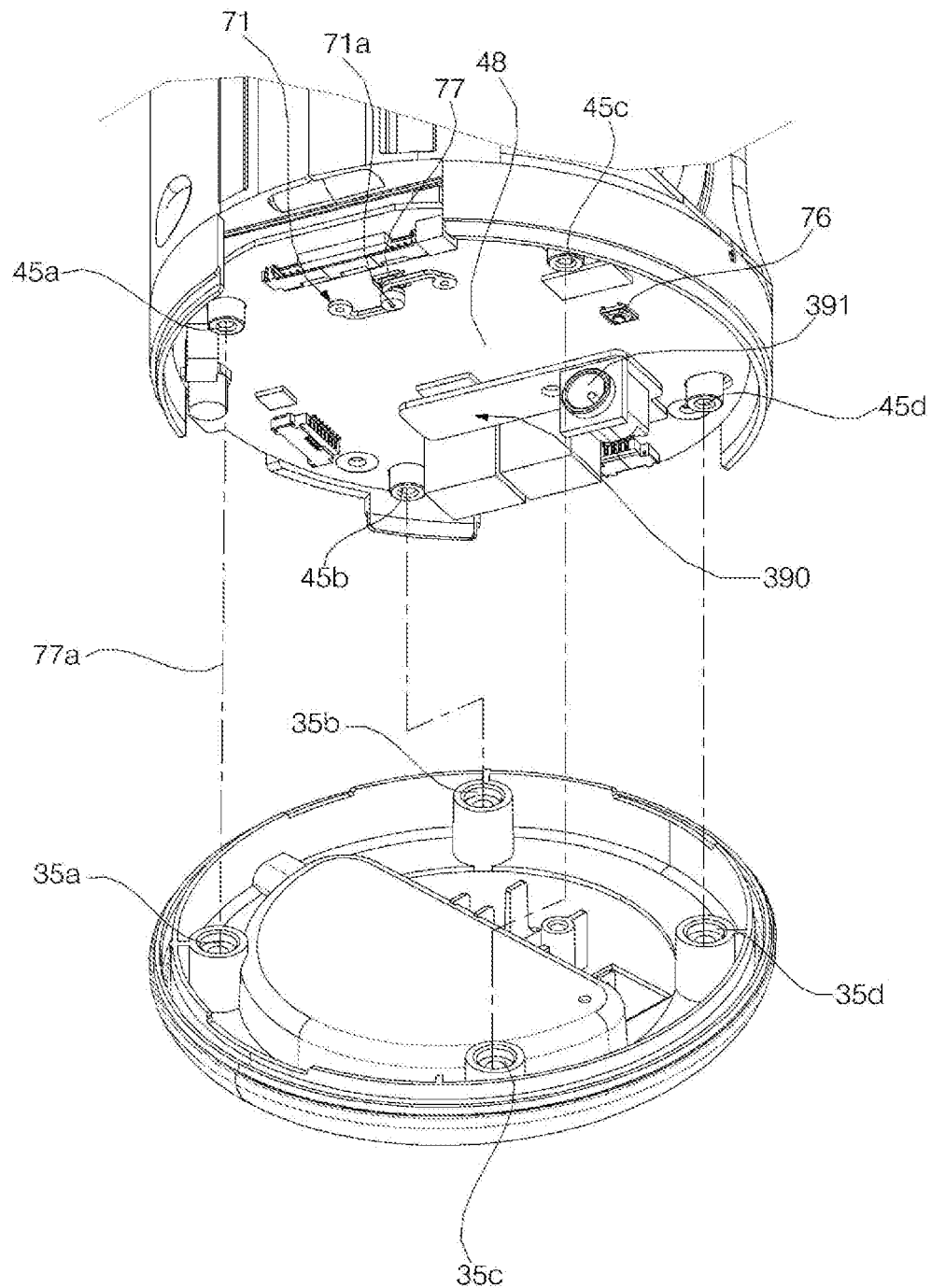
FIG. 30 is a view illustrating the coupling structure of the main body and a base.
Figure 31:
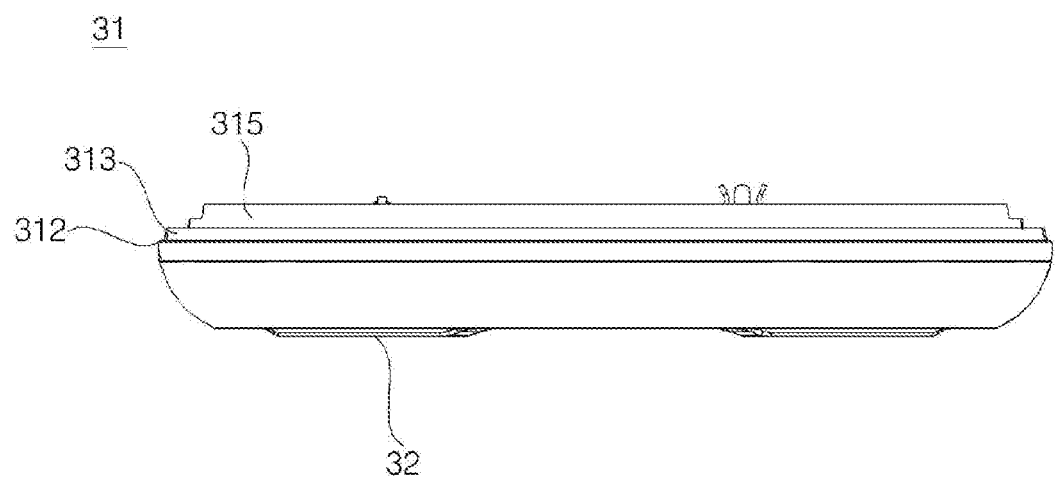
FIG. 31 is a front view of the base.

Referring to FIGS. 28 and 29, the main PCB 48 may be located in the space between the main body 40 and the base 30. The main PCB 49 may control the general operations of the hub 1. For example, the controller (or processor) 82, a USB port 62, a data transmission port 64, various switches 76 and 77, and a receptacle 390 may be mounted on the main PCB 48. The main PCB 48 may be electrically connected to various electric devices, such as the communication modules 50a and 530, the display PCB 14, the tweeter 43, and the woofer 44.

A radiator 33 may be placed between the main PCB 48 and the main body 40. The radiator 33 may dissipate heat, discharged upward from the main PCB 48 to an upper space (i.e. the space between the lower surface of the main body 40 and the radiator 33).

A plurality of fastening bosses 45a, 45b, 45c and 45d may extend from the lower surface of the main body 40. The first fastening boss 45a and the second fastening boss 45b may extend from the lower surface of the rear case 42, and the third fastening boss 45c and the fourth fastening boss 45d may extend from the lower surface of the front case 41. The fastening bosses 45a, 45b, 45c and 45d may be coupled to the base 30. The fastening bosses 45a, 45b, 45c and 45d may be formed respectively in four quadrants in the lower surface of the main body 40.

The base 30 may be provided with insertion bosses 35a, 35b, 35c and 35d at positions respectively corresponding to the fastening bosses 45a, 45b, 45c and 45d. The fastening bosses 45a, 45b, 45c and 45d may be inserted into the respective insertion bosses 35a, 35b, 35c and 35d, and then may be fastened to bolts or other connectors, which pass upward through the respective insertion bosses 35a, 35b, 35c and 35d.

A plurality of radiator coupling bosses 46b, 46c and 46d may protrude from the lower surface of the main body 40. The radiator support bosses 46b, 46c and 46d may be positioned close to the fastening bosses 45a, 45b, 45c and 45d. Although the radiator support bosses 46b, 46c and 46d, in the exemplary embodiment, may be formed in three of the four quadrants the lower surface of the main body 40, the quantity and the positioning of the radiator support bosses 46a, 46b, 46c and 46d is not limited thereto.

The radiator 33 may be formed as from planar metal plate or sheet and may include aluminum, stainless steel, or other metal materials. The radiator 33 may include a horizontal flat portion 331 and a plurality of support tabs 332b, 332c and 332d extending from the periphery of the flat portion 331.

The flat portion 331 may include through-holes 335a, 335b, 335c and 335d (hereinafter referred to as "fastening-boss through-holes") for the passage of the fastening bosses 45a, 45b, 45c and 45d. The flat portion 331 may also include through-holes 334b, 334c and 334d for the passage of the support bosses 46b, 46c and 46d (hereinafter referred to as "support-boss through-holes").

Referring to FIG. 29, the support bosses 46b, 46c and 46d may be coupled respectively to the support tabs 332b, 332c and 332d at the upper side of the main PCB 48. Each of the support tabs 332b, 332c and 332d may include a vertical portion 336 extending downward from the flat portion 331, and a horizontal portion 337 horizontally bent from the vertical portion 336. The horizontal portion 337 of each support tab 332b, 332c and 332d may be provided with a fastening hole 338 for the passage of a bolt (or other connector). For example, the bolt may pass upward through the fastening hole 338 and fasten to one of the support bosses 46b, 46c and 46d.

When the support bosses 46b, 46c and 46d are fastened to the support tabs 332b, 332c and 332d, the flat portion 331 may be spaced apart from the lower surface of the main body 40 located thereabove. The flat portion 331 may be also spaced apart from the main PCB 48 located therebelow. Because the flat portion 331 is spaced apart from the lower surface of the main body 40, the flat portion 331 does not vibrate or generate noise when the main body 40 vibrates due to the output of the speakers 43 and 44.

The main PCB 48 may have through-holes 481a, 481b, 481c and 481d at positions respectively corresponding to the through-holes 335a, 335b, 335c and 335d of the radiator 33. The fastening bosses 45a, 45b, 45c and 45d may be longer than the support bosses 46b, 46c and 46d, and may respectively pass through the through-holes 335a, 335b, 335c and 335d of the radiator 33 and the through-holes 481a, 481b, 481c and 481d of the main PCB 48 to thereby be inserted into the insertion bosses 35a, 35b, 35c and 35d of the base 30.

Referring to FIGS. 28 to 34, the base 30 may include a base body 31 having an open upper surface and defining a predetermined space therein. The insertion bosses 35a, 35b, 35c and 35d may protrude upward from the inner surface of the base body 31. A base bottom portion 310 of the base body 31 may include fastening holes 351a, 351b, 351c and 351d, which are positioned to communicate with (i.e., provide a path to) the insertion bosses 35a, 35b, 35c and 35d.

When the main body 40 and the radiator 33 are coupled together, the fastening bosses 45a, 45b, 45c and 45d may pass through the fastening-boss through-holes 481a, 481b, 481c and 481d formed in the main PCB 48. Then, respective fastening bosses 45a, 45b, 45c and 45d may be inserted into the insertion bosses 35a, 35b, 35c and 35d formed in the base 30. Thereafter, bolts or other connectors may be inserted into the fastening holes 351a, 351b, 351c and 351 from the bottom side of the base 30 and fastened to the fastening bosses 45a, 45b, 45c and 45d inside the insertion bosses 35a, 35b, 35c and 35d to couple the base 30 to the body 40.

The base body 31 may include a support rubber (or pad) 32 fixed to the lower surface of the base body 31. The hub 1 may have a relatively small size to allow the user to position the hub 1 on a surface, such as a table or a shelf. The support rubber 32 may be positioned provided underneath the base body 31. The support rubber 32 may be formed from rubber, plastic, or other deformable material and may cause friction against the surface to deter an unintended movement of the hub 1.

A rubber insertion groove 318 may be formed in the base bottom portion 310 of the base 30. The rubber insertion groove 318 may extend along the predetermined circumference of the base bottom portion 310. The rubber insertion groove 318 may take the form of an arc, which extends from one end 318a to the other end 318b at a constant curvature, and the fastening holes 351a, 351b, 351c and 351d may be located in the rubber insertion groove 318. The support rubber 32 is inserted into the rubber insertion groove 318. The upper surface of the support rubber 32 may be attached to the bottom of the rubber insertion groove 318 by a piece of double-sided tape or other connection method. In another example, the support rubber 32 may be friction fitted within the rubber insertion groove 318.

The support rubber 32 may include a rubber main body 321 that extends in a long length corresponding to a length of the rubber insertion groove 318. Support protrusions 322 may extend down from the rubber main body 321 and toward the outside of the rubber insertion groove 318. When the support bosses 322 are placed on a floor or other surface, the hub 1 may be positioned upright (i.e., such that the base 30 contacts the surface), and the base body 31 may be spaced apart from the surface by a distance corresponding to a protrusion height of the support protrusions 322.

The support protrusions 322 may be spaced along of the rubber main body 321. For example, the support protrusions 322 may be symmetrically located about the center of the base bottom portion 310 of the base body 31. Although four support protrusions 322 are positioned at an interval of 90 degrees in the exemplary embodiment shown in FIG. 36, the number of support protrusions 322 and the spacing of the support protrusions 322 are not limited thereto.

The base body 31 may include a base outer wall portion 311 extending upward from the periphery of the base bottom portion 310. The outer diameter of a lower portion of base outer wall portion 311 may be smaller than the outer diameter of the lower end of the grille 20. The outer diameter of the base outer wall portion 311 may gradually increase upward such that the outer diameter of the upper end of the base outer wall portion 311 may substantially correspond to the outer diameter of the lower end of the grille 20, such that a smooth transmission is formed at intersection of the base outer wall portion 311 and the grille 20.

The base body 31 may include a lower-end holding portion 313 extending upward from the base outer wall portion 311 so as to be coupled to the grille 20. The lower-end holding portion 313 may be inserted (or fitted) into an opening formed in the lower end of the grille 20. In this way, an interior surface at the lower end of the grille 20 may be interference-fitted to an exterior surface of the lower-end holding portion 313 using the elasticity or the restoring force of the grille 20 or the lower-end holding portion 313. Thus, the lower-end holding portion 313 and the grille 20 may be coupled without using fastening members, such as bolts.

Figure 32:
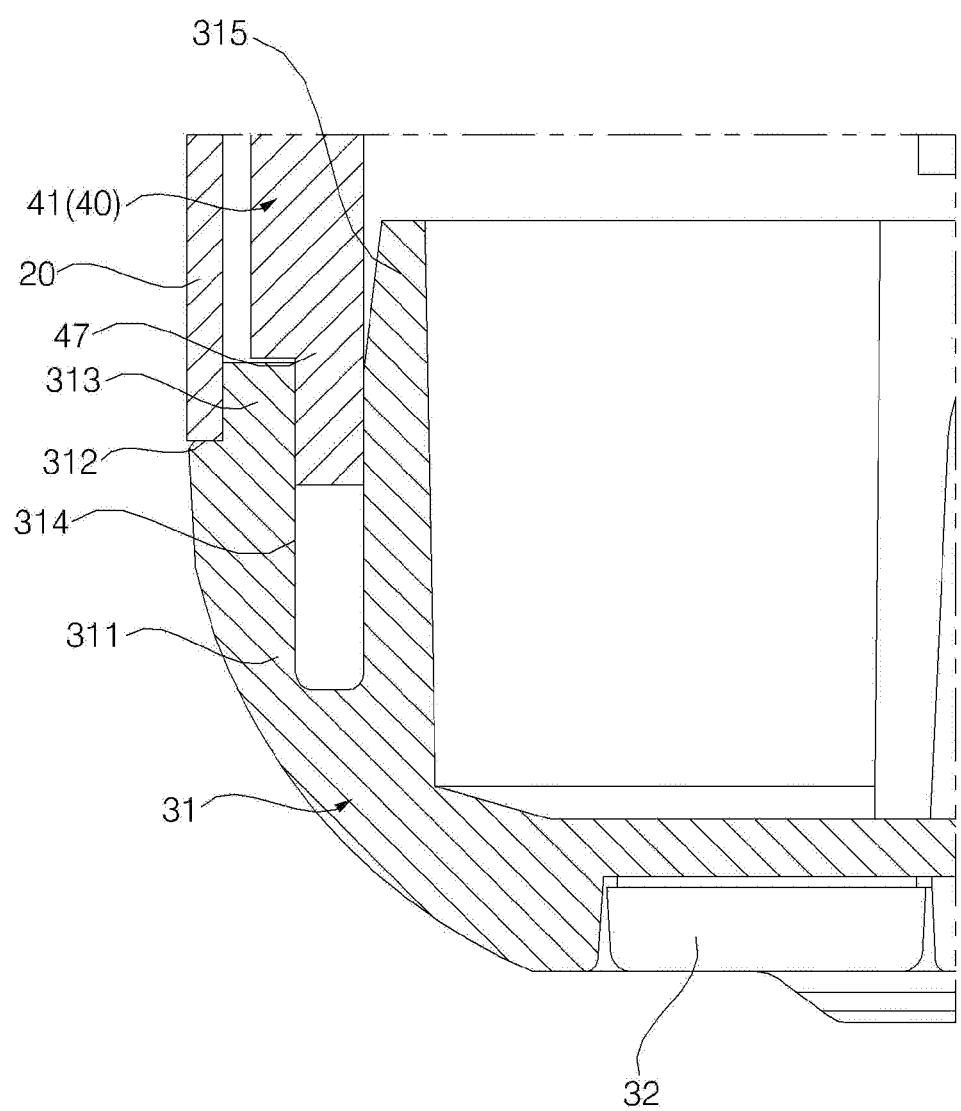
FIG. 32 is a sectional view illustrating the coupling structure of the main body, the grille, and a speaker case.
Figure 33:
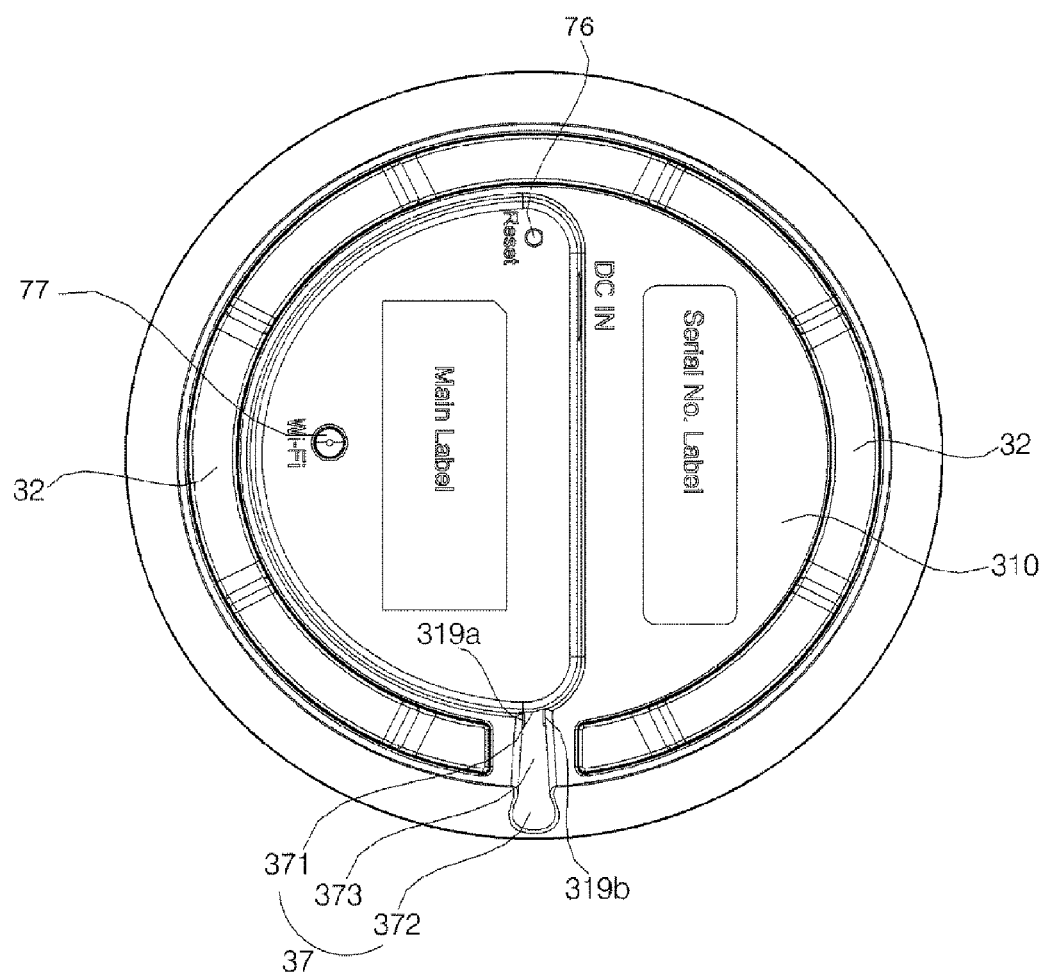
FIG. 33 is a view illustrating the lower surface of the base.
Figure 34:
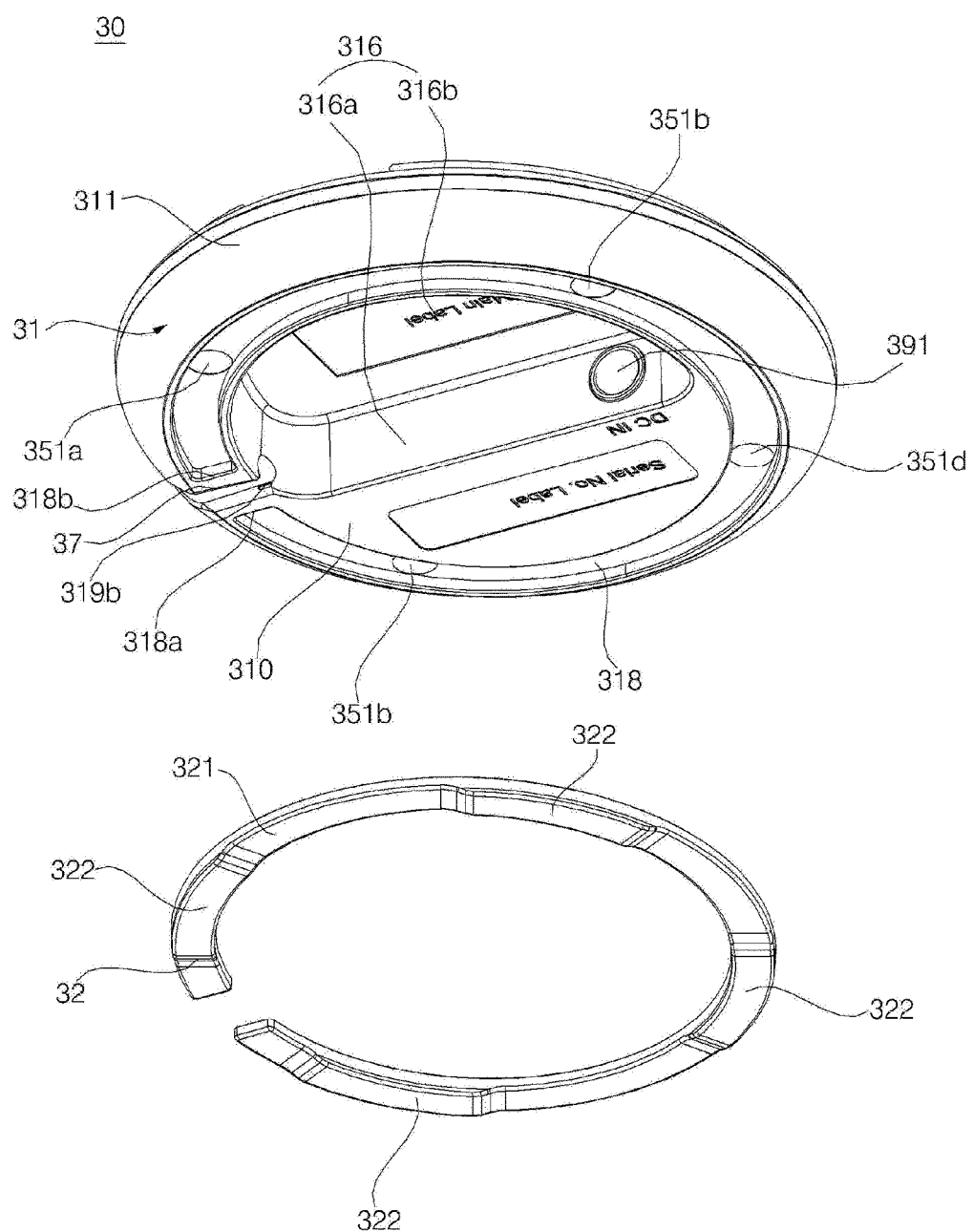
FIG. 34 is an exploded perspective view of the base.

Referring to FIG. 32, the lower-end holding portion 313 may be located inside the upper end of the base outer wall portion 311 such that the outer surface of the base body 31 is indented from the upper end of the outer wall portion 311 to form the outer surface of the lower-end holding portion 313. The upper end of the outer wall portion 311 may include a surface 312, which extends from the outer surface of the outer wall portion 311 to the lower-end holding portion 313 and faces the lower end of the grille 20. The lower end of the grille 20 may be placed on the surface 312. The surface 312 may be formed on the upper end of the base outer wall portion 311 to have a shape corresponding to the lower end of the grille 20, and the width of the surface 312 may substantially correspond to the thickness of the grille 20.

The outer surface of the lower-end holding portion 313 may contact the inner surface of the grille 20 such that the lower-end holding portion 313 supports the lower end of the grille 20. For example, when the grille 20 is formed of a metal material, the grille 20 may be deformed so as to correspond in shape to the shape of the lower-end holding portion 313. Therefore, the lower end of the grille 20 may remain in the shape corresponding to the lower-end holding portion 313 even if pressure (e.g., a user's grip) is applied to the exterior surface of a lower portion of grille 20.

The grille 20 may be formed as a cylinder by rolling a metal panel to have a circular cross-sectional shape. If the lower-end holding portion 313 extends in an elliptical form along the upper end of the outer wall portion 311, the cylindrical grille 20 may be deformed in an elliptical shape so as to correspond to the shape of the lower-end holding portion 313 when the lower end of the grille 20 is fitted onto the lower-end holding portion 313. Furthermore, the grille 20 may remain in the deformed shape while coupled to the lower-end holding portion 313.

The base bottom portion 310 of the base body 31 may have a recess 316. The recess 316 may be surrounded by the rubber insertion groove 318. The recess 316 may include a recess side portion 316a extending upward from the periphery of an opening formed in the bottom surface, and a recess bottom portion 316b extending horizontally from the recess side portion 316a so as to form the bottom of the recess 316 (i.e., when the hub 1 is positioned upside down such that a user is viewing the bottom surface of the base 30).

Although not illustrated, the hub 1 may include an adaptor for receiving external commercial alternating current (AC) power, converting the AC power to DC power, and supplying the DC power for the operation of the hub 1. The adaptor may be accommodated in the recess 316, and an output terminal for the adapter may be connected by a cord to a socket 391 in the recess side portion 316a. A receptacle 390 associated with the socket 391 may be located on the lower surface of the main PCB 48. The receptacle 390 may electrically connect the socket 391 to the main PCB 48 such that power is provided by the adapter to the main PCB 48.

A cord-fixing groove 37 may be formed in the base body 31. The cord-fixing groove 37 may be formed between both the ends 318a and 318b of the rubber insertion groove 318. The cord-fixing groove 37 extends from an inner opening 371 formed in the recess side portion 316a to an outer opening 372 formed in the base outer wall portion 311. The cord-fixing groove 37 may further include a cord insertion slot 373, which is formed in the lower surface of the base bottom portion 310 and extends to connect the inner opening 371 and the outer opening 372. The cord-fixing groove 37 may have an inner diameter which is greater than a width of the cord insertion hole 373. Because the cord typically has an outer coating that is somewhat elastic, the cord may be slightly deformed to pass through the cord insertion hole 373. Once the cord has been inserted into the cord-fixing groove 37, the cord returns to an original shape thereof and is held within the cord-fixing groove 37 by the cord insertion hole 373. In one example, the outer opening 372 may be greater in diameter than the inner opening 371, and the cross section of the cord-fixing groove 37 may gradually decrease in size between the outer opening 372 and the inner opening 371.

Insertion-hole-reducing protrusions 319a and 319b may be formed on the inner surface of the cord-fixing groove 37. The insertion-hole-reducing protrusions 319a and 319b may be formed on at least one of opposite portions defining the cord insertion hole 373. Because the width of the cord insertion hole 373 may be reduced in the portion in which the insertion-hole-reducing protrusions 319a and 319b are formed, the insertion-hole-reducing protrusions 319a and 319b help to prevent the cord from being separated from the cord-fixing groove 37.

A Wi-Fi reset switch 77 may be provided on the lower surface of the main PCB 48. The Wi-Fi reset switch 77 may be configured as a contact switch and may be exposed through the aperture formed in the base bottom portion 310 within the recess 316. When the Wi-Fi reset switch 77 is pushed, the controller 82 may initialize (reset) the Wi-Fi module 50a.

A hub reset switch 76 may be located on the lower surface of the main PCB 48. The hub reset switch 76 may be configured as a contact switch, and may be exposed through the aperture formed in the base bottom portion 310 within the recess 316. When the hub reset switch 76 is pushed, the controller 82 may be reinitialized or reset.

The hub (or a sound output apparatus) of the present disclosure provides an interface screen that displays information exchanged via a communication module, which wirelessly communicates with surrounding devices, thereby making it easy to manage various kinds of surrounding devices and easily perceive information acquired from an IoT device. As the interface screen is displayed on an upper surface of the hub, visibility improves, and such visibility may further improve when the interface screen is arranged to be inclined.

In addition, it is possible to manage an electronic appliance by, for example, sensing the state of the electronic appliance or controlling the operation of the electronic appliance using the function provided by an accessory, which is separate from the electronic appliance, via communication with the accessory. In particular, even if the kind of the accessory or the electronic appliance is changed, the hub may be applied to the changed appliance when the configuration of the interface thereof is changed, which results in increased versatility and expanded use range of the hub.

In addition, an interface screen is provided, which displays information exchanged via a communication module performing wireless communication with surrounding devices, thereby enabling management of various kinds of the surrounding devices and allowing easy understanding of information acquired from appliance in the Internet of Things.

In addition, because a window, which is placed on the upper surface of the hub to expose the screen, functions as a button for manipulating the interface, the hub may realize a simple external appearance without buttons.

In addition, specific areas on the window, to which a display screen output from the interface is projected, may function as buttons for manipulating the interface, which enables more intuitive manipulation of the interface. For example, four areas on the window surrounding the region from which the interface screen is exposed, namely to the front and rear and the left and right thereof, may function as buttons, and thus a menu item displayed on the interface may be scrolled in four directions or the selection of menus items in the respective directions may be easily performed.

In addition, the respective areas on the window, which function as buttons, have uniform manipulation performance. Here, "uniform manipulation performance" means that contact switches corresponding to the respective areas are accurately operated when the respective areas are pushed.

The present disclosure provides a hub (or a sound output apparatus), which displays a screen for outputting information received from or transmitted to surrounding devices via a communication module, which wirelessly communicates with the appliances. In particular, the present disclosure provides an interface screen that may allow a user to easily recognize information, which is received from and/or transmitted to other IoT devices, and that may control the appliance with the IoT device.

The present disclosure provides a hub which locates the interface at a position that is optimized in consideration of visibility. The present disclosure provides a hub which is capable of communicating with an accessory via a communication module, to set the function of the accessory, and to manage a home network based on information received from the accessory.

The present disclosure provides a hub which is capable of managing an electronic appliance by, for example, sensing the state of the electronic appliance or controlling the operation of the electronic appliance using the function provided by an accessory, which is separate from the electronic appliance, via communication with the accessory.

The present disclosure provides a hub in which a display for outputting an interface screen and a window for showing the screen of the display are installed on a cover coupled to the top of a main body, wherein a user is able to manipulate the interface by pushing the window. The main body is provided with a communication module for wirelessly communicating with surrounding devices, and the interface screen displays information received from and transmitted to the surrounding devices via the communication module. In this way, the hub may allow the user to easily check information transmitted to and received from various appliances, such as appliances in the Internet of Things, which has recently received attention, via mutual communication, and which may allow the user to control the appliances by manipulating the interface via a simplified motion of pushing preset portions of the window.

The present application further provides a hub, in which a display PCB, on which a display is mounted, is provided in a cover and at least one contact switch used for various purposes, for example manipulation of an interface displayed on a screen and manipulation of playback of a speaker, is arranged on the display PCB, and in which a window support plate for supporting a window is placed inside the cover, and the window support plate operates the contact switch responsive to a pressure applied on the window support plate through the window.

The window support may include a window support plate provided with an opening and arranged on an upper surface of the window support plate. The window support plate is supported by a plurality of support bosses and is provided on the lower surface thereof with manipulation protrusions at positions corresponding to the respective contact switches, whereby the window support plate is bent about the portion thereof supported by the support bosses when a given portion of the window is pressed, causing the manipulation protrusions to press the contact switches. In this structure, a user will operate the contact switches by selectively pushing four areas on the window corresponding respectively to the contact switches. That is, the window functions as a button for operating the contact switches, and the present disclosure enables the four areas to accurately perform the function described above.

The present disclosure also provides a hub, in which a window support plate is provided with support bosses at appropriate positions so that areas on the window support plate (each area being provided with a manipulation protrusion), corresponding respectively to the contact switches, may be smoothly bent about the support bosses.

The present disclosure provides a hub, in which a window support plate is centrally provided with an opening for allowing a display screen to be seen from the top side, and in which a display panel normally has a rectangular shape having a horizontal length longer than a vertical length thereof and is horizontally arranged along the left-to-right direction of the sound output apparatus. The opening in the window support plate also has a shape corresponding to the shape of the display panel so that the horizontal length (or the left-to-right length) thereof is longer than the vertical length (or the front-to-rear length) thereof. In this case, manipulation protrusions are provided on front and rear areas and left and right areas of the window support plate about the opening. Because the opening has a left-to-right length longer than a front-to-rear length thereof, among the four areas of the window support plate, the front and rear areas have different widths from the left and right areas, which causes the distances between the support bosses and the manipulation protrusions to be different in the respective areas depending on the area in which the support bosses are formed. Therefore, aspects of the present disclosure eliminate this difference.

In one general aspect of the present disclosure, a hub (or a sound output apparatus) includes a communication module arranged in a main body thereof, wherein the hub wirelessly communicates via the communication module with a surrounding device (for example, a Internet of Thing (IoT) device having a sensor) and a screen is displayed on the upper surface of the hub based on information exchanged via the communication module. The main body may include a speaker so that the hub functions as a sound output means.

To allow sound, output from the speaker, to be discharged, the main body may be arranged in a cylindrical grille having a plurality of through-holes formed therein, and the grille may have an upper end of coupled to a cover, which displays the screen, and a lower end coupled to a base.

The coupling of the grille and the cover is not realized using separate fastening members, such as bolts, but is realized in such a manner that an rib-type upper-end holding portion, which is formed in the base, is inserted (or fitted) into an opening formed in the upper end of the grille. The coupling of the grille and the base is realized in a manner that a rib-type lower-end holding portion, which is formed in the base, is inserted into an opening defined by the lower end of the grille.

The grille may be formed by processing a metal panel. The upper-end holding portion and the lower-end holding portion may come into close contact with the inner surface of the grille, and thus, the upper end of the grille of the metal panel is deformed to correspond to the shape of the upper-end holding portion, and the lower end of the grille is deformed to correspond to the shape of the lower-end holding portion. That is, each of the upper-end holding portion and the lower-end holding portion may be formed in an appropriate shape to thereby form the grille in a desired shape, and, in this manner, the grille may is maintained with a cylindrical cross section.

The cover may be coupled to the main body, and include a cover housing having an opening, the cover housing is formed on the upper surface of the cover, and a display for showing the interface screen may be arranged in the cover housing. In addition, a transparent window is arranged in the opening so that the interface screen is visible through the window.

The cover housing may include a display PCB arranged below the display to support the display. Contact switches for manipulating the interfaces are arranged on the upper surface of the display PCT, and the contact switches are symmetrically arranged in front, rear, left, and right areas.

The cover housing may further include a window support arranged below the window to support the window. Apart from supporting the window, the window support function as a button for selectively operating the contact switches. Specifically, the window support may include: a window support, which is arranged above the display to support the window and has an opening for exposing a screen of the display, and a support boss, which protrudes downward from the window support and is coupled to the cover housing.

The window support is in close contact with the window, and, once an area of the window corresponding to the contact switch is pressed, the window support plate is slightly bent about the support boss so that a protrusion which protrudes downward from the window support plate operates a contact switch at a corresponding location.

The cover housing may include a cylindrical sidewall, and the inside of the sidewall is divided by a partition into upper and lower regions. In addition, the partition may include an insertion boss into which a support boss protruding from the window support plate is inserted.

The window support plate may include an opening formed thereon, the opening which exposes a screen of the display provided below the window support. To correspond to a shape of a general display panel, the opening of the window support plate may be formed in a manner that a length of a front-to-rear direction is longer than a length of a left-to-right direction. In this case, the support boss may be formed in an area in front of the opening of the window support plate, and in an area at rear of the opening of the window support plate.

The present disclosure may provide a hub comprising: a main body including a communication circuitry configured to wirelessly communicate with another device; a cover housing coupled to a top of the main body, the cover housing including a tubular sidewall that extends in a vertical direction and a partition extending from an inner surface of the sidewall to divide an inside of the sidewall into upper and lower regions; a display Printed Circuit Board (PCB) positioned on an upper surface of the partition, the display PCB having at least one contact switch; a display panel positioned above the display PCB and configured to output a screen; a window support positioned over the display panel and having an opening exposing at least a section of the screen; and a window formed of a transparent material, the window positioned over the window support, wherein the window support includes: a window support plate defining the opening, the window being positioned on an upper surface of the window support plate; at least one manipulation protrusion extending downward from the window support plate at a position corresponding to the contact switch, the manipulation protrusion operating the contact switch in response to pressure applied to the support plate through the window; and a plurality of support bosses extending downward from the window support plate and coupled to the partition to space the window support plate apart from the display PCB.

The present disclosure may also provide a hub comprising: a main body including a communication circuitry to wirelessly communicate with another device; a cover housing coupled to a top area of the main body, the cover housing including a tubular sidewall that extends in a vertical direction and a partition extending from an inner surface of the sidewall for dividing an inside of the sidewall into upper and lower regions; a display PCB positioned over an upper surface of the partition, the display PCB having at least one contact switch; a display panel positioned over an upper surface of the display PCB, the display panel being configured to output a screen, the screen having a long side in a left-to-right direction and a short side in a front-to-rear direction; a window support positioned over the display panel in the cover housing, the window support having an opening exposing at least a portion of the screen, the opening having a longer left-to-right length than a front-to-rear length; and a window positioned over opening, wherein the window support includes: a circular window support plate defining the opening, the window being positioned over the window support plate; a plurality of support bosses extending downward from the window support plate and coupled to the partition to space the window support plate from the display PCB; and at least one manipulation protrusion extending downward from the window support plate at a position corresponding to the contact switch, the manipulation protrusion selecting activating the contact switch when the window support plate is deformed by pressure applied to the support plate through the window, wherein the support bosses are formed in at least one of an area located at a rear side of the opening in the window support plate and an area located at a front side of the opening.

The present disclosure may further provide a hub comprising: a main body including a communication circuitry to wirelessly communicate with a surrounding device; a cover housing coupled to a top of the main body, the cover housing including a tubular sidewall that extends in a vertical direction and a partition extending from an inner surface of the sidewall to divide an inside of the sidewall into upper and lower regions; a display printed circuit board (PCB) positioned over an upper surface of the partition, the display PCB having at least one contact switch; a display panel positioned over an upper surface of the display PCB, the display panel, the display panel having a long side and a short side; a window support positioned over the display panel in the cover housing, the window support having an opening to expose at least a portion of the display panel; and a window formed of a transparent material and covering the opening, wherein the window support includes: a window support plate defining the opening, the window being positioned on an upper surface of the window support plate; a plurality of support bosses extending downward from the window support plate and coupled to the partition to separate the window support plate from the display PCB; and at least one manipulation protrusion extending downward from the window support plate at a position corresponding to the contact switch, the manipulation protrusion selectively activating the contact switch when the window support plate is deformed by pressure applied to the support plate through the window, and wherein at least one of the support bosses passes through an area at a front side of the display panel and at least another one of the support bosses passes through an area at a rear side of the display panel.

Any reference in this specification to "one embodiment," "an embodiment," "example embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A hub comprising:
a main body including a communication circuitry configured to wirelessly communicate with another device;
a cover housing coupled to a top of the main body, the cover housing including a tubular sidewall that extends in a vertical direction and a partition extending from an inner surface of the sidewall to divide an inside of the sidewall into upper and lower regions;
a display Printed Circuit Board (PCB) positioned on an upper surface of the partition, the display PCB having at least one contact switch;
a display panel positioned above the display PCB and configured to output a screen;
a window support positioned over the display panel and having an opening exposing at least a section of the screen; and
a window formed of a transparent material, the window positioned over the window support,
wherein the window support includes:
a window support plate defining the opening, the window being positioned on an upper surface of the window support plate;
at least one manipulation protrusion extending downward from the window support plate at a position corresponding to the contact switch, the manipulation protrusion operating the contact switch in response to pressure applied to the support plate through the window; and
a plurality of support bosses extending downward from the window support plate and coupled to the partition to space the window support plate apart from the display PCB.

2. The hub according to claim 1, wherein the opening has a longer left-to-right length than a front-to-rear length, and
wherein at least one of the support bosses is formed in each of an area located at a rear side of the opening in the window support plate and an area located at a front side of the opening.

3. The hub according to claim 2, wherein the contact switch is provided in each of front, rear, left and right areas about the display panel, and
wherein the manipulation protrusion is formed at a position corresponding to each contact switch.

4. The hub according to claim 2, wherein each of the area at the rear side of the opening and the area at the front side of the opening is provided with a pair of the support bosses arranged in a left-to-right direction.

5. The hub according to claim 2, wherein the window support plate has a slit that is elongated in the left-to-right direction between the support bosses and the manipulation protrusion in at least one of the area at the rear side of the opening and the area at the front side of the opening.

6. The hub according to claim 1, wherein the window support plate has a circular shape, and
wherein the opening is formed in a center of the window support plate.

7. The hub according to claim 1, wherein the cover housing further includes an insertion boss extending downward from the partition at a position corresponding to one of the support bosses to receive the support boss.

8. The hub according to claim 7, further comprising a connector passing through a lower end of the insertion boss and fastened to the support boss.

9. The hub according to claim 1, wherein the window is formed of a synthetic resin and is attached to the window support plate.

10. The hub according to claim 1, wherein the window support plate is inclined upward from a front side to a rear side thereof at a predetermined angle relative to a horizontal plane.

11. The hub according to claim 10, wherein the support boss and the window support plate form a complementary angle with an angle between the window support plate and the horizontal plane.

12. The hub according to claim 1, wherein a first portion of the window is transparent in a first area corresponding to the opening in the window support plate, and a second portion of the window is opaque in second area corresponding to portions of the window support plate around the opening.

13. The hub according to claim 12, wherein an opaque or translucent film is attached to a lower surface of the second portion of the window.

14. The hub according to claim 1, wherein the at least one manipulation protrusion is included in a plurality of manipulation protrusions of window support, and wherein the manipulation protrusions are symmetrically arranged relative to the opening.

15. The hub according to claim 1, wherein the main body includes at least one speaker, and
wherein the hub further comprises a grille having a vertically elongated cylindrical shape and provided with a plurality of through-holes therein, the main body being arranged within the grille, the grille being coupled at an upper end thereof to the cover housing and coupled at a lower end thereof to the base.

16. The hub according to claim 1, further comprising a base configured to support the main body.

17. A hub comprising:
a main body including a communication circuitry to wirelessly communicate with another device;
a cover housing coupled to a top area of the main body, the cover housing including a tubular sidewall that extends in a vertical direction and a partition extending from an inner surface of the sidewall for dividing an inside of the sidewall into upper and lower regions;
a display PCB positioned over an upper surface of the partition, the display PCB having at least one contact switch;
a display panel positioned over an upper surface of the display PCB, the display panel being configured to output a screen, the screen having a long side in a left-to-right direction and a short side in a front-to-rear direction;
a window support positioned over the display panel in the cover housing, the window support having an opening exposing at least a portion of the screen, the opening having a longer left-to-right length than a front-to-rear length; and a window positioned over opening, wherein the window support includes:

a circular window support plate defining the opening, the window being positioned over the window support plate;

a plurality of support bosses extending downward from the window support plate and coupled to the partition to space the window support plate from the display PCB; and at least one manipulation protrusion extending downward from the window support plate at a position corresponding to the contact switch, the manipulation protrusion selecting activating the contact switch when the window support plate is deformed by pressure applied to the support plate through the window, wherein the support bosses are formed in at least one of an area located at a rear side of the opening in the window support plate and an area located at a front side of the opening.

18. The hub according to claim 17, wherein the window support plate includes a slit that is elongated in the left-to-right direction between the support bosses and the manipulation protrusion in at least one of the rear side of the opening or the front side of the opening.

19. A hub comprising:

a main body including communication circuitry to wirelessly communicate with a surrounding device;

a cover housing coupled to a top of the main body, the cover housing including a tubular sidewall that extends in a vertical direction and a partition extending from an inner surface of the sidewall to divide an inside of the sidewall into upper and lower regions;

a display printed circuit board (PCB) positioned over an upper surface of the partition, the display PCB having at least one contact switch;

a display panel positioned over an upper surface of the display PCB, the display panel, the display panel having a long side and a short side;

a window support positioned over the display panel in the cover housing, the window support having an opening to expose at least a portion of the display panel; and a window formed of a transparent material and covering the opening, wherein the window support includes:

a window support plate defining the opening, the window being positioned on an upper surface of the window support plate;

a plurality of support bosses extending downward from the window support plate and coupled to the partition to separate the window support plate from the display PCB; and at least one manipulation protrusion extending downward from the window support plate at a position corresponding to the contact switch, the manipulation protrusion selectively activating the contact switch when the window support plate is deformed by pressure applied to the support plate through the window, and wherein at least one of the support bosses passes through an area at a front side of the display panel and at least another one of the support bosses passes through an area at a rear side of the display panel.

20. The hub according to claim 19, wherein the window support plate includes a slit that is elongated between the support bosses and the manipulation protrusion.

* * * * *

UNITED STATES PATENT AND TRADEMARK OFFICE
CERTIFICATE OF CORRECTION

PATENT NO. : 9,990,002 B2
APPLICATION NO. : 15/605265
DATED : June 5, 2018
INVENTOR(S) : Sangin Kim Page 1 of 1

It is certified that error appears in the above-identified patent and that said Letters Patent is hereby corrected as shown below:

On the Title Page

Item (30) Foreign Application Priority Data should read:
July 6, 2016          PCT/KR2016/007335
August 22, 2016       (KR) 10-2016-0106337

Signed and Sealed this
Eighteenth Day of September, 2018

Andrei Iancu
*Director of the United States Patent and Trademark Office*